United States Patent
Haj-Hariri et al.

(10) Patent No.: US 10,217,692 B2
(45) Date of Patent: Feb. 26, 2019

(54) HEAT TRANSFER DEVICE FOR HIGH HEAT FLUX APPLICATIONS AND RELATED METHODS THEREOF

(71) Applicant: University of Virginia Patent Foundation, Charlottesville, VA (US)

(72) Inventors: Hossein Haj-Hariri, Columbia, SC (US); Seyed Reza Monazami Miralipour, Boston, MA (US)

(73) Assignee: University of Virginia Patent Foundation, Charlottesville, VA (US)

(*) Notice: Subject to any disclaimer, the term of this patent is extended or adjusted under 35 U.S.C. 154(b) by 0 days.

(21) Appl. No.: 15/328,119

(22) PCT Filed: Jul. 22, 2015

(86) PCT No.: PCT/US2015/041606
§ 371 (c)(1),
(2) Date: Jan. 23, 2017

(87) PCT Pub. No.: WO2016/014710
PCT Pub. Date: Jan. 28, 2016

(65) Prior Publication Data
US 2017/0229375 A1   Aug. 10, 2017

Related U.S. Application Data

(60) Provisional application No. 62/027,710, filed on Jul. 22, 2014, provisional application No. 62/027,700, filed on Jul. 22, 2014.

(51) Int. Cl.
*H01L 23/427*   (2006.01)
*H01L 23/498*   (2006.01)
(Continued)

(52) U.S. Cl.
CPC .......... *H01L 23/427* (2013.01); *F28D 15/02* (2013.01); *F28D 15/0233* (2013.01);
(Continued)

(58) Field of Classification Search
CPC . H01L 23/427; H01L 23/49838; H01L 24/16; H01L 25/0657; H01L 2224/16227;
(Continued)

(56) References Cited

U.S. PATENT DOCUMENTS

| 4,351,388 A | 9/1982 | Calhoun |
| 5,411,077 A | 5/1995 | Tousignant |

(Continued)

FOREIGN PATENT DOCUMENTS

| WO | WO 2007/139814 | 12/2007 |
| WO | WO 2011/142841 | 11/2011 |

(Continued)

OTHER PUBLICATIONS

Wang, H. et al, "An Analytical Solution for the Total Heat Transfer in the Thin-film Region of an Evaporating Meniscus", International Journal of Heat and Mass Transfer, 2008, pp. 6317-6322, vol. 51, Iss. 25-26, Elsevier.

(Continued)

*Primary Examiner* — Walter H Swanson
(74) *Attorney, Agent, or Firm* — Robert J. Decker

(57) ABSTRACT

A device and related method that provides a two-phase heat transfer device with a combination of enhanced evaporation and increase cooling capacity. A recess topology is used to increase suction of working fluid toward a heat source. A non-wetting coating or structure may be used to keep working fluid away from the spaces between elongated members of an evaporator and a wetting coating or structure may be used to form thin films of working fluid around the distal regions of elongated members. The devices and (Continued)

method described herein may be used to cool computer chips, the skin of a hypersonic flying object, a parabolic solar collector, a turbine engine blade, or other heat sources that require high heat flux.

75 Claims, 41 Drawing Sheets

(51) Int. Cl.
| | | |
|---|---|---|
| H01L 23/00 | (2006.01) | |
| H01L 25/065 | (2006.01) | |
| F28D 15/02 | (2006.01) | |
| F28F 13/18 | (2006.01) | |
| F28D 15/04 | (2006.01) | |
| H01L 49/02 | (2006.01) | |

(52) U.S. Cl.
CPC .......... *F28D 15/046* (2013.01); *F28F 13/187* (2013.01); *H01L 23/49838* (2013.01); *H01L 24/16* (2013.01); *H01L 25/0657* (2013.01); *H01L 28/00* (2013.01); *F28D 2015/0225* (2013.01); *H01L 2224/16227* (2013.01); *H01L 2225/06517* (2013.01); *H01L 2225/06579* (2013.01); *H01L 2225/06589* (2013.01)

(58) Field of Classification Search
CPC . H01L 2225/06517; H01L 2225/06579; F28D 15/02; F28D 15/0233; F28D 15/046; F28D 2015/0225; F28F 13/187
See application file for complete search history.

(56) References Cited

U.S. PATENT DOCUMENTS

| | | | |
|---|---|---|---|
| 6,140,707 A | 10/2000 | Plepys | |
| 6,474,074 B2 | 11/2002 | Ghoshal | |
| 6,934,154 B2 | 8/2005 | Prasher | |
| 7,059,396 B2 | 6/2006 | Foli | |
| 7,123,479 B2 | 10/2006 | Chang | |
| 7,342,787 B1 | 3/2008 | Bhatia | |
| 7,369,410 B2 | 5/2008 | Chen | |
| 7,571,618 B2 | 8/2009 | Dessiatoun | |
| 7,665,511 B2 | 2/2010 | Bhatti | |
| 7,791,885 B2 | 9/2010 | Agostini | |
| 7,992,626 B1 | 8/2011 | Tilton | |
| 8,081,465 B2 | 12/2011 | Nishiura | |
| 8,165,702 B2 | 4/2012 | Wyatt | |
| 8,255,193 B2 | 8/2012 | Humphrey | |
| 8,360,361 B2 | 1/2013 | Wadley | |
| 8,987,893 B1 * | 3/2015 | Sutardja ................ H01L 23/427 257/713 |
| 2002/0062648 A1 * | 5/2002 | Ghoshal ............... F28D 15/0233 62/3.7 |
| 2002/0135980 A1 | 9/2002 | Vafai | |
| 2005/0081552 A1 | 4/2005 | Nilson | |
| 2005/0085018 A1 | 4/2005 | Kim | |
| 2007/0034356 A1 | 2/2007 | Kenny | |
| 2007/0039720 A1 | 2/2007 | Ghosh | |
| 2007/0240856 A1 | 10/2007 | Liu | |
| 2008/0128109 A1 | 6/2008 | Gwin | |
| 2008/0170368 A1 | 7/2008 | Chen | |
| 2008/0229759 A1 | 9/2008 | Ouyang | |
| 2008/0295996 A1 * | 12/2008 | Bhavnani ............... F28F 13/187 165/80.4 |
| 2010/0314088 A1 | 12/2010 | Yoo | |
| 2011/0075372 A1 * | 3/2011 | Zimbeck ............... F28D 15/046 361/700 |
| 2013/0014916 A1 | 1/2013 | Wadley | |
| 2015/0060023 A1 * | 3/2015 | Herring ............... F28D 15/0208 165/104.26 |

FOREIGN PATENT DOCUMENTS

| | | | | |
|---|---|---|---|---|
| WO | WO 2014/015188 | | 1/2014 | |
| WO | WO 2014015188 | * | 1/2014 | ........... H01L 23/427 |

OTHER PUBLICATIONS

Wang, H. et al, "Characteristics of an Evaporating Thin Film in a Microchannel", International Journal of Heat and Mass Transfer, 2007, pp. 3933-3942, vol. 50, Iss. 19-20, Elsevier.

* cited by examiner

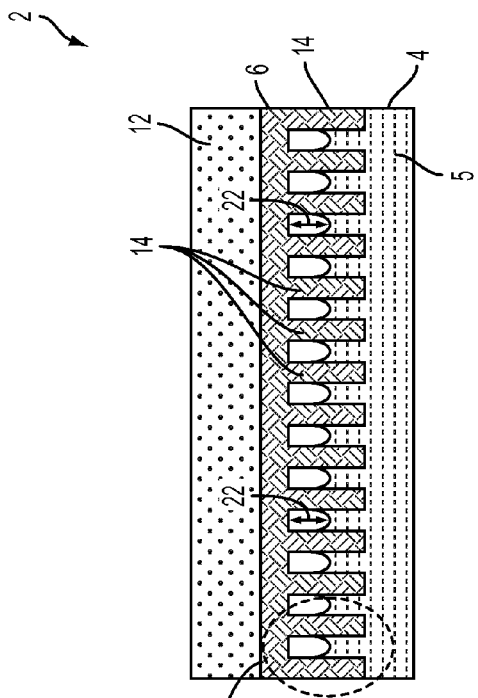
FIG. 2A
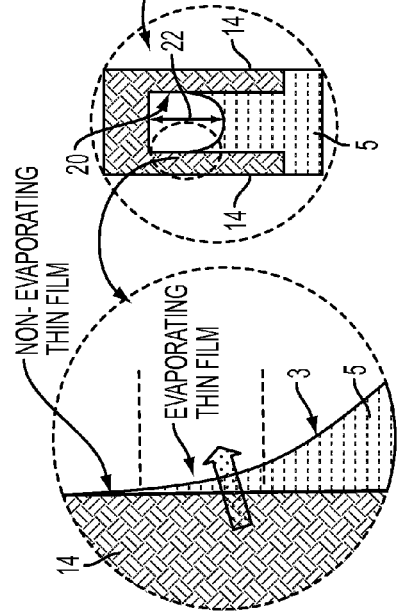
FIG. 2B
FIG. 2C
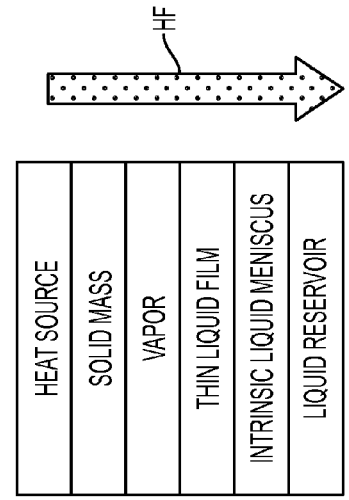
FIG. 2E
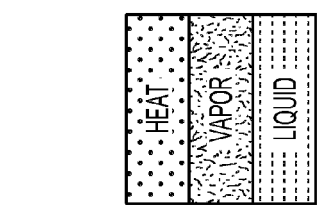
FIG. 2D

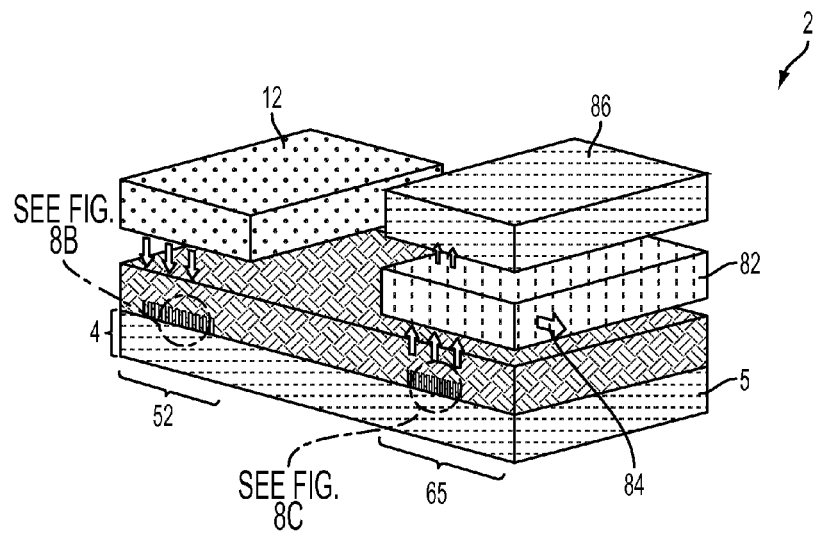
FIG. 8A
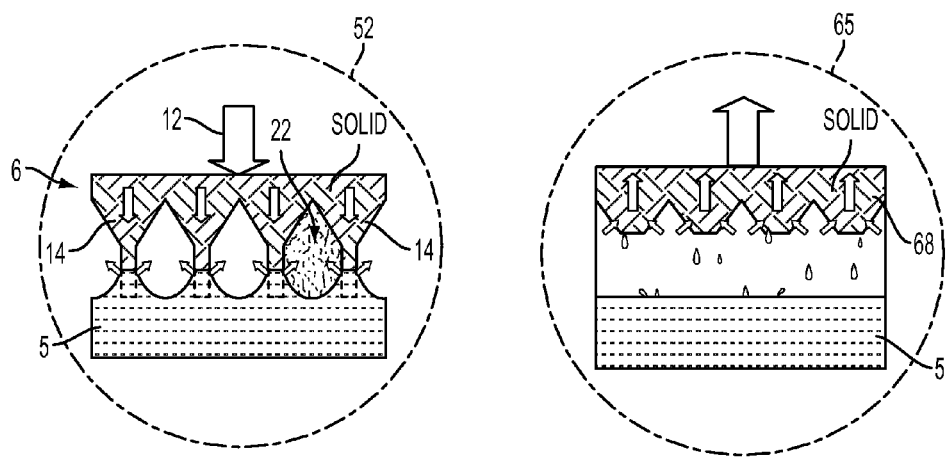
FIG. 8B
FIG. 8C

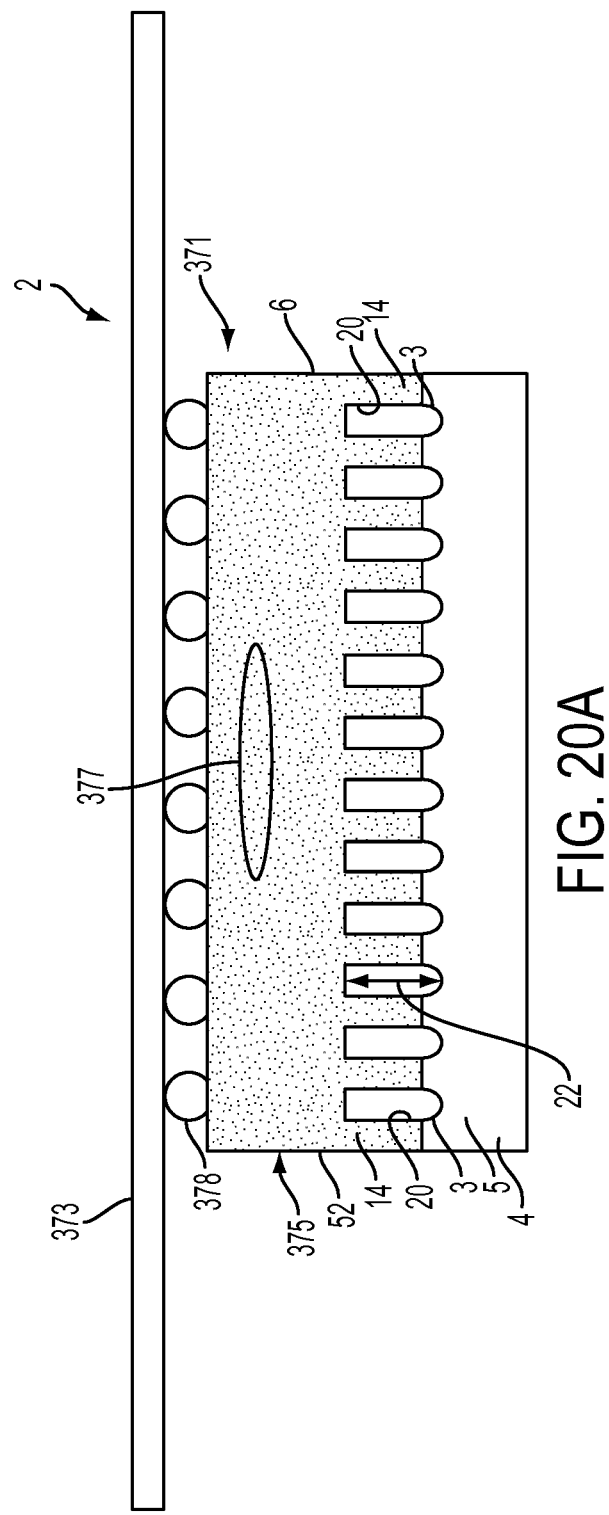

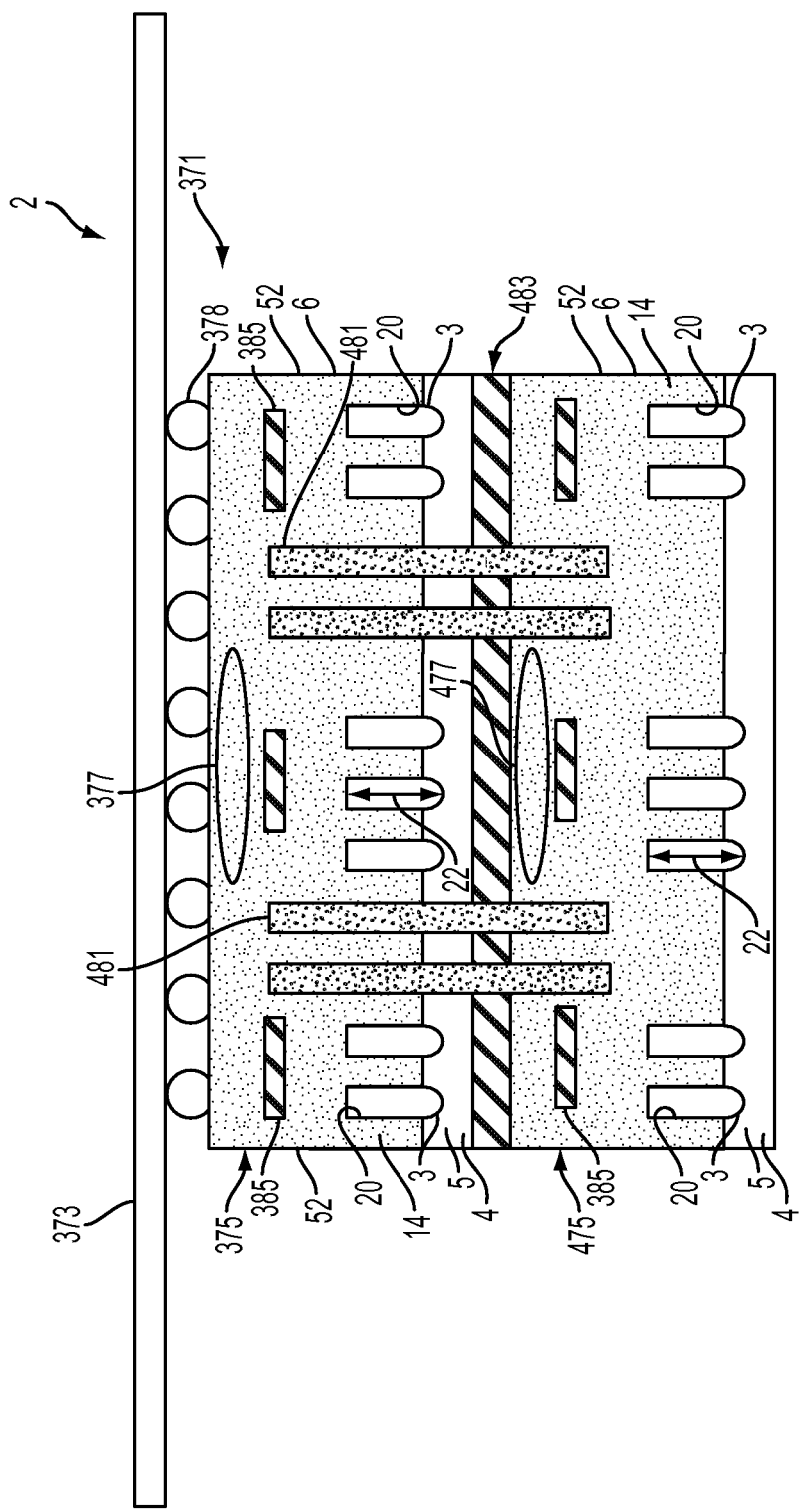

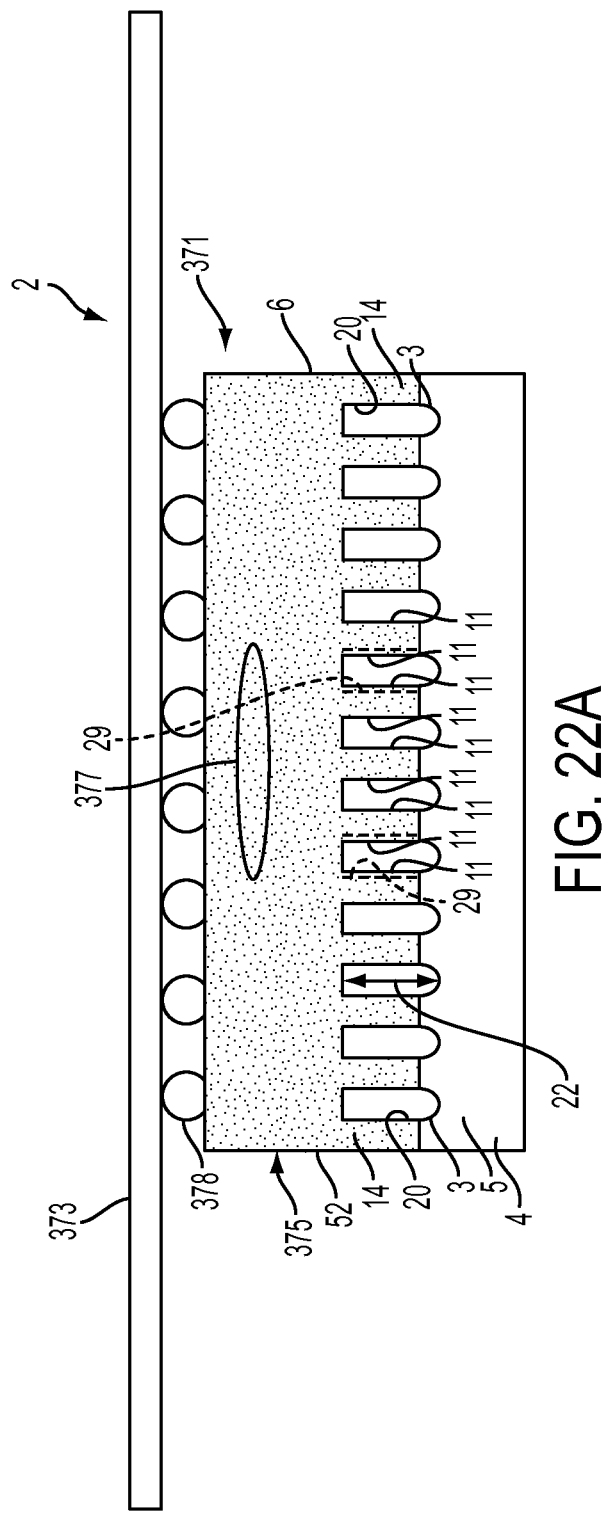

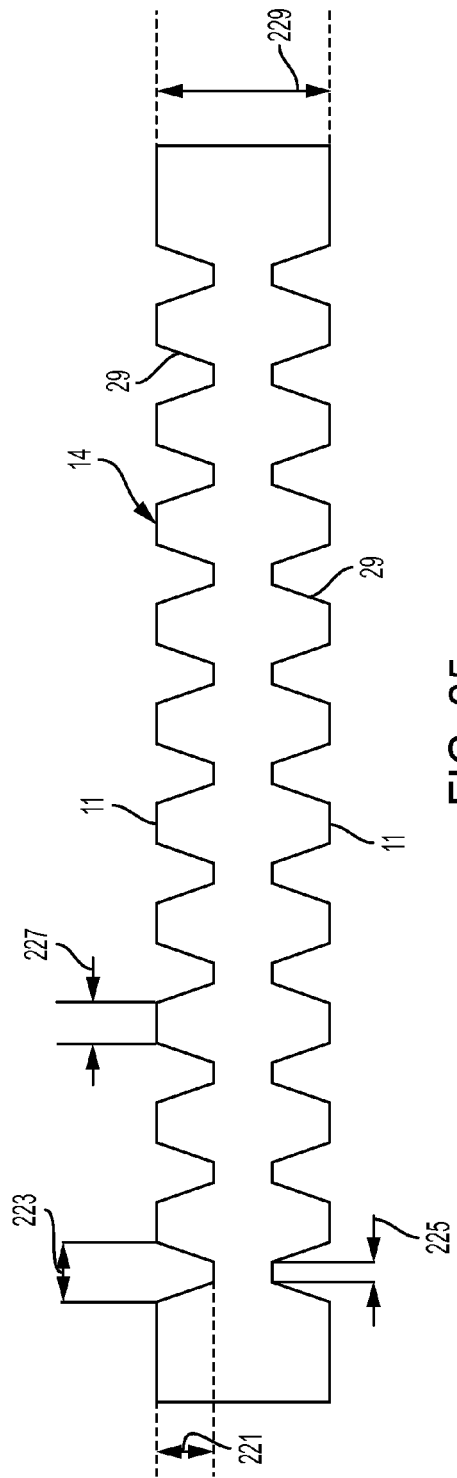
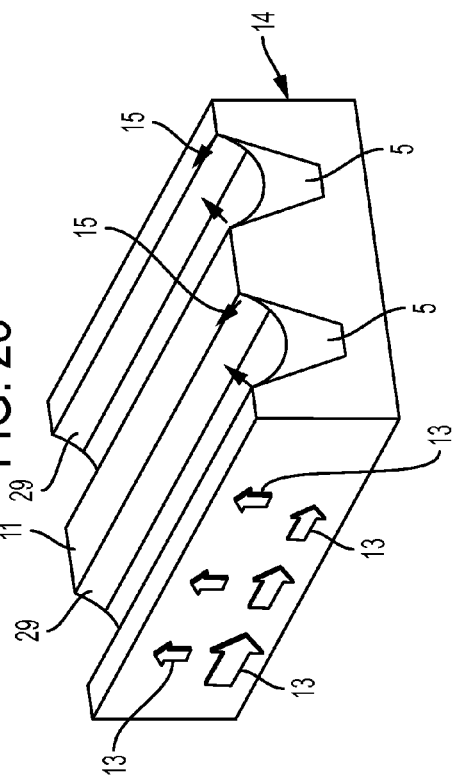
FIG. 25
FIG. 26

HEAT TRANSFER DEVICE FOR HIGH HEAT FLUX APPLICATIONS AND RELATED METHODS THEREOF

CROSS-REFERENCE TO RELATED APPLICATIONS

The present application is a national stage filing of International Application No. PCT/US2015/041606, filed Jul. 22, 2015, which claims benefit of priority under 35 U.S.C. § 119(e) from U.S. Provisional Application Ser. No. 62/027,710, filed Jul. 22, 2014, entitled "Patterned and Grooved Sidewalls In Flipped Evaporators or Other Devices and U.S. Provisional Application Ser. No. 62/027,700, filed Jul. 22, 2014, entitled "Phase-Change Cooling of Stacked Computer Chips or Components;" the disclosures of which are hereby incorporated by reference herein in its entirety.

The present application is related to U.S. application Ser. No. 14/415,423, filed Jan. 16, 2015, which is a is a national stage filing of International Application No. PCT/US2013/051159, filed Jul. 18, 2013, which claims priority under 35 U.S.C. § 119(e) from U.S. Provisional Application Ser. No. 61/673,157, filed Jul. 18, 2012, entitled "Cooling Systems and Related Methods" and U.S. Provisional Application Ser. No. 61/842,595, filed Jul. 3, 2013, entitled "Heat Transfer Device for High Heat Flux Applications and Related Methods;" the disclosures of which are hereby incorporated by reference herein in their entirety.

TECHNICAL FIELD

The present invention relates generally to the field of thermal management. More specifically, the present invention also relates to phase-change heat transfer.

BACKGROUND

Significant heat fluxes are produced in a wide variety of engineering applications, and there is demand for advanced and efficient heat dissipation systems capable of extracting and dissipating these heat fluxes in order to keep temperatures within acceptable operating ranges.

There is, however, a significant gap between the heat-transfer performance desired by industry and the heat-transfer performance readily available with current systems. Many current methods used in industry are single-phase systems that rely on conduction to transfer heat, such as single-phase liquid cooling.

Overview

Phase change heat transfer devices have potential for efficient thermal management of high heat flux operations. Because such devices can take advantage of the latent heat of evaporation of the working fluid, the potential for heat removal is high. Additionally, phase change heat-transfer can lead to more efficient energy recovery. This is because the liquid and vapor portions of the working fluid may be kept near the saturation temperature. This is because in phase change cooling systems heat transfer occurs over nearly zero temperature gradient. The process of heat transfer in a two-phase heat transfer device is essentially an isothermal one, with no sensible drop in temperature from the heat source to the point of recovery at the heat sink. Thus, the quality of heat acting as input to the energy recovery unit will be higher than it would be for non-phase conductors and more work may be recovered.

Despite these benefits, the vast potential of phase change heat transfer devices has not been realized. Other approaches for such systems mostly rely on pool boiling or porous media evaporation. Both methods are limited by the spatial and temporal randomness of boiling. Boiling is highly unordered, and the developed bubbles of vapor provide tremendous resistance to the flow of working fluid and the heat carried by it or stored in it. Bubbles also create dry areas on the heated surface while the bubble is growing and such dry areas are intermittently inactive, in transferring heat, thus decreasing efficiency.

Another common problem recognized by the inventors is dry-out of the evaporator and overheating damage. In certain approaches to phase change devices, because of high resistance to the flow of liquid, it can be difficult to deliver enough liquid to the evaporation sites to replenish the evaporated mass. When this resistance becomes too great and the amount of liquid provided to the evaporation sites cannot replenish the evaporated mass, dry-out and associated overheating damage will ensue. Design parameters that seek to reduce the occurrence of unordered and disruptive boiling, such as widening of the elongated members of the channels, can reduce the available flow area (i.e., constrict it) and increase resistance to flow of the working fluid. The increased friction can make it difficult to provide enough liquid working fluid to the evaporator to replenish the evaporated mass.

Another problem recognized by the present inventors is the lack of a complete method for estimating the performance of thin-films in general and thin-film evaporators in particular. Certain approaches are limited to solutions for only discrete combinations or channel width and superheat and produce results that are inaccurate by at least a factor of two. (See e.g. H. Wang, S. V. Garimella, and J. Y. Murthy. Characteristics of an evaporating thin film in a microchannel. International Journal of Heat and Mass Transfer, 50(19-20):3933-3942, 2007. H. Wang, S. V. Garimella, and J. Y. Murthy and An analytical solution for the total heat transfer in the thin-film region of an evaporating meniscus. International Journal of Heat and Mass Transfer, 51(25-26):6317-6322, 2008; of which are hereby incorporated by reference herein in their entirety, but are not admitted to be prior art with respect to the present invention by inclusion herein.) Therefore, the present inventors have recognized that there is a need for a more complete method for estimating the performance of a thin-film in general and thin-film evaporators in particular.

An aspect of an embodiment of the present invention provides for, but is not limited thereto, the design of a two-phase heat transfer device that provides enhanced evaporation and cooling capacity. The solution may utilize various conducting materials, working fluids, wetting coatings or substrates, and non-wetting coatings or substrates. The solution may involve repelling of working fluid away from spaces between elongated members of an evaporator to reduce or eliminate bubbling. The solution may involve formation of thin film of working fluid around distal regions of the elongated members such as to facilitate controlled and optimized evaporation. The solution may include a reservoir of working fluid, such as at or adjacent to the far end of the elongated members, such as to reduce pressure drop for liquid flow and to inhibit or prevent drying of the evaporator. The solution may include various patterns of the elongated members to improve vapor flow. The device could be used in high heat flux applications, such as a computer chip, semiconductor device, integrated circuit device, a skin of a hypersonic flying object, a parabolic solar collector, high performance computing system, radio frequency (RF) system, photovoltaic or concentrated photovoltaic operation, hypersonic avionic application, turbine blade, or any other surface or volumetric heat dissipation device or system. It should be appreciated that various embodiments of the present invention device may be applied to and/or be utilized with a wide range of applications as desired, needed or required.

An aspect of an embodiment of the present invention provides a two-phase heat transfer device. The device may comprise: a reservoir configured for containing a working fluid; a base member having a first face and a second face, wherein the first face and the second face are generally opposite each other; the first face of the base member is configured to be in communication with and adjacent to a heat source; elongated members extend distally away from the second face of the base member configured to form passages between the elongated members; the elongated members include a proximal region and a distal region, wherein the distal region is configured to be at least partially inserted into the working fluid; and the passages are configured to accommodate vapor that may be produced from the working fluid so as to define a vapor space. The elongated members may be a protrusion, a wall, a panel, a pin, a post, or a rod; as well as any combination thereof. The base member and the elongated members may be comprised of thermally-conducting non-porous solid such as silicon, diamond, copper, silicon carbide, graphite, silver, gold, platinum, copper or silicon oxide—as well as other materials as desired, needed or required. It should be appreciated that the base member and the elongated members—particularly the distal regions may be comprised of at least in part porous material—although conductivity may be reduced as a result. The working fluid may comprise water, oils, metals, octane, hydrocarbons, Penatane, R-245ca, R-245fa, Iso-Pentane, halogenated hydrocarbons, halogenated alkanes, ketones, alcohols, or alkali metals—as well as other materials as desired, needed or required.

The device may comprise any combination of a wetting coating, a wetting substrate, a non-wetting coating, or a non-wetting substrate to attract working fluid to certain areas of the device and repel working fluid from certain areas of the device. For example, the device may comprise a wetting coating such as hydrophilic coating or lyophilic coating disposed on the distal region of the elongated members to attract working fluid. Alternatively, the distal region of the elongated members may be comprised of a wetting substrate (i.e., material) such as hydrophilic substrate or lyophilic substrate. In another example, the device may comprise a non-wetting coating such as hydrophobic coating or lyophobic coating disposed on the proximal region of the elongated members and the second face of the base member located between the elongated members to repel the liquid working fluid. Alternatively, the proximal region of the elongated members and the second face of the base member located between the elongated members may be comprised of a non-wetting substrate such as hydrophobic substrate (i.e., material) or lyophobic substrate.

The device may comprise the vapor space, defined by the passages, which widen in the direction of vapor flow. For example, the passages may extend radially from a central region, wherein the pathway is radial from the central region. In another example, widening vapor space is formed by reducing the number of the elongated members (e.g., per unit length/area) in the direction of vapor flow. Alternatively, the passage may have a width that is uniform or narrows. Alternatively, the passage may have a width that may provide a combination of widening and narrowing, as well as remaining uniform.

An aspect of an embodiment of the present invention provides a method of making a two-phase heat transfer device. The method may comprise providing a reservoir configured for containing a working fluid; providing a base member configured to be in communication with and adjacent to a heat source; providing elongated members extending distally away from said base member configured to form passages between said elongated members, said elongated members include a proximal region and a distal region; and configuring said distal region of said elongated members to be able to at least partially be inserted or immersed into the working fluid. It should appreciated that for purpose of manufacturing the device that if may be made without providing the actual fluid in the reservoir but rather provided at a later time.

An aspect of an embodiment of present invention provides, but not limited thereto, a two phase heat transfer device. The device may comprise: a reservoir configured for carrying a working fluid; a base member having a first face and a second face, wherein the first face and the second face are generally away from each other, the first face of the base member configured to receive thermal energy from a heat source; elongated members extending distally away from the second face of the base member and configured to define respective passages between adjacent elongated members; the elongated members include a proximal region and a distal region, wherein the distal region is configured to be at least partially inserted into the working fluid; and the passages are configured to accommodate vapor produced from the working fluid so as to define a vapor space.

An aspect of an embodiment of present invention provides, but not limited thereto, a two phase heat transfer device. The device may comprise: a reservoir configured for carrying a working fluid; a base member, the base member configured to receive thermal energy from a heat source; elongated members extending distally away from the base member and configured to define respective passages between adjacent elongated members; the elongated members include a proximal region and a distal region, wherein the distal region is configured to be at least partially inserted into the working fluid; and the passages are configured to accommodate vapor produced from the working fluid so as to define a vapor space.

An aspect of an embodiment of present invention provides, but not limited thereto, a two phase heat transfer device. The device may comprise: a reservoir configured for carrying a working fluid; a base member, the base member configured to receive thermal energy from a heat source; elongated members extending distally away from the base member and configured to define respective passages between adjacent elongated members; and the elongated members include a proximal region and a distal region, wherein the distal region is configured to be at least partially inserted into the reservoir.

An aspect of an embodiment of present invention provides, but not limited thereto, a two phase heat transfer device. The device may comprise: reservoir configured for carrying a working fluid; a base member, the base member configured to receive thermal energy from a heat source; elongated members extending distally away from the base member and configured to define respective passages between adjacent elongated members; and at least some of the elongated members are configured to be at least partially inserted into the reservoir.

An aspect of an embodiment of present invention provides, but not limited thereto, a method of making a two phase heat transfer device. The method may comprise:

providing a reservoir configured for carrying a working fluid; providing a base member configured to receive thermal energy from a heat source; providing elongated members extending distally away from the base member and configured to define respective passages between adjacent elongated members, the elongated members include a proximal region and a distal region; and configuring the distal region of the elongated members to be able to at least partially be inserted into the working fluid.

An aspect of an embodiment of present invention provides, but not limited thereto, an apparatus that may comprise: a reservoir configured for carrying a working fluid; an integrated circuit (IC) die. The IC die may comprise a heat source and a two phase heat transfer device. And wherein the two phase heat transfer device may comprise: a base member, the base member configured to receive thermal energy from the heat source; elongated members extending distally away from the base member and configured to define respective passages between adjacent elongated members; at least some the elongated members configured to be at least partially inserted into the working fluid; and the passages are configured to accommodate vapor produced from the working fluid so as to define a vapor space.

An aspect of an embodiment of present invention provides, but not limited thereto, an apparatus that may comprise: a first reservoir configured for carrying a working fluid; a first integrated circuit (IC) die, the IC die comprises a heat source and a two phase heat transfer device. And wherein the two phase heat transfer device of the first IC die comprises: a base member, the base member configured to receive thermal energy from the heat source; elongated members extending distally away from the base member and configured to define respective passages between adjacent elongated members; at least some the elongated members configured to be at least partially inserted into the working fluid; and the passages are configured to accommodate vapor produced from the working fluid so as to define a vapor space. The apparatus further comprises: a second reservoir configured for carrying a working fluid; a second integrated circuit (IC) die, the IC die comprises a heat source and a two phase heat transfer device. And wherein the two phase heat transfer device of the second IC die may comprise: a base member, the base member configured to receive thermal energy from the heat source; elongated members extending distally away from the base member and configured to define respective passages between adjacent elongated members; at least some the elongated members configured to be at least partially inserted into the working fluid; and the passages are configured to accommodate vapor produced from the working fluid so as to define a vapor space. Moreover, the first IC die and the second IC operatively coupled together.

An aspect of an embodiment of present invention provides, but not limited thereto, an apparatus that may comprise: a reservoir configured for carrying a working fluid; an integrated circuit (IC) die, the IC die comprises a heat source; a two phase heat transfer device thermally connected to the IC die. And wherein the two phase heat transfer device may comprise: a base member, the base member configured to receive thermal energy from the heat source; elongated members extending distally away from the base member and configured to define respective passages between adjacent elongated members; at least some the elongated members configured to be at least partially inserted into the working fluid; and the passages are configured to accommodate vapor produced from the working fluid so as to define a vapor space.

An aspect of an embodiment of present invention provides, but not limited thereto, a computer implemented method for estimating the performance characteristics of a thin-film heat transfer device. The method may comprise: receiving characteristic of the heat transfer device; determining a thickness of a non-evaporating portion of a meniscus formed by a liquid on a surface of channels of the heat transfer device; determining a value for a thickness profile matching parameter; performing a first algorithm to determine a thickness profile of an evaporating portion of the meniscus formed by the liquid on the surface, the first algorithm based on the thickness profile matching parameter and an assumption that the non-evaporating portion of the meniscus has a curved profile; determining that the thickness profile of the evaporating portion is within a threshold range; performing a second algorithm to determine performance characteristics of the heat transfer device; and providing the performance characteristics of the heat transfer device to an output device.

An aspect of an embodiment of present invention provides, but not limited thereto, a computer implemented method for estimating the performance characteristics of a thin-film heat transfer device. The method may comprise: receiving characteristics of the heat transfer device; determining a thickness of a non-evaporating portion of a meniscus formed by a liquid on a surface of channels of the heat transfer device; determining a value for a thickness profile matching parameter; performing a first algorithm to determine a thickness profile of an evaporating portion of the meniscus formed by the liquid on the surface, the first algorithm based on the thickness profile matching parameter an assumption that the non-evaporating portion of the meniscus has a curved profile; determining that the first thickness profile of the evaporating portion is not within a threshold range; choosing a second value for the thickness profile matching parameter; performing the first algorithm to determine a second thickness profile of an evaporating portion of the meniscus based on the second value for the thickness profile matching parameter; determining that the second thickness profile of the evaporating portion is within the threshold range; performing a second algorithm to determine performance characteristics of the heat transfer device; and providing the performance characteristics of the heat transfer device to an output device.

An aspect of an embodiment of present invention provides, but not limited thereto, a non-transitory computer readable medium including instructions executable by a processor for estimating the performance characteristics of a thin-film heat transfer device. The instructions may comprise: receiving characteristics of heat transfer device; determining a thickness of a non-evaporating portion of a meniscus formed by a liquid on a surface of channels of the heat transfer device; determining a value for a thickness profile matching parameter; performing a first algorithm to determine a thickness profile of an evaporating portion of the meniscus formed by the liquid on the surface, the first algorithm based on the thickness profile matching parameter and an assumption that the non-evaporating portion of the meniscus has a curved profile; determining that the thickness profile of the evaporating portion is within a threshold range; performing a second algorithm to determine performance characteristics of the heat transfer device; and providing the performance characteristics of the heat transfer device to an output device.

An aspect of an embodiment of present invention provides, but not limited thereto, an apparatus that may comprise: one or more processors; and a memory containing instructions that, when executed by the one or more processors, cause the one or more processors to perform a set of steps. The set of steps may comprise: receiving characteristics of a heat transfer device; determining a thickness of a non-evaporating portion of a meniscus formed by a liquid on a surface of channels of the heat transfer device; determining a value for a thickness profile matching parameter; performing a first algorithm to determine a thickness profile of an evaporating portion of the meniscus formed by the liquid on the surface, the first algorithm based on the thickness profile matching parameter and an assumption that the non-evaporating portion of the meniscus has a curved profile; determining that the thickness profile of the evaporating portion is within a threshold range; performing a second algorithm to determine performance characteristics of the heat transfer device; and providing the performance characteristics of the heat transfer device to an output device.

An aspect of an embodiment of present invention provides, but not limited thereto, a. A computer implemented method for determining the performance characteristics of a heat transfer device. The method may comprise: receiving the heat transfer device characteristics; receiving the heat source characteristics; receiving any ancillary characteristics; determining the performance characteristics of the heat transfer device; determining whether the determined performance characteristics of the heat transfer device are acceptable. And wherein if the performance characteristics of the heat transfer device: are acceptable, then providing such performance characteristics of the heat transfer device; or are not acceptable, then revising the heat transfer device characteristics or provide additional data, and then providing such performance characteristics of the heat transfer device.

An aspect of an embodiment of present invention provides, but not limited thereto, a computer implemented method for determining the heat transfer device characteristics. The method may comprise: receiving the heat transfer device performance characteristics; receiving the heat source characteristics; receiving any ancillary characteristics; determining the heat transfer device characteristics; determining whether the determined heat transfer device characteristics are acceptable. And wherein if the determined heat transfer device characteristics of the heat transfer device: are acceptable, then providing such heat transfer device characteristics; or are not acceptable, then revising the performance characteristics of the heat transfer device or provide additional data, and then providing such heat transfer device characteristics.

An aspect of an embodiment of present invention provides, but not limited thereto, a two phase heat transfer device. The device may comprise: a reservoir configured for carrying a working fluid; a base member, the base member configured to receive thermal energy from a heat source; elongated members having at least one wall, the elongated members extending distally away from the base member and configured to define respective passages between adjacent elongated members; wherein the elongated members include a proximal region and a distal region, wherein the distal region is configured to be at least partially inserted into the working fluid; a recess topography disposed on the at least one wall of the elongated members, wherein the recess topography is configured to accommodate the working fluid; and the passages are configured to accommodate vapor produced from the working fluid so as to define a vapor space.

An aspect of an embodiment of present invention provides, but not limited thereto, a method of making a two phase heat transfer device (or portions thereof). The method may comprise: providing a reservoir configured for carrying a working fluid; providing a base member configured to receive thermal energy from a heat source; providing elongated members having at least one wall, the elongated members extending distally away from the base member and configured to define respective passages between adjacent elongated members, wherein the elongated members include a proximal region and a distal region; configuring the distal region of the elongated members to be able to at least partially be inserted into the working fluid; and providing a recess topography disposed on the at least one wall of the elongated members, wherein the recess topography is configured to accommodate the working fluid.

An aspect of an embodiment of present invention provides, but not limited thereto, an apparatus that may comprise: a reservoir configured for carrying a working fluid; an integrated circuit (IC) die, wherein the IC die comprises a heat source and a two phase heat transfer device. The two phase heat transfer device may comprise: a base member, the base member configured to receive thermal energy from the heat source; elongated members having at least one wall, the elongated members extending distally away from the base member and configured to define respective passages between adjacent elongated members; wherein at least some the elongated members configured to be at least partially inserted into the working fluid; a recess topography disposed on the at least one wall of the elongated members, wherein the recess topography is configured to accommodate the working fluid; and the passages are configured to accommodate vapor produced from the working fluid so as to define a vapor space.

An aspect of an embodiment of present invention provides, but not limited thereto, an apparatus that may comprise: a first reservoir configured for carrying a working fluid; a first integrated circuit (IC) die, wherein the IC die comprises a heat source and a two phase heat transfer device; wherein the two phase heat transfer device of the first IC die comprises: a base member, the base member configured to receive thermal energy from the heat source; elongated members having at least one wall, the elongated members extending distally away from the base member and configured to define respective passages between adjacent elongated members; at least some the elongated members configured to be at least partially inserted into the working fluid; a recess topography disposed on the at least one wall of the elongated members, wherein the recess topography is configured to accommodate the working fluid; and the passages are configured to accommodate vapor produced from the working fluid so as to define a vapor space. The apparatus may further comprise: a second reservoir configured for carrying a working fluid; a second integrated circuit (IC) die, wherein the second IC die comprises a heat source and a two phase heat transfer device; wherein the two phase heat transfer device of the second IC die comprises: a base member, the base member configured to receive thermal energy from the heat source; elongated members having at least one wall, the elongated members extending distally away from the base member and configured to define respective passages between adjacent elongated members; at least some the elongated members configured to be at least partially inserted into the working fluid; a recess topography disposed on the at least one wall of the elongated members, wherein the recess topography is configured to accommodate the working fluid; and the passages are configured to accommodate vapor produced from the working fluid so as to define a vapor space; and the first IC die and the second IC operatively coupled together.

An aspect of an embodiment of present invention provides, but not limited thereto, an apparatus that may comprise: a reservoir configured for carrying a working fluid; an integrated circuit (IC) die, wherein the IC die comprises a heat source; a two phase heat transfer device thermally connected to the IC die. And the two phase heat transfer device may comprise: a base member, wherein the base member configured to receive thermal energy from the heat source; elongated members having at least one wall, the elongated members extending distally away from the base member and configured to define respective passages between adjacent elongated members; at least some the elongated members configured to be at least partially inserted into the working fluid; a recess topography disposed on the at least one wall of the elongated members, wherein the recess topography is configured to accommodate the working fluid; and the passages are configured to accommodate vapor produced from the working fluid so as to define a vapor space.

A device and related method that provides, but is not limited thereto, a two-phase heat transfer device with unique combination of enhanced evaporation and increased cooling capacity. An advantage associated with the device and method includes, but is not limited thereto, increased cooling capacity per unit area, controlled and optimized evaporation, prevention of boiling, and prevention of drying of the evaporator. An aspect associated with an approach may include, but is not limited thereto, using a recess topology to increase suction of working fluid in the direction toward the heat source. An aspect associated with an approach may include, but is not limited thereto, using a non-wetting coating or structure to keep working fluid away from the spaces between elongated members of an evaporator and using a wetting coating or structure to form thin films of working fluid around the distal region of the elongated members. For example it can be used to cool a computer chip, a skin of a hypersonic flying object, parabolic solar collector, turbine or engine blade, or any other heat source that requires high heat flux.

These and other objects, along with advantages and features of various aspects of embodiments of the invention disclosed herein, will be made more apparent from the description, drawings and claims that follow.

BRIEF DESCRIPTION OF THE DRAWINGS

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

FIG. 2A schematically illustrates an exemplary embodiment of the present invention device.

FIG. 2B provides an enlarged partial view of a single passage of an embodiment of the present invention shown in FIG. 2A.

FIG. 2C provides an enlarged partial view of the thin film region as part of the meniscus as shown in FIG. 2B where the bulk of evaporation and heat transfer take place.

FIG. 2D provides a block diagram of the general arrangement of the device of FIG. 2A.

FIG. 2E schematically illustrates the general circuit of the heat flow traveling within an exemplary embodiment of the heat transfer device.

FIG. 8A schematically illustrates a heat-transfer system utilizing an evaporator, condenser, and an energy recovery unit.

FIG. 8B provides an enlarged partial view of the evaporator portion of the heat transfer system of FIG. 8A.

FIG. 8C provides an enlarged partial view of the condenser portion of the heat transfer system of FIG. 8A.

FIG. 25 provides a schematic side view of an elongated member.

FIG. 26 provides a schematic perspective partial view of an elongated member having a recess topology on its side wall with working fluid therein.

DETAILED DESCRIPTION OF EXEMPLARY EMBODIMENTS

Embodiments of the present invention address previous limitations including, but not limited thereto, the following: boiling, dry-out, sonic limit, and delivery of liquid to the evaporator of a phase change heat transfer device. Sonic limit is the limit on the velocity the vapor is able to flow through the passages (e.g., channels) or vapor space before becoming choked (i.e. it essentially cannot go any faster even if one increases the pressure driving the flow by evaporating more liquid). Conventional design parameters that seek to reduce boiling often lead to higher resistance to liquid flow and associated dry-out problems. Boiling is highly unordered, and the developed bubbles of vapor provide tremendous resistance to the flow of heat. In contrast, in a well designed phase change heat transfer device, as associated with the various embodiments of the present invention, continuous and efficient evaporation and heat transfer will occur without the disruption of boiling, thereby taking full advantage of the latent heat of evaporation of the working fluid. Additionally, in a well designed phase change heat transfer device as associated with the present invention, sufficient liquid will be delivered to replenish the evaporated mass and avoid dry out.

Figures 1A, 1B, 1C:
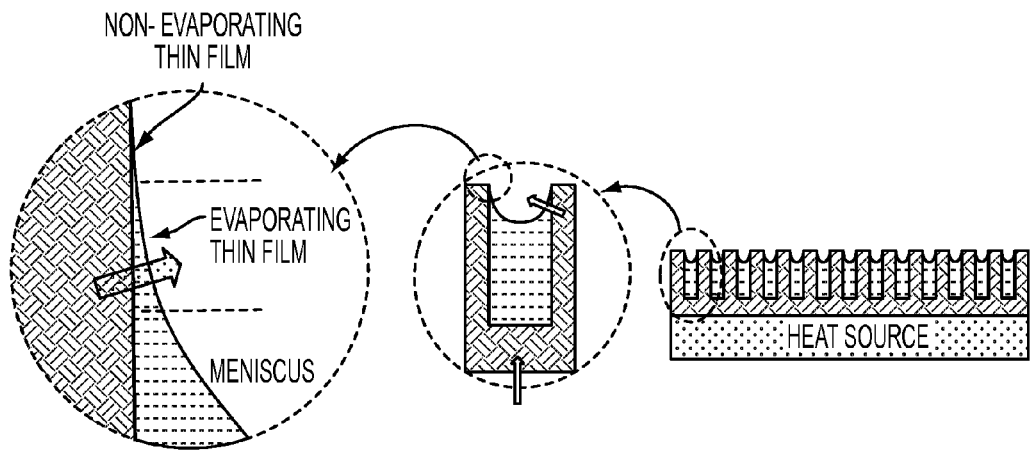
FIG. 1A schematically represents a typical phase change heat transfer device.
FIG. 1B provides an enlarged partial view of a single channel of heat transfer device of FIG. 1A.
FIG. 1C provides an enlarged partial view of the thin film region where the bulk of evaporation and heat transfer ideally takes place when not disrupted by boiling and/or dry-out.

Referring generally now to FIG. 1, FIG. 1 schematically illustrates an approach of a phase change heat transfer device that conducts heat from the base of a channel through the solid mass to the tip, as specifically represented in FIG. 1B. At the tip of the channel wall, the bulk of the evaporation and heat transfer take place at an evaporating thin film region of the meniscus formed within the channel represented in FIG. 1C. The present inventors recognize that a drawback with this design, among others, is that to get enough heat to the tip, where most of evaporation takes place; the temperature has to be higher at the base than at the tip. The inventors have recognized that this high temperature can cause the liquid within (e.g., at the bottom) the channel to boil, and the ordered process of evaporative heat transfer will be disrupted. Conceivably, the present inventors point out, boiling could be reduced by different design parameters such as by widening the base of the walls (thereby increasing the amount of solid), in an effort to decrease the temperature drop between the proximal regions at the base and distal region at the tip, but this would will take away liquid from the flow area and increase the shear friction that must be overcome in order to deliver liquid through the channels to replenish the evaporated mass. Thus, the risk of dry-out would be increased.

Figures 1D, 1E:
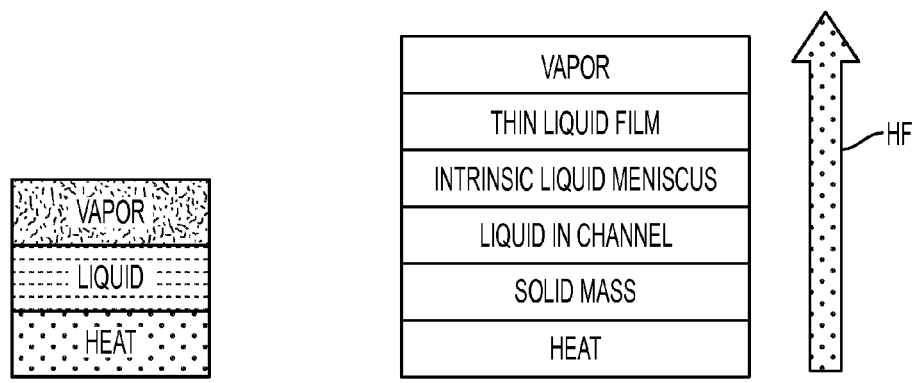
FIG. 1D provides a block diagram of the general arrangement of the device of FIG. 1A.
FIG. 1E schematically illustrates the general circuit of the heat flow.

As schematically reflected in the block diagram of FIG. 1D, the arrangement of the device reflects the heat source adjacent to the liquid that is in turn adjacent to the vapor. Therefore, the present inventors have determined that the area where most of the evaporation takes place is relatively distant or remote from the heat source.

Referring generally now to FIG. 2, in an embodiment of the present invention phase change heat transfer device 2, a heat source 12 is in communication with a base member 6. FIG. 2B provides an enlarged partial view of a single passage 20 in FIG. 2A and FIG. 2C provides an enlarged partial view of the thin film region of the meniscus 3 as shown in FIG. 2B. The evaporating thin film region is where the bulk of evaporative heat transfer takes place due to the very low thickness and conductive resistance. The non-evaporating thin film region is where adhesion forces between liquid molecules and the solid surface are extremely strong and little to none of the molecules are able to escape the liquid phase into the vapor phase. Thus, the evaporating thin film region represents the region of optimal evaporation and heat transfer. Elongated members 14 extend away from the base member 6 in the direction opposite the heat source 12. The distal region of the elongated members 14 are partially immersed or inserted into a working fluid 5 contained in a reservoir 4. An advantage of this (but not limited thereto) and other embodiments of the present invention is the elimination or reduction of boiling. As heat travels through the solid mass of the base member 6 and down the elongated members 14, it is conducted directly to the evaporating thin film region of the meniscus where the bulk of evaporative heat transfer takes place. As such, the evaporating thin film region along the elongated member is relatively close to the base member and heat source. In this manner, the risk of boiling within the channel is eliminated and the ordered and efficient evaporation can be maintained continually. In this manner, it is easier to provide heat to the evaporating thin film region. In contrast, regarding conventional arrangements, the evaporating thin film region is relatively more distant from the heat source and base; and therefore creates greater challenges of successfully and efficiently getting heat to the evaporating thin film region.

Still referring generally to FIG. 2, another advantage of this (but not limited thereto) and other embodiments of the present invention is the efficient delivery of liquid to the evaporation sites. Because the working fluid 5 (e.g., liquid) is delivered to the reservoir 4 having a plurality of tips of elongated members 14 disposed or immersed therein, and not through a multitude of individual channels without the benefit of a reservoir, the high shear friction involved with flow through a multitude of channels does not need to be overcome. Thus, there is less resistance involved in delivering the liquid working fluid 5 to the reservoir 4 to replenish evaporated mass, and dry-out problems are significantly reduced.

As schematically reflected in the block diagram of FIG. 2D, the arrangement of an embodiment of the present invention device reflects the vapor region (i.e., where the bulk of the evaporative heat takes place) being adjacent to the heat source, and wherein the liquid working fluid is relatively distant or remote from the heat source so as to avoid or mitigate boiling in the device and augment flow of liquid working fluid, among other benefits.

FIG. 2E schematically illustrates the general circuit of the heat flow, HF, traveling within an embodiment of the heat transfer device 2 (see FIG. 2A). The heat source generates the heat that travels through the solid mass of the elongated members 14 (see FIGS. 2A-2C) and beyond the vapor space 22 (see FIGS. 2A-2B) toward the region of the thin liquid film and intrinsic liquid meniscus. The liquid reservoir is located furthest from the heat source and thereby requiring the greatest distance for the heat to travel. As such, the thin liquid film and intrinsic liquid meniscus are relatively close to the heat source. The alignment as schematically shown in FIG. 2E, enables the heat transfer device to generate superheated vapor without inducing boiling in the intrinsic liquid meniscus and liquid reservoir. Accordingly, this feature improves the quality of the heat removed by the heat transfer device and the efficiency of the heat transfer device, which can be integrated in the various cooling applications as disclosed herein. Moreover, due to this arrangement, the temperature of the proximal portions of the solid mass of the elongated members 14 (see FIG. 2A-2C), i.e., "walls," is higher than the saturation temperature of the thin liquid film and intrinsic liquid meniscus. This prevents liquid condensate from accumulating in the vapor space 22 (see FIG. 2A-2B), which eliminates the risk of blockage of the vapor space 22 with liquid condensate.

In contrast, FIG. 1E schematically illustrates the general circuit of the heat flow, HF, traveling within an approach of a heat transfer device (see for example FIG. 1A). The heat source generates the heat that travels through the solid mass of the base of the channels and through the walls of the channels (see FIG. 1A-1C) that is proximal to the liquid stored within the channels. The intrinsic liquid meniscus and thin liquid film is located next in the general direction of the heat flow, HF. And furthest from the heat source is the vapor region. As recognized by the present inventors, in this arrangement, liquid condensate is prone to form liquid condensate in the vapor region because the temperature of base and the walls of the channels is higher than the saturation temperature of the intrinsic liquid meniscus and thin liquid film. This increases the risk of blockage of the vapor region with liquid condensate. Moreover, as recognized by the present inventors, a drawback with this design, among others, is that to get enough heat to the tip of the walls of the channels, where most of evaporation takes place; the temperature has to be higher at the base of the channels than at the tip. This high temperature can cause the liquid within (e.g., at the bottom) the channel to boil, and the ordered process of evaporative heat transfer will be disrupted.

An advantage associated with an embodiment of the present invention includes, but is not limited thereto, increased cooling capacity per unit area, controlled and optimized evaporation, prevention or reduction of volumetric boiling, and prevention or reduction of dry-out. An aspect associated with an embodiment of the present invention includes, but is not limited thereto, a cooling system that is integrated with or into a heat source. For example, it can be used to cool a computer chip, semiconductor device, integrated circuit device, skin of a hypersonic flying object, parabolic solar collector, high performance computing system, RF system, photovoltaic or concentrated photovoltaic operation, hypersonic avionic application, turbine blade, or any other surface or volumetric heat dissipation application.

An aspect associated with an embodiment of the present invention includes, but is not limited thereto, a cooling system that is integrated with, on or into a heat source. For example, a heat source may include, but not limited thereto, the following: at least one semiconductor device or electronic device (or a data center or farm of semiconductor devices or electronic devices, for example). A semiconductor device, for example, may be from a system comprising at least one of the following: at least one processor unit and/or at least memory unit. Furthermore, for example, the heat source may be at least one of the following: at least one integrated circuit, concentrated thermal and optic radiation, chemical reactions, high temperature liquid/vapor flows, high velocity flows, or high velocity shear flows. The chemical reactions (as well as other aspects of various embodiments of the present invention) may be local (or small) or applied to large scale usage. Additionally, for example, the heat source may be at least one of the following: High Performance Computing Systems, RF systems, photovoltaic system, concentrated photovoltaic system, hypersonic vehicle or craft, or turbine blade. For example, the high performance computing system may comprise at least one of the following: at least one 3D Stacking computer chip, at least one computer processor unit (CPU), at least one graphics processor unit (GPU), or at least one memory unit.

FIGS. 3A-D schematically illustrates similar embodiments of phase change heat transfer device in operation and utilizing continuous ordered evaporation. The two-phase heat transfer device 2 is provided to remove heat from a heat source 12. For example, the heat source can be the surface of a computer chip as well as any of the other heat dissipation applications disclosed herein, or as desired, needed or required. The heat source 12 is in communication with a first face 8 of a base member 6, and a second face 10 of the base member is on the opposite side of the first face 8. Elongated members 14 extend distally away from the second face 10. For example, the base member 6 and the elongated members 14 (or portions thereof) may be constructed of a thermally-conductive, non-porous solid such as, but not limited thereto, silicon, diamond, copper, silicon carbide, graphite, silver, gold, copper, titanium, platinum, or metal alloys. Additionally or in combination, the base member 6 and elongated members 14 (or portions thereof) may have a layering of material such as, but not limited thereto, gold, platinum, copper, graphene, or silicon oxide.

The elongated members 14 can have the shape of a pin, post, rod, wall, or panel, or similar structures or as desired, needed or required. The device 2 may also have a reservoir 4 that is filled with a working fluid 5. For example, the working fluid may be water, oils, metals, octane, hydrocarbons, Pentane, R-245ca, R-245fa, isopentane, halogenated hydrocarbons, halogenated alkanes, alkenes, ketones, alcohols, or alkali metals. It should be appreciated that the working fluid 5 should be compatible with the other materials that make up the device so they will not react chemically to create non-condensable gases or cause other deleterious effects. Further, as an example, the working fluid may be any liquid or gas. Moreover, the working fluid may be molten metal or liquid metal, such as lithium or the like.

Still referring to FIG. 3, the portion of the elongated member 14 that is closer to the base member 6 is described as a proximal region 16, and the portion that is further away from the base member 6 is described as a distal region 18. The distal region 18 is at least partially submerged in the working fluid 5, creating a thin film of the working fluid 5 around the distal region 18 (as similarly shown in FIG. 2C, which illustrates the proximal region instead). Heat flow 13 travels (i.e., conduction) from the heat source 12 through the base member 6 and the proximal region 16 to the distal region 18, and the heat is removed from the proximal region 16 and/or distal region 18 when a controlled and optimized evaporation of the working fluid occurs in the thin film area (as similarly shown in FIG. 2C, which illustrates the proximal region instead) around the distal region 18. The evaporated liquid produces a vapor that fills a passage 20 as provided by the configuration of the elongated members 14. The heat is carried away from the device 2 when the vapor travels in vapor paths 21 through the passages 20 defined by the elongated members 14 toward a condenser (not shown). The passages 20 may, for example but not limited thereto, be a channel such as a micro-channel. As illustrated in the figure, the passage 20 may have a designated length, L, as desired, needed or required. The passages 20 may be, for example but not limited thereto, a channel such as a nano-channel.

Figure 3A:
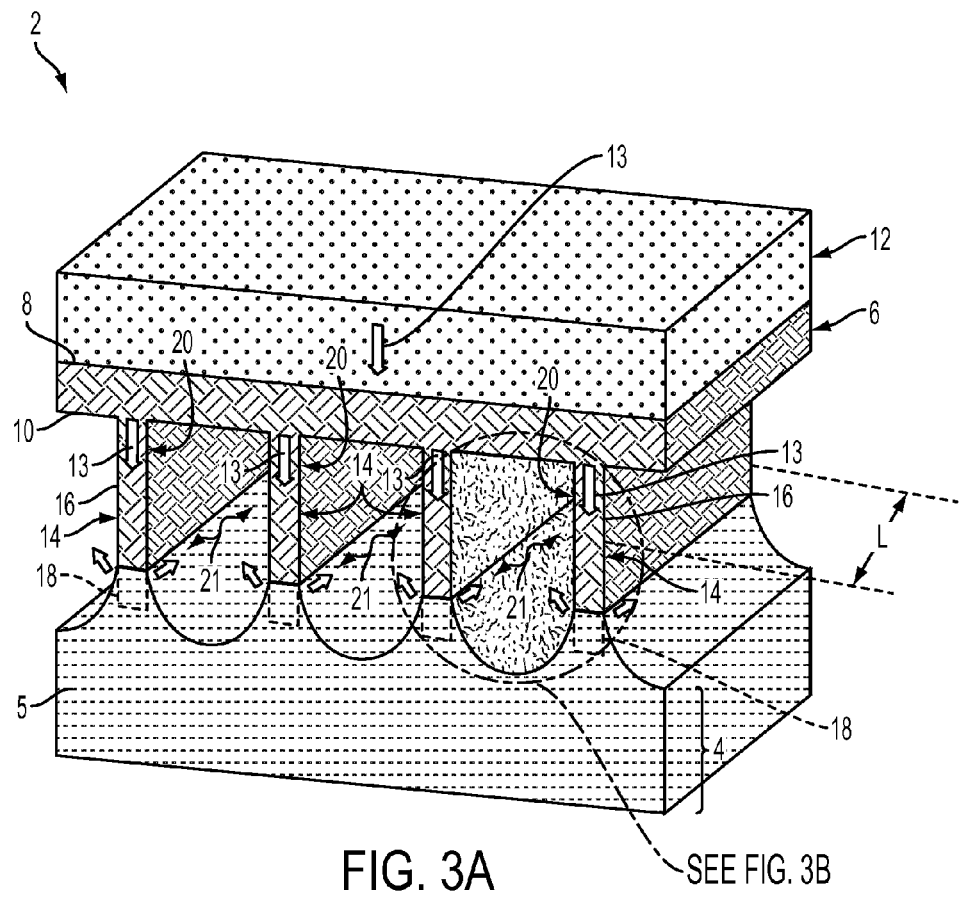
FIG. 3A schematically illustrates an embodiment of the phase change heat transfer device in operation and utilizing continuous, ordered evaporation free of disruption from boiling and/or dry-out.
Figure 3B:
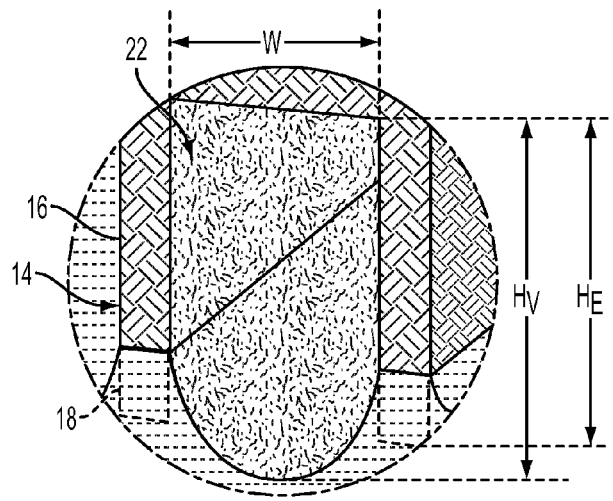
FIG. 3B provides an enlarged partial view of passage shown in FIG. 3A, particularly the vapor space and the dimensions of the passage.

FIG. 3A provides of an embodiment of the present invention wherein the elongated members 14 are generally straight. In such an embodiment, the proximal region 16 of at least one elongated member 14 has a cross section that is substantially equal to the distal region 18. FIG. 3B provides an enlarged partial view of passage shown in FIG. 3A, particularly the vapor space 22 and the dimensions of the passage 20 such as a height, $H_E$, which is the height of the elongated member or passage, a height, $H_V$, which is the height of the vapor space, and width, W, which is the width of the passage (i.e., between elongated members, for example); all of which the dimensions (and related contours) may be adjusted as desired, needed or required. It should be appreciated that while the stipple pattern representing the vapor space 22 is only illustrated in the far right passage 20, that the vapor space 22 is applicable to any and all passages 20 (such as but not limited thereto channels or micro-channels).

Figure 3C:
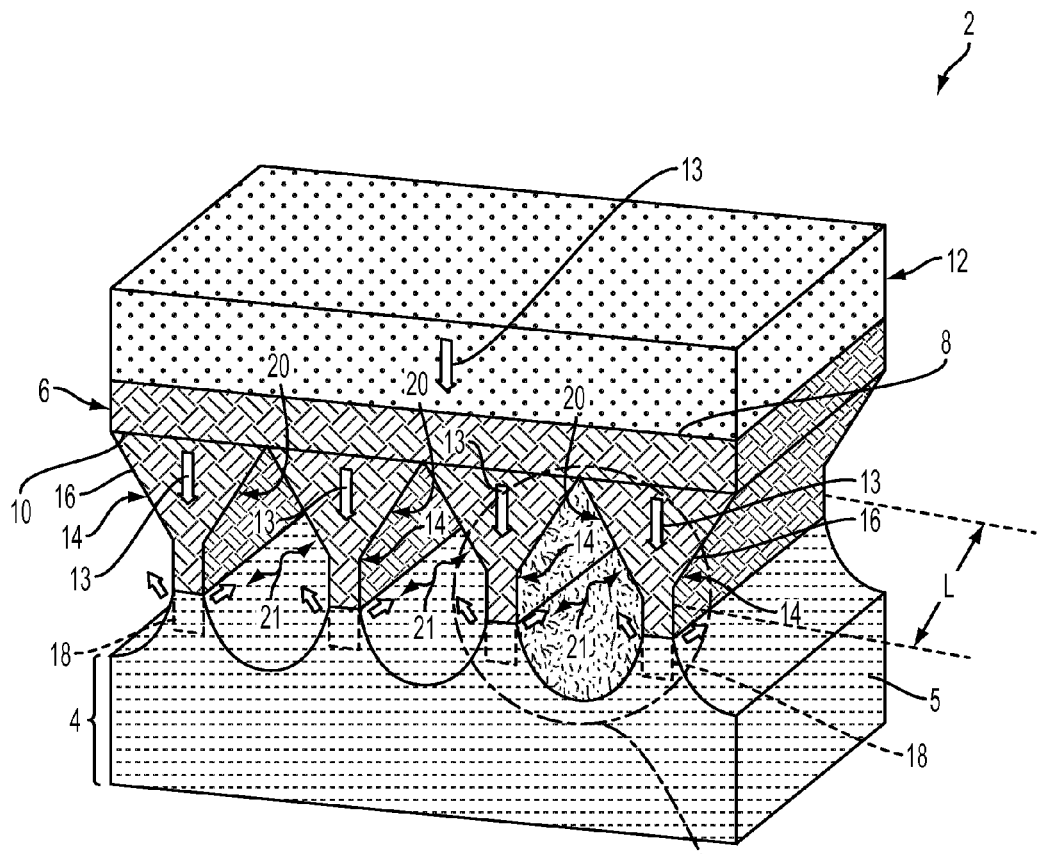
FIG. 3C schematically illustrates another embodiment of a phase change heat transfer device in operation and utilizing continuous, ordered evaporation free of disruption from boiling and/or dry-out.
Figure 3D:
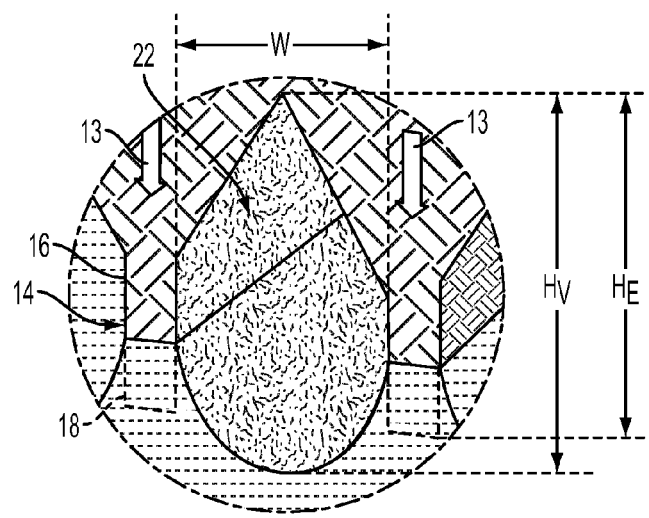
FIG. 3D provides an enlarged partial view of passage shown in FIG. 3C, particularly the vapor space and the dimensions of the passage.

FIG. 3C provides another embodiment wherein at least one elongated member 14 is constructed with the proximal region 16 wider than the distal region 18. It should be appreciated that the elongated members 14 may be formed in a variety of shapes and contours without departing from the spirit of the invention. The passages 20 may, for example but not limited thereto, be a channel such as a micro-channel. As illustrated in the figure, the passage 20 may have a designated length, L, as desired, needed or required. FIG. 3D provides an enlarged partial view of passage shown in FIG. 3C, particularly the vapor space 22 and the dimensions of the passage 20 such as a height, $H_E$, which is the height of the elongated member or passage, a height, $H_V$, which is the height of the vapor space, and width, W, which is the width of the passage (i.e., between elongated members, for example); all of which the dimensions (and related contours) may be adjusted as desired, needed or required. It should be appreciated that while the stipple pattern representing the vapor space 22 is only illustrated in the far right passage 20, that the vapor space 22 is applicable to any and all passages 20 (such as but not limited thereto channels or micro-channels). Without wishing to be bound by any limitations, various embodiments may have passages (e.g., channels) having the following dimensions: the width, W, may range from about 100 nanometers to 100s of microns; the length, L, may range from about 1 micron to 100 centimeters; and the height, H, may range from about 5 micron to 5 millimeters. It should be appreciated that the dimensions may increase or decrease as desired, needed or required, and these suggested ranges are merely illustrative. For example, the width, W, could range from about 10 nanometers to 10 millimeters. For example, the length, L, may range from 100 nanometers to 1,000 centimeters—or could be greater than 1,000 centimeters. For example, the height, H, may range 100 nanometers to is or 10s of centimeters. Any of these dimensions are applicable to any of the passages indifferent of the structure of the elongated members (shape, angles, contours) that define the passages; as the passages (defined by the elongated members) may be a variety of configurations such as protrusions, walls, panels, pins, posts, or rods, or any combination thereof. The dimensions may vary between respective passages relative to one another. Moreover, the dimensions may vary within a given passage itself. The regions of the passages may vary within any heat transfer device, evaporator, or condenser. Again, these dimensions are merely illustrative and may be increased or decreased as desired or required.

A vapor space 22 is the space within the passage 20 that is filled by vapor. The vapor space in the present invention 22 can be defined as the space between the surfaces of the elongated members 14, the surface of the second face 10 of the base member, and the surface of the working fluid 5. The vapor space 22 can be created by repelling the working fluid 5 from the passage 20 by coating the proximal region 16 of the elongated members and the second face 10 of the base member with a non-wetting coating 28. Alternatively, the vapor space 22 can be created by repelling the working fluid 5 from the passage 20 by having the proximal region 16 of the elongated members and the second face 10 of the base member be comprised of a non-wetting substrate 30 (i.e., material of the structure itself or applicable component, for example). The vapor space 22 is typically smaller than the passage 20 because the working fluid can fill the portion of the passage 20 that is close to the distal region 18 of the elongated members. Coating the surface of the distal region 18 with a wetting coating 24 or having the distal region 18 be comprised of a wetting substrate 26 attracts the working fluid 5 to the distal region 18, causing the working fluid 5 to fill the portion of the passage 20 that is nearby.

In prior arts, micro-channels within the evaporator of a two-phase heat exchanger are filled with liquid (See U.S. Pat. No. 6,934,154 B2). There are disadvantages of having passages filled with liquid. Liquid in the passage boils and creates bubbling, which reduces efficiency of heat transfer. Furthermore, as the liquid evaporates, the liquid in the passages will turn into liquid/vapor mixture and create instabilities in the flow of the working fluid. Uneven flow rate can cause some parts of the evaporator to dry out. Some prior arts aim to mitigate the fluid-flow issue by etching microscopic cavities on the surfaces of the passages (See US Patent Application 2008/0295996 A1 to Bhavnani et al.), varying widths of the passages (See U.S. Pat. No. 7,123,479 B2 to Cheng et al.), or arranging short passages in parallel (See U.S. Pat. No. 7,571,618 B2 to Dessiatioun). These solutions unsuccessfully attempt to mitigate the fluid-flow problem in the passages, and moreover, they do not address the boiling and bubbling caused by having liquid in the passages.

In contrast, regarding various embodiments of the present invention, by creating a vapor space in the passage, the problem of boiling and bubbling is highly-reduced. Evaporation occurs at the distal region of the elongated member through controlled and optimized thin-film evaporation. Moreover, in some embodiments of the present invention, for example those embodiments that may utilize a horizontal configuration, the flow of liquid is less-restricted because it does not travel through narrow passages. The liquid at least in part flows in an open area in the reservoir 4, resulting in lower pressure drop. This pooling may be readily applicable wherein a horizontal configuration is implemented or wherein gravitational forces on the fluid in the passages and/or reservoir is essentially negligible. In other orientations, for example, judicious placement of wicks or shaping of passages may be implemented to induce and aid the flow of the liquid.

Figure 16:
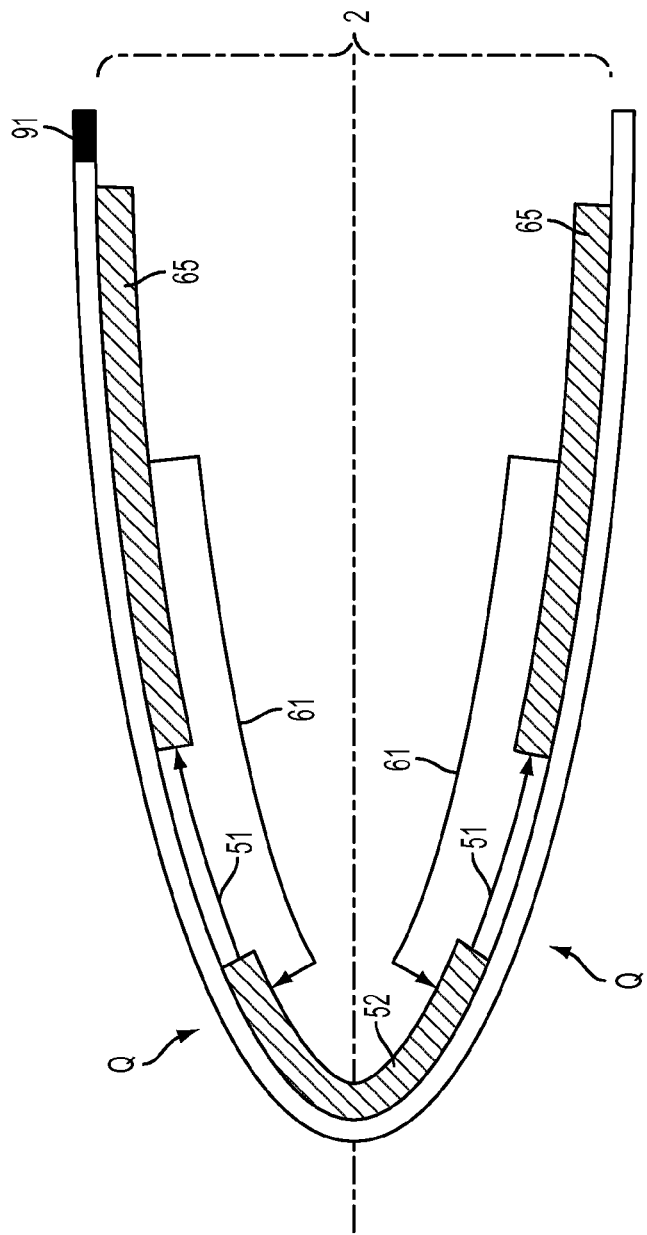
FIG. 16 schematically illustrates an embodiment of the heat transfer device implemented with a component of a craft (e.g., vehicle), such as the following: aircraft, spacecraft, satellite, landcraft, or watercraft. The component may be, for example, a wing or nose of the craft (e.g., vehicle), or any other area, section, component, or part of the craft (e.g., vehicle) as desired, needed, or required.
Figure 16:
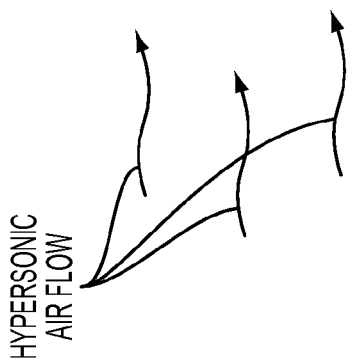

It should be appreciated that while the base member 6 illustrated in FIGS. 2 and 3 are shown as straight or planar shaped it should be appreciated that the shape the base member (as well as other components) may be a variety of shapes, contours, and sizes (as well as a variety of materials) as desired, needed or required. For instance, as shown in FIGS. 16 and 18, for example, the evaporator 52 and condenser 65 are designed to comply with and interface with the geometrical alignment of the environment or application (i.e., Hypersonic vehicle and turbine blade), and the requisite systems. It should be appreciated that the heat transfer device components disclosed herein may take on all shapes along the entire continual geometric spectrum of manipulation of x, y and z planes to provide and meet the environmental, application and structural demands and operational and system requirements—as well as system, environment, and component interface. For example, the base member 6 and other components—such as any corresponding components, supporting components, interface components, to name a few, may have a variety of alignments, shapes, angles, and contours. Some examples many include: one or more bends, one or more angles, one or more curves, and various contours; as well as any combination thereof. For instance, perhaps the base member (and resultant components) could be curved or turns a corner. Moreover, any of the components of the various embodiments of the present invention device or system may be attached, interfaced, disposed, connected, coupled, enmeshed, inserted, adhered, or integrated with the systems, components, and devices according to means available as desired or required to carry out the aspects of various embodiments disclosed herein. Some non-limiting examples may also include soldering, welding, brazing, or the like. Moreover, any of the components of the various embodiments of the present invention device or system may be integrally formed or connected together, as well as separately attached (as well as detachable)—or some combination thereof, as desired or required to carry out the aspects of various embodiments disclosed herein.

It should be appreciated that while two phase heat transfer is predominantly discussed herein, it should be appreciated that a multi-phase (e.g., three phase) heat transfer device may be applicable and contemplate as well within the scope of the various embodiments of the present invention disclosed herein.

Figure 4A:
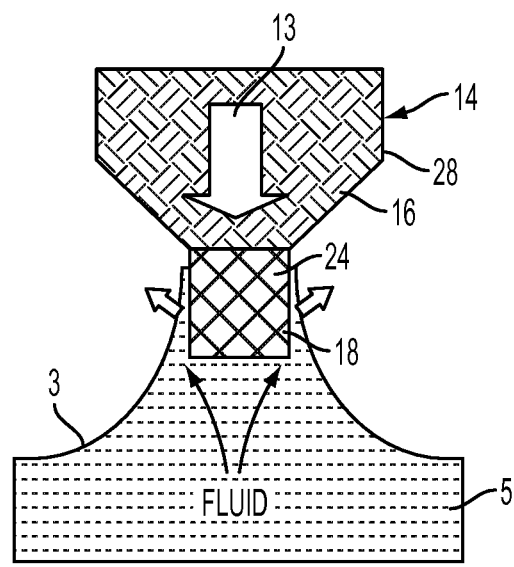
FIG. 4A schematically illustrates an embodiment of an elongated member of the device in contact with the working fluid and illustrates the associated wetting and non-wetting coatings of the embodiment.
Figure 4B:
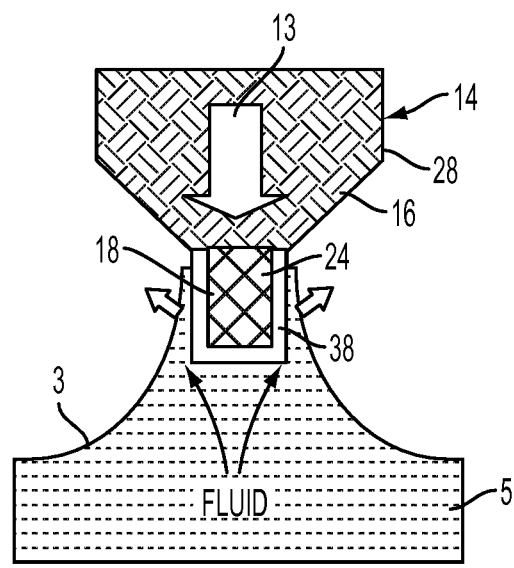
FIG. 4B schematically illustrates an embodiment of an elongated member of the device in contact with the working fluid and illustrates an embodiment utilizing a wick.

Referring generally now to FIG. 4A and FIG. 4B, another embodiment of the present invention may utilize wetting and/or non-wetting properties of materials in the heat-transfer device. In some embodiments, the wetting and/or non-wetting properties of the materials used in the heat transfer device ensure proper flow of the liquid phase of the working fluid to areas where it is desired that the working fluid be in the liquid phase. It should be appreciated that the wetting/non-wetting coatings and/or substrate material of the structure itself may include any portion to be applied on the designated location of the device (base or elongated members) as desired, needed or required. The portion may be of any size, area, thickness or contour as desired, needed or required.

Additionally, in some embodiments the wetting and/or non-wetting properties of the materials used in the heat transfer device ensure proper flow of the vapor phase of the working fluid to areas where it is desired that the working fluid be in the vapor phase. It should be appreciated that the wetting/non-wetting coatings and/or substrate material of the structure itself may include any portion to be applied on the designated location of the device (base or elongated members) as desired, needed or required. The portion may be of any size, area, thickness or contour as desired, needed or required.

It should be appreciated that the wetting and non-wetting properties may be provided by coating materials as illustrated in FIG. 4A and FIG. 4B or by the inherent properties of the substrate materials used to construct the relevant portions of the device. It should also be appreciated that the working fluid 5 should be compatible with the base member 6 and elongated member 14 or any coating materials used so that they will not react chemically to create non-condensable gases or cause other deleterious effects.

FIG. 4A depicts an embodiment of the present invention utilizing a wetting coating 24 and a non-wetting coating 28. The wetting coating 24 may be positioned on a portion (as desired, needed or required) of the distal region 18 of the elongated member 14. In this particular embodiment, a non-wetting coating 28 is positioned upon a portion of the proximal region 16 of the elongated member 14. Again, the location of the wetting/non-wetting coating (or structure) may vary accordingly.

Examples of materials suitable as wetting coating 24 or wetting substrate include, but are not limited to: hydrophilic materials, particularly when water is used as working fluid 5; and lyophilic materials, particularly when a fluid other than water is used as working fluid 5. Examples of materials suitable as non-wetting coating 28 or non-wetting substrate include, but are not limited to: hydrophobic materials, particularly when water is used as working fluid 5; and lyophobic materials, particularly when a fluid other than water is used as working fluid 5. Examples of materials suitable for use as hydrophilic/wetting materials may include, but not limited thereto the following: Metals, glass, ceramic, Silicon, Silicon Carbide, and Diamond, for particular group of working fluids. Examples of materials suitable for use as hydrophobic/non-wetting include, but not limited thereto: certain polymers, halogenated hydrocarbons, or chemically altered surfaces of the metals. It should be noted that wetting characteristics are defined for a liquid-solid pair. In an approach, it should be noted that the exact wetting characteristics of a particular embodiment may be determined by the specific interaction between a chosen working fluid 5 and chosen wetting coating 24 and/or wetting substrate surface (material) of the elongated member or base member. Thus, for example, a working fluid 5 and wetting coating 24 can be selected jointly according to the exact wetting properties of the liquid-solid pair.

Heat flow 13 conducts to the distal region 18 of the elongated member 14 and from the distal region 18 to the working fluid 5. The wetting properties of the wetting coating 24 cause the liquid portion of the working fluid 5 to wet the distal region 18 of the elongated member 14, creating a meniscus 3 in the liquid phase of the working fluid 5. As with other embodiments of the present invention, an evaporating thin film region will be present in a portion of the working fluid 5 in contact with the distal region 18 of the elongated member 14 (and depending on the status of the coating (e.g., portion, location and type of coating then the working fluid 5 may be in contact with the proximal region 16 of the elongated member 14). High heat transfer is achieved by the ability of the continually active thin film evaporation site (as shown in FIG. 2C and discussed in FIG. 3) to take full advantage of the latent heat of evaporation of the working fluid 5.

In addition, in this particular embodiment, the non-wetting coating 28 prohibits the working fluid 5 from covering or filing (or invading) the space surrounded by the proximal region 16 of the elongated member 14, thereby allowing that space to act as a vapor passage (e.g., channel or similar structure) for the vapor produced as a result of the evaporation, and flow in its respective vapor pathways. Additionally, the non-wetting coating 28 allows the vapor to flow to the condenser with minimized resistance.

Referring now to FIG. 4B, some embodiments of the present invention may also utilize a wick 38 (or similar structure) to ensure that the distal region 18 of the elongated member 14 remains in constant contact with the liquid phase of the working fluid 5. It may also be provided for the purpose to increase flow of the working fluid with the elongated members and passages. In such an embodiment, the wick 38 may be utilized to provide capillary draw in order to move the liquid portion of the working fluid 5 from the condenser portion of the device to the evaporator portion. It should be appreciated that other approaches may be utilized, such as systems similar to wicking or pumping systems. Such pumping approaches may include electro-osmotic pumping that may be used to promote the flow toward the thin film.

The wick 38 may be utilized to ensure the continuity of the contact between the distal region 18 of the elongated member 14 and the liquid portion of the working fluid 5 along the entire length of the elongated member 14. In this way, the capillary draw of the liquid portion of the working fluid 5 to the evaporation sites along the elongated members 14 is not compromised and problems associated with dry-out are reduced or avoided.

In other embodiments, the liquid portion of the working fluid 5 may be moved from the condenser to the evaporator by relying on gravity and allowing the working fluid 5 to pool back to the reservoir in the evaporator. Continuous contact between the distal region 18 of the elongated member 14 and the liquid portion of the working fluid 5 may then be achieved through a combination of wetting and/or non-wetting treatment of the relevant portions of the elongated member 14.

Figure 5A:
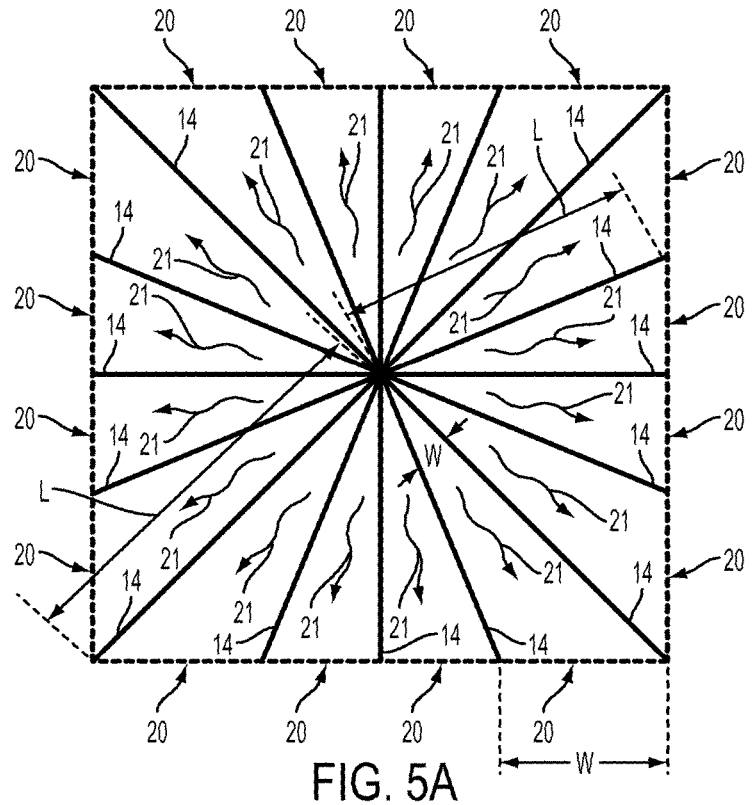
FIG. 5A schematically illustrates a radial arrangement of elongated members and the corresponding widening passages to accommodate the vapor pathways.

Referring now to FIG. 5A, in some embodiments of the present invention, the elongated members 14 may be constructed to form vapor passages 20 that generally widen along the pathways 21 in which the accumulating vapor flows. Thus, the passages 20 that are determined and configured by the elongated members 14 to accommodate vapor flow in a multitude of vapor pathways 21. In this embodiment, the passages 20 generally widen to accommodate increasing amounts of vapor traveling in their various vapor pathways 21. Near the center of a device that is configured in this manner, vapor flow rate will be less than near the edge, where all the accumulated vapor flow is passing before exiting the evaporator towards a condenser. Numerous features may be adjusted concerning the elongated members that impact the configuration of the passages created, such as, but not limited thereto: size, shape, area, contour, location or position, number provided, and density of the population provided. In a related manner, it should be appreciated that the various vapor pathways may be configured to be regular or irregular, as determined by the particular configuration of elongated members chosen.

The passages 20 may be, for example but not limited thereto, a channel such as a micro-channel. The passage 20 may have a designated length, L, and width, W, as desired, needed or required. Although, not expressly illustrated, the passage 20 may have a designated width, W, and area, A, as desired, needed or required. Any of the aforementioned dimensions may increase above or below the micro size magnitude. Additionally, any of the passages may include a variety of shapes and contours as required, needed or desired. They may have a variety of angles or pitches. The passages 20 may be, for example but not limited thereto, a channel such as a nano-channel.

In FIG. 5A, this general widening of the passages 21 is achieved through the use of an embodiment incorporating elongated members 14 that are radially aligned and thereby defining radial passages 20 to accommodate the pathways 21 of vapor. In an embodiment such as this, the closely configured elongated members 14 near the center achieve the benefit of efficient heat transfer, and the close configuration does not hinder the flow of vapor because the amount of vapor accumulating in the portion of the passages 20 near the center is relatively small. As the elongated members 14 extend away from each other in the direction of the pathways 21, the passages 20 widen in order to accommodate the accumulation of vapor along the length of the pathways 21.

The embodiment shown in FIG. 5A is only one such particular embodiment. It should be appreciated that widening or increasing the number of the passages 20 along the pathways 21 of vapor flow can be accomplished through a variety of embodiments. For example, the passages 20 can be irregularly shaped, and the elongated members 14 that define the passages 20 can be constructed to have intermittent, as opposed to continuous, positioning along the passages 20 accommodating the pathways 21 upon which the vapor will travel.

Figure 5B:
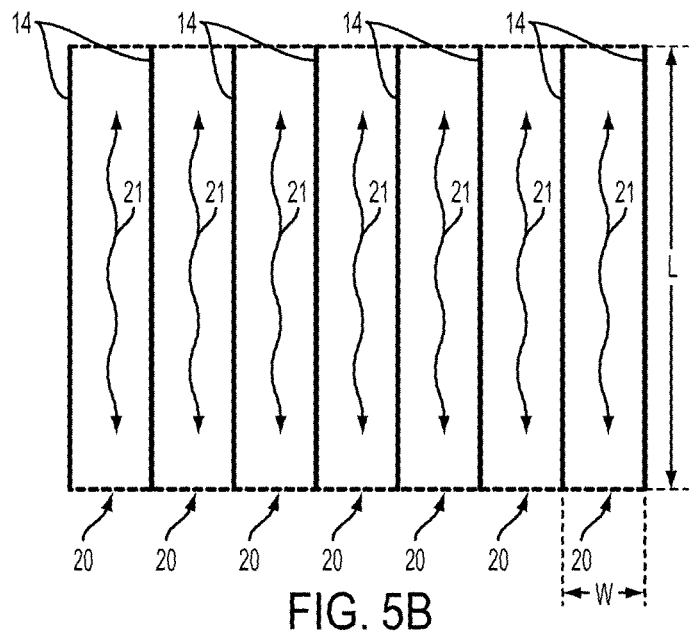
FIG. 5B schematically illustrates a parallel arrangement of an embodiment of elongated members and the corresponding passages to accommodate the vapor pathways.

Referring now to FIG. 5B, other embodiments of the present invention may be constructed such that the elongated members 14 form passages 20 that are substantially parallel. In this type of arrangement, the passages 20 do not widen along passages 20 that accommodate the pathways 21 in which accumulating vapor travels but instead they maintain a substantially unvarying cross-section.

Figure 5C:
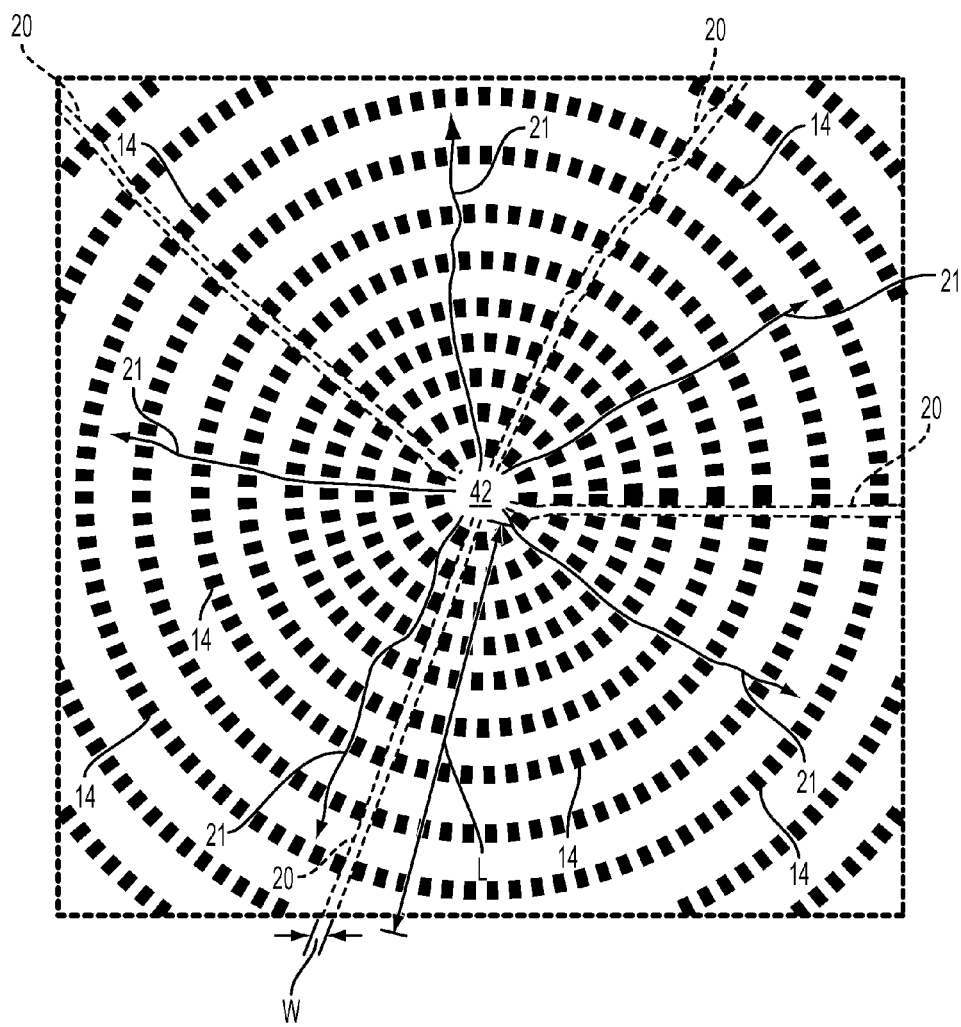
FIG. 5C schematically illustrates another embodiment of the radial arrangement with discontinuous wall or panel shaped elongated members (or similar, or pins, posts, or rods or similar shaped structures) to define various passages to accommodated the vapor pathways.

FIG. 5C is representative of another embodiment of the present invention in which the elongated members 14 are positioned in a radial fashion from a central point 42. In an embodiment such as this, the elongated members 14 that define the passages 20 are constructed to have intermittent, as opposed to continuous, positioning along passages 20 to accommodate the pathways 21 of vapor flow. This may be accomplished, for example, by utilizing elongated members 14 fashioned in the form of pins, posts, rods, (or similar structure) or combinations of these. This may also be accomplished, for example, by utilizing elongated members 14 fashioned in the form of panels or walls of intermittent length, as opposed to panels or walls that run the length of the evaporator portion of the device.

In the embodiment represented in FIG. 5C, the elongated members 14 are placed in an intermittent, radial fashion such that the number of available passages 20 generally increases along the pathways 21 upon which the accumulating vapor travels. In this manner, the overall vapor space defined by the passages 20 may generally widen and increase along the radiating pathways 21 upon which the accumulating vapor travels. Although as illustrated, the width of the passages remains about the same. However, it should be appreciated that as the pathway extends radially outward the population density of the elongated members (e.g., rods or pins) may decrease so that the width of the passages may increase.

Figure 5D:
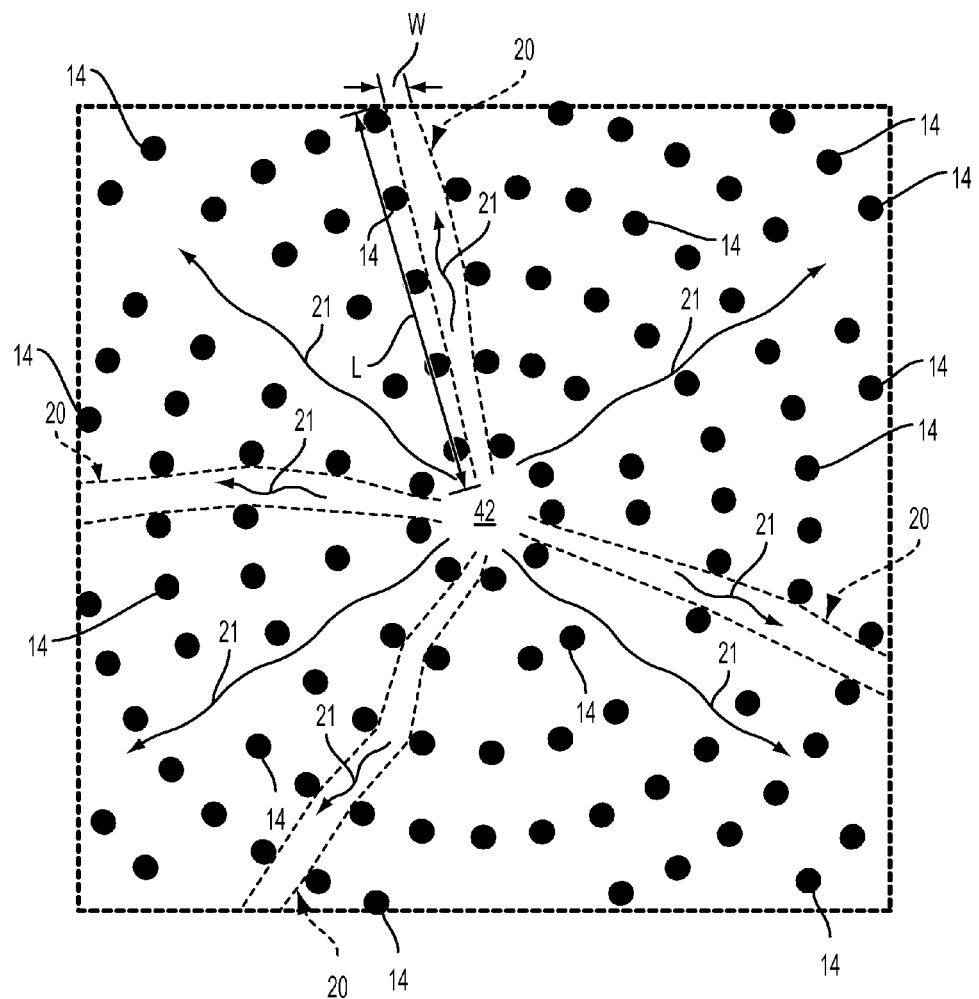
FIG. 5D schematically illustrates another embodiment of the radial arrangement utilizing rod, pin, or post shaped elongated members (or similar structure, or discontinuous wall or panel or similar shaped structures).

FIG. 5D is representative of yet another embodiment of the present invention that utilizes a radial positioning of elongated members 14 from a central point 42. As with other embodiments, the embodiment represented by FIG. 5D forms passages 20 that generally increase in size and/or number along the passages 20 to accommodate pathways 21 of vapor flow, thus increasing the overall vapor space capable of accommodating the accumulating vapor. For instance, the elongated members in the form of pins, post or rods (or similar structure), may be more densely populated toward the center of the device compared to the outer or circumferential portion of the device.

Figure 5E:
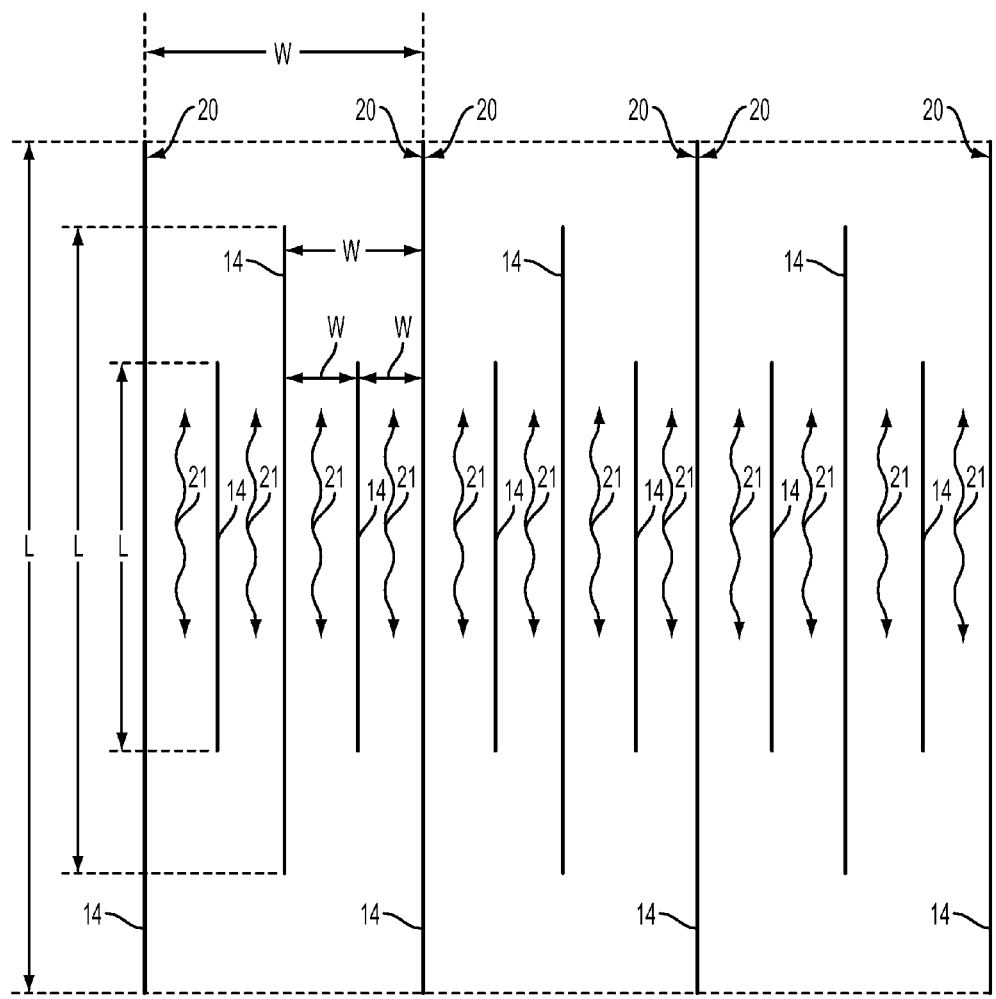
FIG. 5E schematically illustrates a parallel arrangement utilizing elongated members of different lengths placed to allow the passages (e.g., channels or other structures) to widen in the pathway of vapor flow.

Referring now to FIG. 5E, some embodiments of the present invention may utilize sections of elongated members 14 that are substantially parallel to each other in order to define passages 20 that are also substantially parallel to each other. In this particular embodiment, the number of elongated members 14 within any passage 20 is generally reduced in the direction of the pathway 21 upon which the accumulating vapor travels. This may be accomplished, for example, by positioning a number of elongated members 14 near the center and extending them to different lengths such that some do not extend all the way to the edge of the device, thus allowing the passages 20 to widen and accommodate the accumulation of vapor in a variety and multitude of pathways 21. In this manner, the overall vapor space defined by the passages generally widens and increases in the direction of the passages 20 and pathways 21 of vapor flow.

Figure 6A:
FIGS. 6A-6D schematically illustrate various embodiments of elongated members in the form of a wall or panel having a variety of contours or shapes, and which may have multiple curves or angles. Some shapes may include multiple contours (FIG. 6A); multiple angles (FIG. 6B); single curve (FIG. 6C); and straight alignment (FIG. 6D).
Figure 6B:
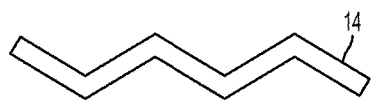
Figure 6C:
Figure 6D:
Figure 7A:
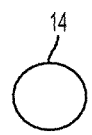
FIGS. 7A-7E schematically illustrate various embodiments of elongated members in the shape of a rod, pin, or post having different cross-sections as follows: circular, oval, rectangular (or square), hexagonal, and triangular, respectively. The cross section may be of any polygonal cross section.
Figure 7B:
Figure 7C:
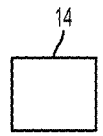
Figure 7D:
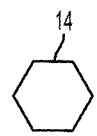
Figure 7E:
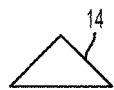

Referring now to FIGS. 6A, 6B, 6C, and 6D, some embodiments may utilize one or more elongated members 14 that are fashioned in the form of walls or panels. In some embodiments, the walls or panels may be curved or contoured. Some shapes may include multiple contours (FIG. 6A); multiple angles (FIG. 6B); single curve (FIG. 6C); and straight alignment (FIG. 6D). It should be appreciated that the different embodiments of elongated members 14 represented herein may be used in combination with each other or in combination with other forms. Additionally, the form of elongated members 14 used in any embodiment may be uniform or substantially uniform. An example of a curve design may be reflected by the spiral pattern illustrated in FIG. 19.

FIGS. 7A, 7B, 7C, 7D, and 7E are representative of additional forms of elongated members 14 that may be fashioned. These particular embodiments may be utilized to form one or more elongated members in the form of rods, pins, or posts (or similar). The elongated members 14 may have the following one or more different cross-sections; circular, oval, rectangular (or square), hexagonal, and triangular, as well as any combination thereof. Said differently, the cross section may be of any polygonal cross section or any conceivable geometrical shape. For example, the elongated members may be at least one of: triangular, triangular prism, a pyramid, a cone, and a cylinder.

FIG. 8A is a representation of one embodiment of the present invention heat transfer device 2, which provides a heat-transfer system that utilizes an evaporator 52, condenser 65, and an energy recovery unit 82. FIG. 8B is a specific representation of the evaporator portion 52 of the system as shown in FIG. 8A, and FIG. 8C is a specific representation of the condenser portion 65 of the system having a cool source 68 as FIG. 8A. It should be appreciated that while the stipple pattern representing the vapor space 22 is only illustrated in the far right passage 20, however the vapor space 22 is applicable to any and all passages 20 (such as but not limited thereto channels or micro-channels). As heat is removed from the heat source 12, a portion of it may be recovered as recovered energy by means of an energy recovery unit 82 and turned into useful work through the use of a thermal engine before the remainder is transferred to a cold reservoir 86. For example, a thermoelectric device may be utilized as an energy recovery unit 82, which is identified in FIG. 8A, for example but not limited thereto. It should be appreciated that other approaches may be utilized, such as systems similar to thermal engine or thermal electric systems. Other approaches may include a Tesla turbine, such as a low pressure Tesla turbine operating on Rankine cycle. Although not shown, as vapor is produced in the evaporator 52, the vapor passes through the passages 20 and into at least one vapor outlet (not shown) which is in communication with the passages 20. The vapor outlets are in communication with the condenser 65 (or alternatively some other destination), and through these vapor outlets (or the like or other substitute) the condenser 65 is able to receive the vapor produced in the evaporator 52 (or alternatively from some other source).

An advantage of the present invention, but not limited thereto, is that it may utilize the large latent heat of evaporation in the working fluid to increase the efficiency of energy recovery as relative to a single phase heat transfer device. This is because the process of heat transfer in a two-phase heat transfer device is essentially an isothermal one, with no sensible drop in temperature from the heat source to the point of recovery. Thus, the quality of input heat at the energy recovery unit will be higher and more work can be recovered. Recovery is more efficient in a two phase system compared to a single phase system.

Another benefit of the present invention, but not limited thereto, is the ability to provide efficient energy recovery even as compared to other two-phase heat transfer devices. This is because the benefits that come from, but not limited thereto, controlled and optimized evaporation, prevention of boiling, and prevention of dry-out in the evaporator increases the efficiency of heat transfer and the flux of heat, which concomitantly increases the potential for energy recovery.

Figure 9:
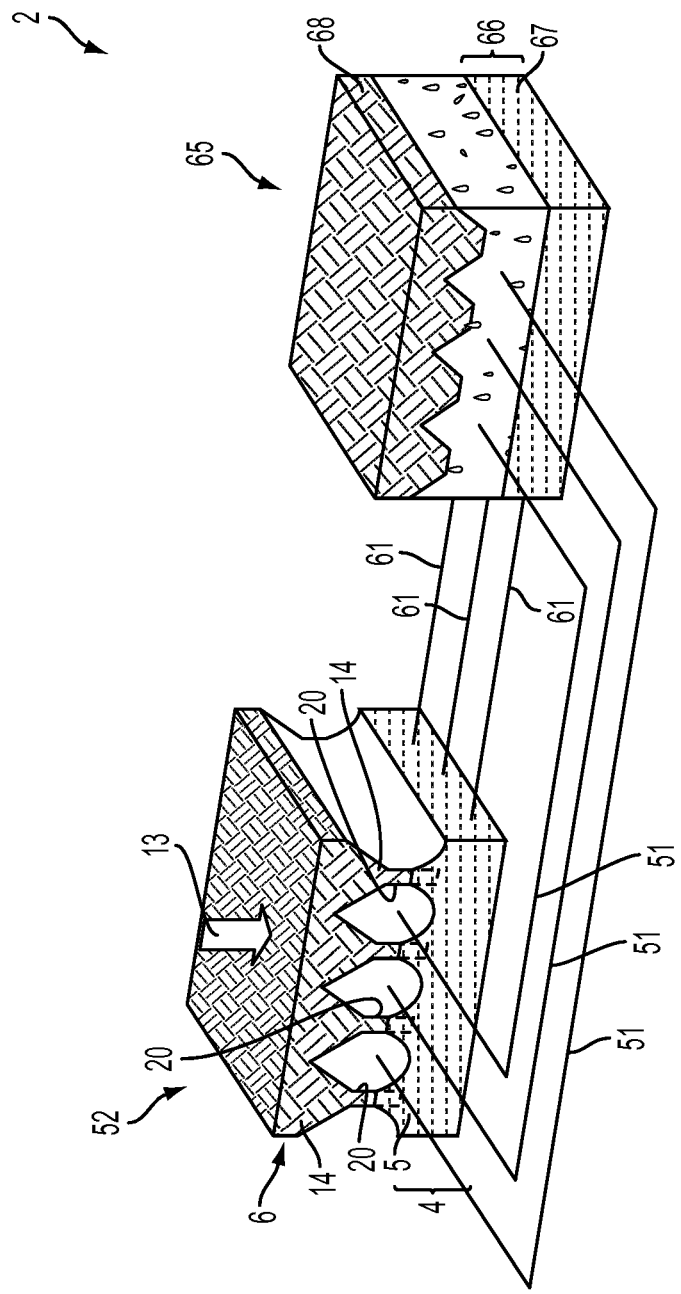
FIG. 9 schematically illustrates an embodiment of the heat transfer device that includes a heat transfer system whereby the evaporator utilizes a vapor outlet and liquid inlet to communicate with the condenser.

FIG. 9 is a representation of one embodiment of the present invention heat transfer device 2, which provides a heat transfer system that utilizes an evaporator 52 and a condenser 65. A base member 6 is configured to be in communication with a heat source and receives conducted heat flow 13. Elongated members 14 extend from the base member 6 and are immersed (inserted) into a working fluid 5 contained in a reservoir 4. The elongated members 14 are configured to form passages 20 between the elongated members 14. As vapor is produced in the evaporator 52, the vapor passes through the passages 20 (in their respective vapor pathways, as similarly illustrated in FIG. 3) and into at least one vapor outlet 51 which is in communication with the passages 20. The vapor outlets 51 are in communication with the condenser 65, and through the vapor outlets 51 the condenser 65 is able to receive the vapor produced in the evaporator 52. The condenser 65 is configured to be in communication with a base serving as a cool source 68, and the vapor supplied to the condenser 65 condenses to form a liquid 67 which gathers in the reservoir 66 of the condenser 65. Additionally, in this embodiment, the evaporator 52 is supplied with liquid 67 produced in the condenser 65 through at least one liquid inlet 61 is in communication with the reservoir 4 of the evaporator 52. Although not shown, it should be appreciated that ancillary or alternative liquid sources may be provided to the evaporator as well (such as for providing or receiving fluid).

In some embodiments, the liquid inlet 61 may utilize a conduit that includes a wick structure (although not specifically illustrated in FIG. 9) in order to transfer liquid from the condenser 65 to the evaporator 52. It should be appreciated that other approaches may be utilized, such as systems similar to wicking or pumping systems. Such pumping systems may be installed between the evaporator and the condenser. Perhaps in some cases, for example, a pump might be installed between the evaporator and the condenser in cases where the cooling system is integrated with an energy recovery unit of a type that requires compression and expansion of the working fluid. In such an embodiment, the wick may be utilized to provide capillary draw in order to move the liquid 67 produced in the condenser 65 to the evaporator 52. It should be appreciated that this wick structure may also be fashioned so that the portion within the evaporator 52 is adjacent to and in communication with the elongated members 14. In this manner, the wick can aid in providing liquid to the evaporation sites along the elongated members 14 and thus can reduce or avoid problems associated with dry-out.

In some embodiments, as illustrated in FIG. 9, the evaporator 52 and the condenser 65 may be separated such that there is a reservoir 4 for the liquid portion of the working fluid 5 contained in the evaporator 52 and a separate condenser reservoir 66 for the liquid 67 contained in the condenser 65. In such an embodiment, communication is maintained through the liquid inlets 61. In other embodiments, the evaporator 52 and condenser 61 may be configured to share the same common reservoir (not shown), rather than separate reservoirs. In such an embodiment, the liquid portion of the working fluid 5 may be moved from the condenser 65 to the evaporator 52 by relying on gravity and allowing the condensed working fluid 5 to pool back to the common reservoir (which is shared between the condenser and/or evaporator). Alternatively, an embodiment may include a combination of both approaches whereby the evaporator and condenser may have separate reservoirs, respectively, but they may also share a common reservoir as well. Also, it should be appreciated that an ancillary source for a reservoir may be implemented as well.

Figure 10A:
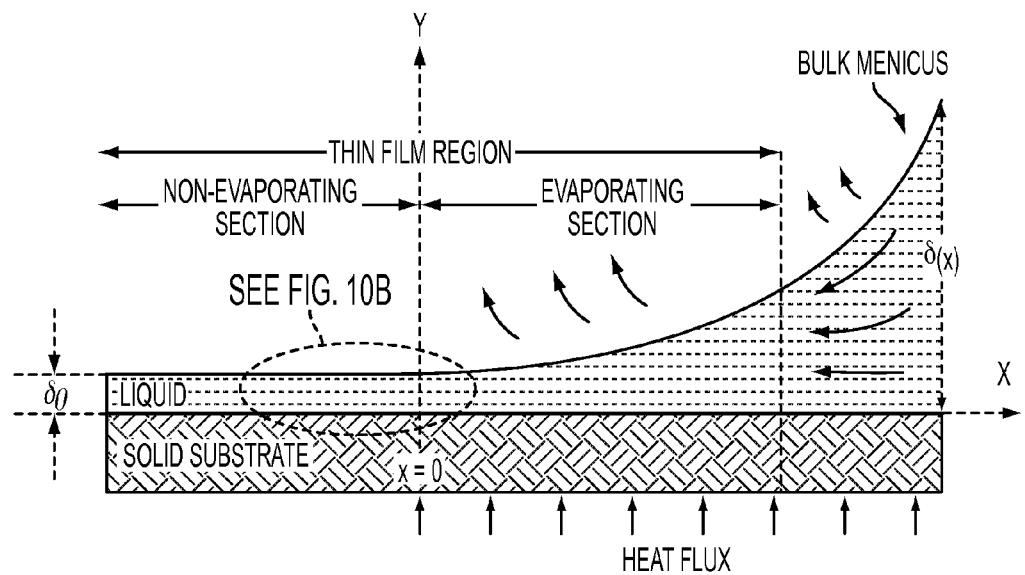
FIG. 10(A) schematically illustrates a detailed view of the thin-film portion or region of the meniscus.
Figure 10B:
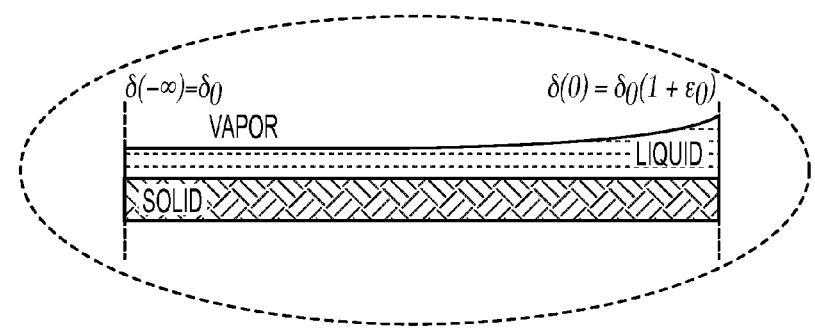
FIG. 10(B) schematically illustrates an enlarged detailed view of a transition region shown in the thin-film of FIG. 10(A) where the non-evaporating portion and evaporating portion of the thin-film meet.

FIG. 10(A) schematically illustrates a detailed view of an evaporating liquid meniscus (that is part of the entire liquid meniscus). The illustration shows a detail detailed view of the section of the liquid meniscus that is connected to the solid substrate (such as shown in FIG. 2B). The evaporating meniscus may be broken into three separate regions: a non-evaporating thin film portion, an evaporating thin film portion, and the intrinsic or bulk meniscus. In the non-evaporating portion, because the liquid film is so thin, the adhesion forces between the liquid and solid surface are greater than the cohesion forces between liquid molecules themselves. Therefore, evaporation is prevented in this region. In the evaporating region is where a significant majority of evaporation from the meniscus occurs. Here the film thickness is optimal for heat transfer from the solid to the surface of the film and the adhesion forces are sufficiently weak to allow for evaporation. Finally, in intrinsic or bulk meniscus the thicker liquid film absorbs more of the heat transferred from the solid resulting in less heat reaching the liquid vapor surface. As a result only minimal evaporation occurs in the intrinsic or bulk meniscus. FIG. 10(B) schematically illustrates an enlarged detailed view of a transition region shown in the thin-film of FIG. 10(A) where the non-evaporating portion and evaporating portion of the thin-film meet.

Figure 11A:
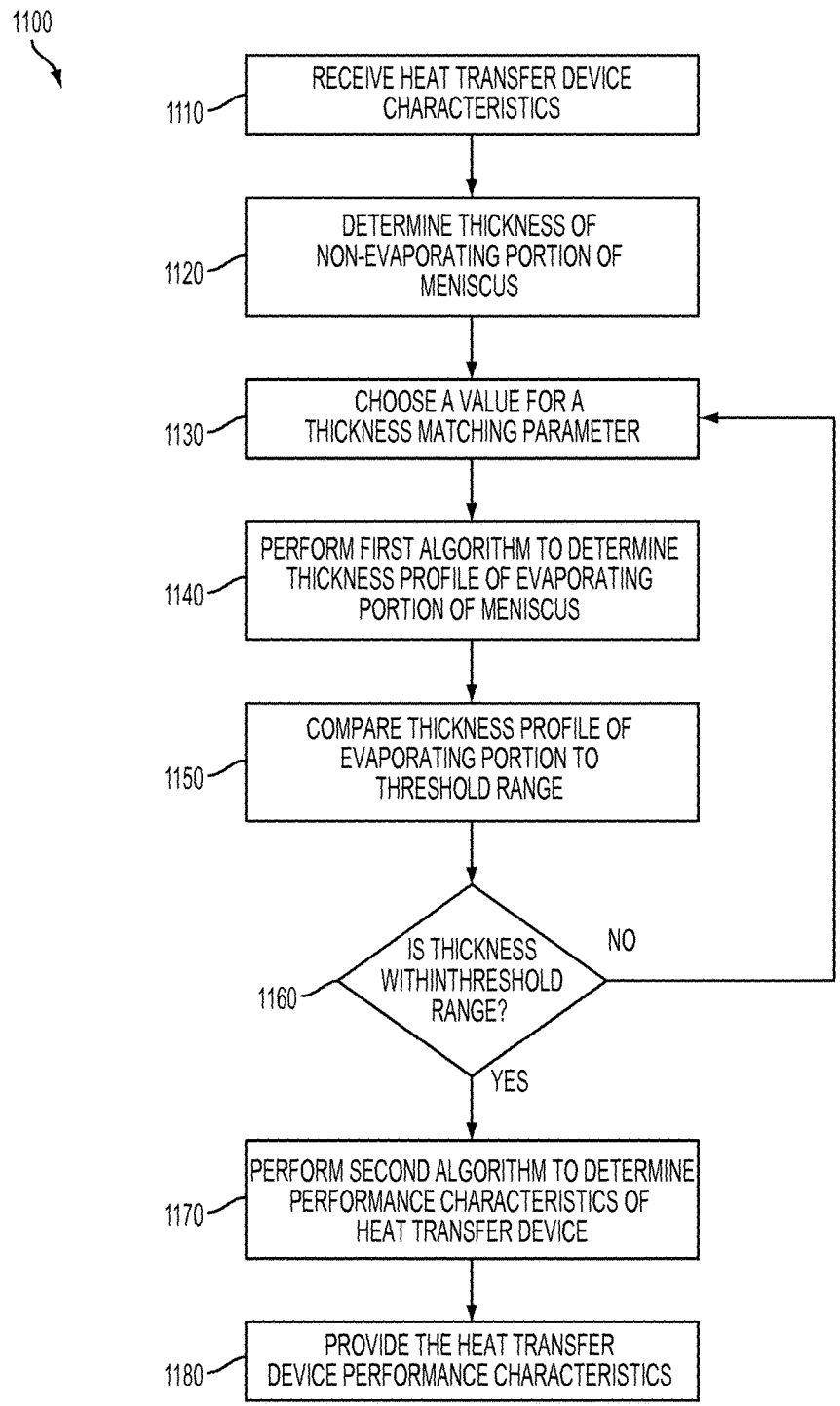
FIGS. 11A-B provides a flow chart representing a method of an embodiment for determining the heat transfer from a thin film.
Figure 11B:
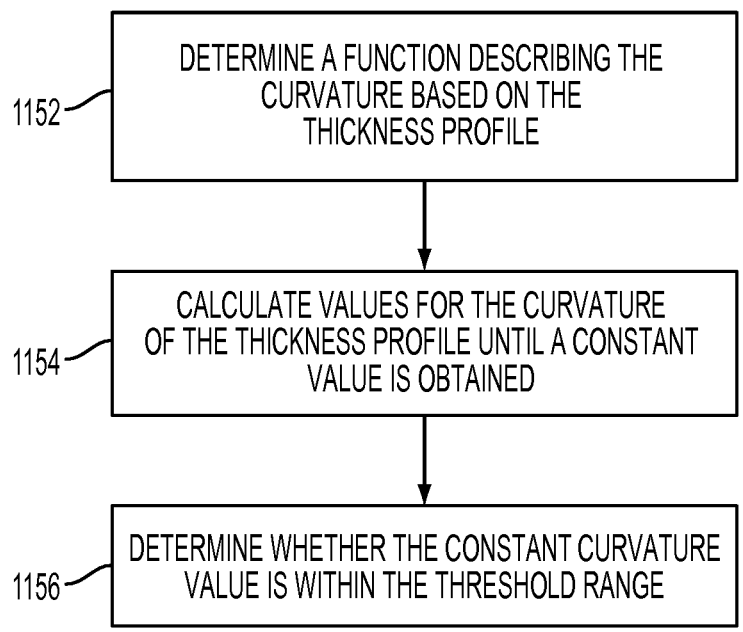

FIGS. 11(A)-(B) provides a flow chart representing a method of an embodiment for determining the heat transfer from a thin film. FIG. 11(A) is a block diagram of an embodiment of a computer-implemented method 1100 for determining the heat transfer from a thin film. Briefly, the method may include receiving characteristics of a heat transfer device (e.g. evaporator), determining a thickness (or a thickness profile for an approach of an embodiment) of a non-evaporating portion of a meniscus formed by a liquid on a surface of channels of the heat transfer device, determining a value for a thickness profile matching parameter, performing a first algorithm to determine a thickness profile of an evaporating portion of the meniscus formed by the liquid on the surface based on said thickness profile matching parameter and an assumption that said non-evaporating portion of the meniscus has a curved profile, determining that the thickness profile of the evaporating portion is within a threshold range, performing a second algorithm to estimate the performance of the heat transfer device (i.e., evaporator), and displaying the estimated performance of the heat transfer device (i.e., evaporator). In addition to or instead of displaying, it should be appreciated the characteristics or similar may be provided to other types of output devices, wherein the output device may include storage, memory, or network, as well as a display (or print out). It should be noted that all of the equations used in the method 1100 may be derived from the set including: the augmented Young-Laplace equation, capillary pressure vs. interface curvature, disjoining pressure vs. liquid film thickness, lubrication theory, evaporation theory, heat conduction across a liquid film, Clausius-Clapeyron equation, Schrage equation, and the Kelvin equation.

In more detail, an embodiment of the present invention method (1100) includes receiving heat transfer device (i.e., evaporator) characteristics 1110 on a computing device from a user. The heat transfer device (i.e., evaporator) characteristics are the attributes of the heat transfer device (i.e., evaporator) that are required to estimate the heat transfer device's performance characteristics. The heat transfer device characteristics may be, for example, a liquid used in the heat transfer device (i.e., evaporator), the material from which the heat transfer device (i.e., evaporator) is constructed (e.g. the substrate), the dimensions (i.e., height, width, and length) of the passages (i.e., fluid channels) in the heat transfer device (i.e., evaporator), the liquid vapor interface temperature ($T_{lv}$), the operating pressure of the heat transfer device (i.e., evaporator), operating temperature of the heat transfer device (i.e., evaporator), the saturation pressure ($P_{sat}$) of the liquid (i.e., working fluid), the saturation temperature of the liquid ($T_{sat}$), the expected temperature of the channel walls ($T_w$) [i.e. passage walls], and a superheat ($T_w$-$T_{lv}$). In various embodiments, all or a subset of the heat transfer device (i.e., evaporator) characteristics may be requested and received from a user. Those heat transfer device characteristics not received from a user may be, for example, set as default values or accessed from one or more databases or tables of material properties or thermophysical properties. The databases or tables may be stored on the computing device or accessed via a network connection from a server. In some embodiments, for example, the superheat is preferably one degree Kelvin or less and the channel width (i.e., passage width) is preferably one micron or greater. However, it should be appreciated that the disclosed method may be applied to various ranges of superheat and channel configurations and sizes.

It should be appreciated that other non-limiting examples of the heat transfer device characteristics may include any one or more of the following: overall size of the device, passage or channel configuration, arrangements of passages (i.e., channels), device configuration, fluid characteristics—such as density, thermal conductivity, specific heat, boiling point, heat of vaporization, and viscosity (as well as other characteristics as desired, needed or required). Moreover, it should be recognized that the fluid characteristics (as well other parameters) may vary with temperatures. Further yet, the heat transfer device characteristics may include the following: time to achieve a certain temperature (of the heat transfer device), time of operating until overheat, power dissipation, fluid flow rate, maximum temperature of the heat transfer device, and thermal resistance (as well as other characteristics as desired, needed or required).

It should be appreciated that other non-limiting examples of the heat source characteristics may include any one or more of the following: heat source temperature, heat source maximum allowable temperature, heat generation, power output, thermal resistance, time to maximum temperature, time for heat source over heat, and time to operating temperature or predetermined temperature (e.g., steady state temperature); as well as other characteristics as desired, needed or required.

It should be appreciated that other non-limiting examples of the ancillary characteristics may include any one or more of the following: ambient temperature, junction characteristics—such as size, heat transfer, thermal conductivity, temperature of the junction, and thermal resistance of the junction (as well as other characteristics as desired, needed or required). Further yet, other non-limiting examples of the ancillary characteristics may include: humidity, outside heat loss (i.e., heat loss other than the heat transfer device). A junction may be an intervening layer between the heat transfer device and the heat source. Alternatively, junction may be provided between various components or parts disclosed herein.

It should be appreciated that the heat transfer device characteristics may originate from an actual design and/or constructive design. For instance, the heat transfer device characteristics may be from prototype designs, actual operating systems, or hypothetical designs (as well as other sources as desired, needed or required). Moreover, heat transfer device characteristics may be from simulated designs, i.e., In silico (or any desired or required simulators).

In some embodiments, drop-down menus or data entry blocks may be presented in a user interface to receive the heat transfer device characteristics, for example. Some embodiments may also receive various heat transfer device characteristics as ranges with specified increments or step sizes, for example to find an heat transfer device (i.e., evaporator) design with optimal performance. For instance, a received channel width value (i.e., passage width value) may range from 1 micron to 100 microns with a stated channel width increment (e.g. 1 micron). In such an embodiment the method will be performed for each channel width value (i.e. 101 iterations) and may include determining which evaporator characteristics provide optimal performance.

In some embodiments, a graphical image or diagram (e.g., a computer aided design drawing) of the heat transfer device (i.e., evaporator) geometry also may be received (e.g. as shown in FIGS. 5(A)-5(E). In such an implementation heat transfer device characteristics such as various values for channel (i.e., passage) dimensions, for example, may be determined from the image.

Next, the thickness of a non-evaporating portion (as shown in FIG. 10) of a liquid meniscus is determined (1120). With reference to FIGS. 2 and 10 the thin film region of a meniscus may be broken into three regions having: a non-evaporating portion, an evaporating portion, and the remaining intrinsic or bulk meniscus. The thickness of the flat portion of the non-evaporating portion of the thin film region, represented by $\delta(-\infty)$, is:

$$\delta(-\infty) = \left(A\left(P_v\left(\frac{T_w}{T_v}\right)^{1/2}\left(1 - \frac{\rho_l R T_w}{MP_{sat}(T_w)}\right) - P_{sat}(T_w)\right)^{-1}\right)^{\frac{1}{3}}$$

which provides an example(s) of an aspect of an evaporator (heat transfer device) characteristic, where M is the molecular weight of the liquid, A is a dispersion constant (or Hamacker constant), $\rho_l$ is the density of the liquid, R is the gas constant, and $P_v$ is the vapor pressure of the liquid. $\delta(-\infty)$ represents the thickness of the non-evaporating region at a point farthest from the evaporating region as shown in FIGS. 10(A) and 10(B).

A value for a thickness profile matching parameter, $\varepsilon_o$, is then chosen 1130. The thickness profile matching parameter is used in an iterative process, described below, to mathematically match the thickness profile of the non-evaporating portion with the thickness profile of the evaporating portion within the transition region represented by $x \leq 0$ in FIGS. 10(A) and 10(B). More specifically, the thickness profile matching parameter represents a degree of freedom that is used to optimize boundary conditions for solving a fourth order ordinary differential equation representing the thickness profile of the evaporating portion of the meniscus. Boundary conditions are optimized with the objective of having the curvature of the evaporating portion of the meniscus reach the geometric radius of curvature dictated by the width of the channels. For example, in some embodiments an initial value of 1 may be chosen for the thickness profile matching parameter, $\varepsilon_o$.

A first algorithm is performed to determine a thickness profile of an evaporating portion of the meniscus formed by the liquid on the surface (1140). The first algorithm includes solving the system of differential-algebraic equations (Eqns. 1-4) for a thickness profile represented by $\delta(x)$, where x represents the distance along the x-axis in the region $0 < x < \infty$, as shown in FIG. 10(B).

$$\frac{3\nu}{\delta^2}\dot{m}_{evap}(x) = \frac{3A\delta'^2}{\delta^4} - \frac{3A\delta''}{\delta^3} + \frac{3\sigma\delta'(-3\delta'\delta''^2 + \delta^{(3)} + \delta'^2\delta^{(3)})}{(1+\delta'^2)^{5/2}} + \frac{\sigma\delta[3(-1+4\delta'^2)\delta''^3 - 9\delta'(1+\delta'^2)\delta''\delta^{(3)} + (1+\delta'^2)\delta^{(4)}]}{(1+\delta'^2)^{7/2}} \quad \text{Eqn. 1}$$

$$\dot{m}_{evap} = \frac{2c}{2-c}\left(\frac{M}{2\pi R}\right)^{\frac{1}{2}}\left(\frac{P_{eq}(T_{lv})}{T_{lv}^{\frac{1}{2}}} - \frac{P_v}{T_v^{\frac{1}{2}}}\right) \quad \text{Eqn. 2}$$

$$P_{eq}(x) = P_v(T_v)\exp\left[\frac{Mh_{fg}}{R}\left(\frac{1}{T_v} - \frac{1}{T_{lv}}\right)\right]$$

$$\exp\left[\frac{P_{eq}(x) - P_{sat}(T_{lv}) - P_c(x) - P_d(x)}{\rho_l R T_{lv}/M}\right] \quad \text{Eqn. 3}$$

$$\dot{m}_{evap}(x) = \frac{k_l(T_w - T_{lv}(x))}{\delta(x)h_{fg}} \quad \text{Eqn. 4}$$

In the above equations a prime denotes differentiation with respect to the space coordinate, x. The system of equations (Eqns. 1-4) may be solved to for all four unknown values: the distribution functions for the thickness of the film, $\delta(x)$, evaporative mass flux, $\dot{m}_{evap}(x)$, interface temperature, $T_{lv}(x)$, and equilibrium vapor pressure, $P_{eq}(x)$. The system of equations also may be reduced to a single 4th-order non-linear differential equation (Eqn. 1) and solved only for $\delta(x)$.

Referring again to FIG. 10(B), the first algorithm is based on the assumption that non-evaporating and evaporating portions of the liquid film are connected through a transitional region which starts at $x=-\infty$ and ends at $x=0$. The distribution profile for the film thickness, $\delta(x)$ in this transitional region is obtained using the following assumptions:
1. The thickness of the film at $x=-\infty$ is $\delta(-\infty)=\delta_o$.
2. The thickness of the film through this region can be described as $\delta(x)=\delta_o(1+\varepsilon(x))$ in which $\varepsilon(x) \ll 1$. The function $\varepsilon(x)$ is defined through eqn. 6 below.
3. The thickness of the liquid film at $x=0$ is $\delta(0)=\delta_o(1+\varepsilon_o)$. The parameter $\varepsilon_o$ denotes the value of $\varepsilon(x)$ at $x=0$ ($\delta_o=\varepsilon(0)$).
4. The evaporative mass flux, $\dot{m}_{evap}(x)$, remains constant and equal to zero throughout the transitional region. This implies that the summation of capillary pressure and disjoining pressure along the transitional region remains constant.

Stated differently, it is assumed 1) that the thickness of the non-evaporating portion at a distance far from the transition region (x=0) is constant, 2) that the profile of the non-evaporating region curves slightly as it enters the transition region, 3) that the thickness of the evaporating portion profile at the transition point is equal to $\delta_o(1+\varepsilon_o)$ (setting the first boundary condition for solving Eqn. 1), and 4) that the mass flux is constant and zero in the transition region.

In order to solve the system of equations (Eqns. 1-4), and particularly Eqn. 1, boundary conditions are calculated at the transition point (x=0) using the thickness profile matching parameter, $\varepsilon_o$. The boundary conditions constrain the solution to the thickness profile of the evaporating portion when Eqn. 1 is solved.

Based on the assumption (4) for the transitional region, the thickness profile between $x=-\infty$ and $x=0$ is described by Eqn. (5)

$$\frac{A}{\delta_0^3} = \sigma\delta'' + \frac{A}{\delta^3} \quad \text{Eqn. 5}$$

Equation (5) is solved analytically using boundary conditions described in assumptions 1 and 3. The thickness profile for the transitional region is obtained as $$\delta = \delta_0(1+\varepsilon_0 e^{Bx}) \quad \text{Eqn. 6}$$

in which $B^2 = 3A/(\sigma\delta_0^4)$. Using Eqn (6) the boundary conditions required to solve Eqn. (1) are determined as $$\delta(0) = \delta_0(1+\varepsilon_0)$$

$$\delta'(0) = \delta_0\varepsilon_0 B$$

$$\delta''(0) = \delta_0\varepsilon_0 B^2$$

$$\delta^{(3)}(0) = \delta_0\varepsilon_0 B^3 \quad \text{Eqns. 7-10}$$

Next, it is determined whether the solved thickness profile of the evaporating portion is within a threshold range (1150).

The threshold range is used to verify the accuracy of the solution to for $\delta(x)$. FIG. 11(B) illustrates a block diagram of a more detailed description of step (1150) for determining whether the thickness profile of the evaporating portion is within the threshold range. First, a function describing the radius of curvature along the evaporating portion thickness profile is determined (1152). The curvature function may be determined using the relationship $c(x)=[\delta''(x)(1+\delta'(x)^2)^{-3/2}]$, where $c(x)$ represents the curvature of the evaporating portion thickness profile at x. Next, the curvature, $c(x)$, is calculated for sequential values of x beginning at $x_1=0$ until a constant curvature value is obtained (1154). The constant curvature value is then compared to the threshold range (1156). The threshold range may include both an upper and a lower bound and the constant curvature value may be determined to be within the threshold range if it is greater than or equal to the lower bound and less than or equal to the upper bound, for example. In some embodiments the lower bound may be equal to $(1-\Delta_1)$ $$\left(\frac{2}{w_c}\right)$$

and the upper bound may be equal to $(1+\Delta_2)$ $$\left(\frac{2}{w_c}\right),$$

where $w_c$ is the channel with (i.e., passage width) of the heat transfer device (i.e., evaporator) and where $\Delta_1$ and $\Delta_2$ are small numbers on the order of 0.01, for example. It should be appreciated that it may be greater or lesser that 0.01.

When the evaporating portion thickness profile is within the threshold range (1160) then a second algorithm is performed to determine the estimated performance of the heat transfer device (1170). The second algorithm may apply the system of equations (Eqns. 1-4) to solve for the evaporative mass flux, $\dot{m}_{evap}(x)$. Some embodiments, may also apply the evaporative mass flux to solve for the total heat dissipation capacity of the heat transfer device (i.e., evaporator). For example, equations 11 and 12 may be used (in the case of constant width channels) to solve, first, for the heat transfer capacity of each one dimensional channel (passage) in the evaporator ($Q_{channel}$) and, second, for the total heat transfer capacity of the evaporator, ($Q_{total}$).

$$Q_{channel} = 2\int_0^{x_f} \dot{m}_{evap}(x)h_{fg}dx \qquad \text{Eqn. 11}$$

$$Q_{total} = N_{channels}L_{channel}Q_{channel} \qquad \text{Eqn. 12}$$

Where $h_{fg}$ is the liquid's enthalpy of evaporation, $N_{channels}$ is the number of channels (i.e., passages) in the heat transfer device (i.e., evaporator), and $L_{channel}$ is the length of the channels (i.e. passage). Some embodiments may use variations of these equations, for example, based on the geometry of the thin-film heat transfer device (i.e., evaporator). For instance, it should be appreciated that it is possible to perform other calculation once $\dot{m}_{evap}(x)$ is known to optimize the geometry of a specific heat transfer device (i.e., evaporator). For example, but not limited thereto, the width of the passages (or channel) and the width of the walls (for example elongated members) may be adjusted or varied.

There are a plurality of parameters, so suffice it to say that the geometry and parameters (such as choice of solid and working fluid) can be optimized. Other performance characteristics which may be determined using the results from the second algorithm are, for example, statistics related to individual channels in a heat transfer device such as the vapor velocity at various points in a channel, the volumetric flow rate for vapor at various points in a channel, or the amount of heat dissipated at various points in a channel. Performance characteristics also may include a determination of the likelihood that vapor choking or entrainment will occur in a heat transfer device's channels and the potential location within the channels of such phenomena. The information provided by the performance characteristics may have the advantage of alerting a designer to potential inefficiencies or problems with a specific heat transfer device design as a whole or related to a particular channel design.

In some embodiments, if a diagram of the heat transfer device (i.e., evaporator) was received in step (1110) the calculated value of $\dot{m}_{evap}(x)$ may be used to determine the total mass flux through the channel (passage). For instance, the total vapor flowing through a channel (i.e., passage) will be minimal at the center of the channel (i.e., passage) and will increase at the ends of a channel (passage) near the openings as the vapor flowing toward the ends of the channel (i.e., passage) mixes with vapor evaporating at the ends of the channel or beyond the center of the channel. By integrating the $\dot{m}_{evap}(x)$ produced at each point through the length of a channel (i.e. passage), a value for the total volumetric vapor flow may be determined at each point in the channel (i.e., passage). If the total evaporative mass flux is too large vapor choking may occur in the channel (i.e., passage) reducing the overall performance of the heat transfer device (i.e., evaporator). Therefore, some embodiments may use the received evaporator characteristics and calculated evaporative mass flux and volumetric vapor flow to predict the likelihood of vapor choking in particular heat transfer device (i.e., evaporator) designs. For example, an embodiment may predict locations of likely vapor choking and indicate those points on a received diagram of the heat transfer device (i.e., evaporator). Furthermore, some embodiments, may similarly determine the likelihood that liquid will become entrained in the vapor as two phases pass through the channels (i.e., passages). Liquid entrainment in a vapor may occur as a vapor flows over a liquid if the vapor's velocity exceeds a specified entrainment velocity. In similar fashion, an embodiment may use evaporator characteristics and volumetric vapor flow calculations to predict locations of likely entrainment and indicate those points on a received diagram of the heat transfer device (i.e., evaporator). Thus, the computer-implemented method may provide a thin-film evaporator with optimized performance.

If the large-x curvature of the evaporating portion thickness profile is not within the threshold range (1160) then the method returns to step (1130) in which a second value for the thickness profile matching parameter, $\varepsilon_o$ is chosen. Thus the method is an iterative process by which the optimal boundary conditions (Eqns. 7-10) are found based on the choice of $\varepsilon_o$. It will be appreciated by one skilled in the art that many processes may be used to select values for $\varepsilon_o$. For example, Newton-Raphson method, a variety of bisection search schemes, or other methods may be used.

Finally, the evaporator's estimated performance characteristics are displayed (1180) to the user (as one possible type of output). For example, the estimated performance may be displayed on a display connected to the computing device. The heat transfer device estimated performance may be displayed in tabular or graphical form. The performance characteristics may be represented graphically using icons or colors, for example, a shade of red overlaid on a diagram of the heat transfer device may indicate an area of high heat dissipation while a shade of yellow may indicate an area of low heat dissipation. In some implementations notes may be displayed on a graph indicating which evaporator characteristics provide optimal heat transfer, for example. In an implementation including a diagram of the heat transfer device (i.e., evaporator), the displayed estimated heat transfer device performance characteristics may include, but not limited thereto, indications of points at which choking is likely to occur within channels (i.e., passages) on the heat transfer device (i.e., evaporator) diagram. Other heat transfer device performance characteristics may include: a) likelihood of choking or entrainment in any of said channels of said heat transfer device, b) total heat dissipation of said heat transfer device or c) specific statistics for any of said channels. Some examples of specific statistics of any of the channels may include any one or more of: a) vapor velocity in the channels; b) vapor volumetric flow in the channels; or c) amount of heat dissipation in the channels. Some non-limiting examples may include: a) vapor velocity, such as vapor velocity at at least one point in any of said channels; b) vapor volumetric flow rates, such as vapor volumetric flow rates at at least one point in any of the channels; or c) amount of heat dissipation, such as amount heat dissipation at at least one point in any of the channels.

It should be appreciated that other non-limiting examples of the performance characteristics of heat transfer device may include any one or more of the following: heat transfer, choke location, likelihood of choking, vapor velocity in at least one specified point of the passage (i.e., channel), vapor volumetric flow, heat dissipation, time to achieve a certain temperature (of the heat transfer device), time of operating until overheat, power dissipation, maximum temperature of the heat transfer device, time to heat source maximum temperature, time to operating temperature or predetermined temperature (e.g., steady state temperature), and time for heat source over heat.

Figure 11C:
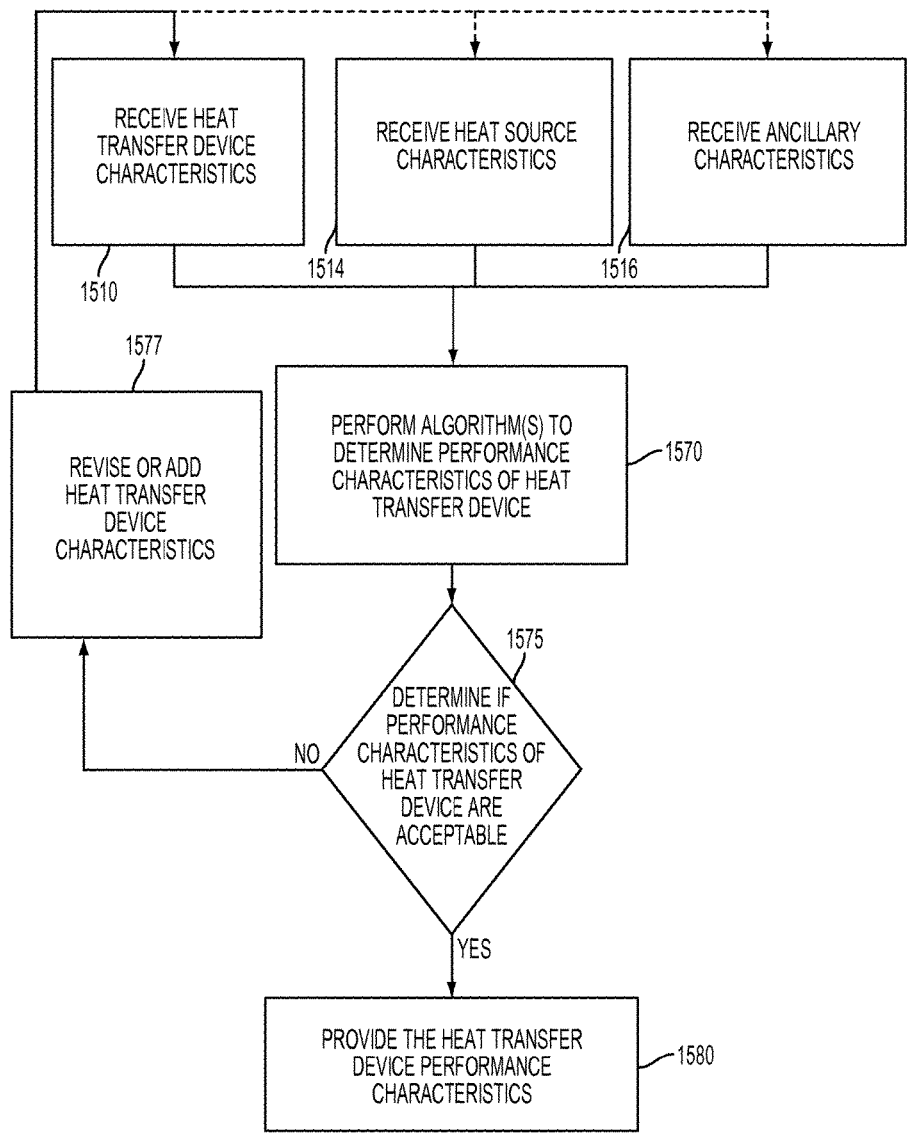
FIG. 11C provides a flow chart representing a method of an embodiment for determining the heat transfer device performance characteristics.

Similar to the representative embodiment(s) reflected in FIGS. 11(A)-(B), it should be appreciated that the performance characteristics of the heat transfer device may be determined 1575 as reflected in FIG. 11(C). For instance, the method may begin by receiving the heat transfer device characteristics 1510, receiving the heat source characteristics 1514, and receiving any ancillary characteristics 1516. Next, an algorithm(s) may be performed to determine the performance characteristics of the heat transfer device 1570. Thereafter, it should be determined whether the performance characteristics of the heat transfer device are acceptable 1575. If so, the performance characteristics of the heat transfer device may be provided 1580. To the contrary, if not acceptable, then the heat transfer device characteristics may be revised (or additional data provided) 1577. Besides the aforementioned step of revising or adding heat transfer device characteristics, it should be appreciated that revised (or additional) heat source characteristics and/or ancillary characteristics may be provided as well (as shown by the dashed lines of the flow chart, e.g. steps 1514 and 1516).

Figure 11D:
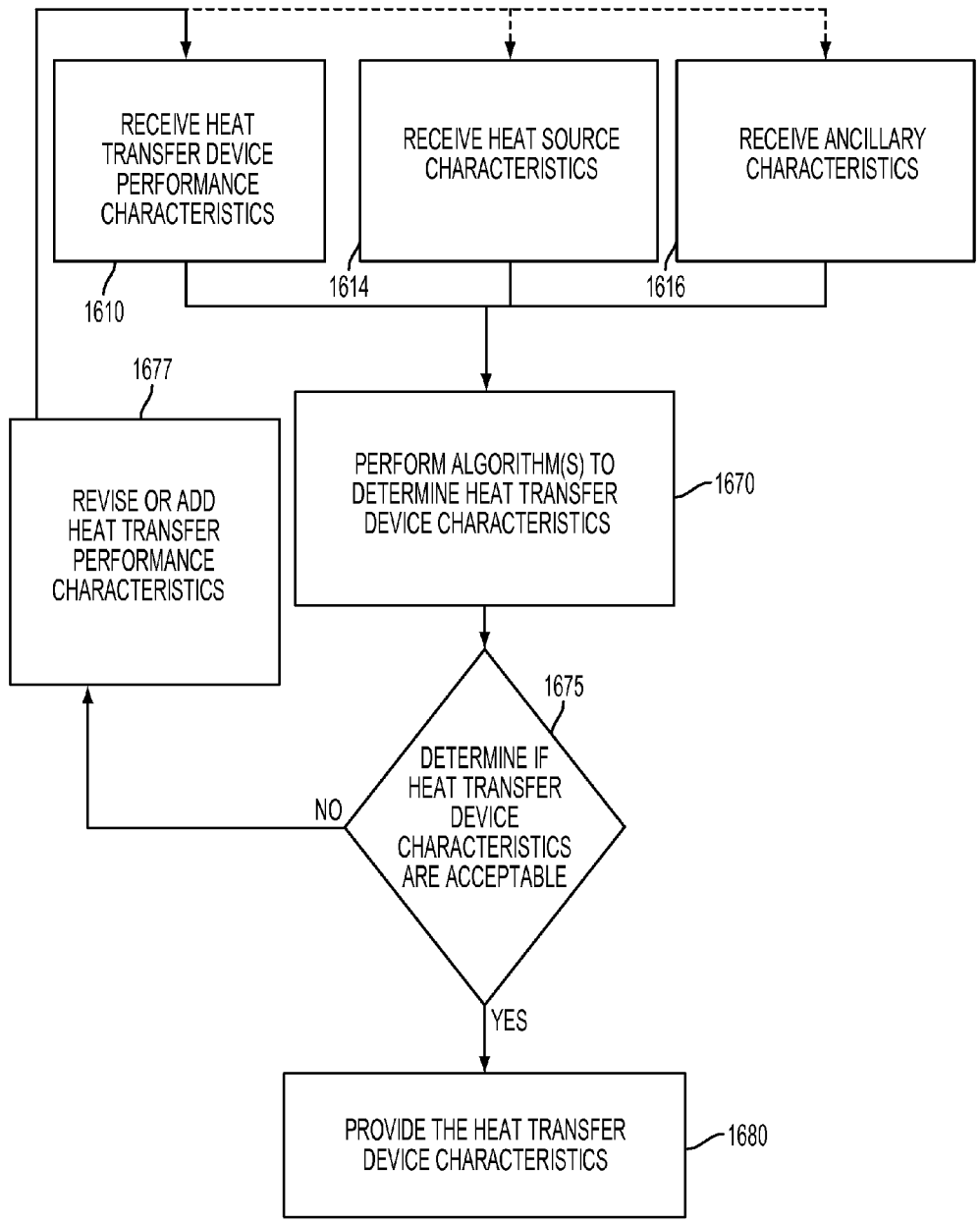
FIG. 11D provides a flow chart representing a method of an embodiment for determining the heat transfer device characteristics.

Similar to the representative embodiment(s) reflected in FIGS. 11(A)-(B), it should be appreciated that the heat transfer device characteristics may be determined 1675 as reflected in FIG. 11(D). For instance, the method may begin by receiving the heat transfer device performance characteristics 1610, receiving the heat source characteristics 1614, and receiving any ancillary characteristics 1616. Next, an algorithm(s) may be performed to determine the heat transfer device characteristics 1670. Thereafter, it should be determined whether the heat transfer device characteristics are acceptable 1675. If so, the heat transfer device characteristics may be provided 1680. To the contrary, if not acceptable, then the performance characteristics of the heat transfer device may be revised (or additional data provided) 1677. Besides the aforementioned step of revising or adding performance characteristics of the heat transfer device, it should be appreciated that revised (or additional) heat source characteristics and/or ancillary characteristics may be provided as well (as shown by the dashed lines of the flow chart, e.g. steps 1614 and 1616).

It should be appreciated that one of the inputs of FIG. 11(C) corresponds to the output of FIG. 11(D). And vice versa, it should be appreciated that one of the inputs of FIG. 11(D) correspond to the output of FIG. 11(C). Accordingly, the optimization calculations can be run in either direction as desired, needed or required. This allows the user to either take the performance parameters and transform those parameters into a heat transfer design; or conversely, evaluate a proposed (or actual) design of a heat transfer device and determine its performance characteristics. Moreover, this type optimization interchangeability (between input and output) may be applied to the approach associated with the embodiment(s) exemplified in FIG. 11(A).

In addition to or instead of displaying the characteristics or similar, it should be appreciated the characteristics or similar may be provided to an output device (1180), wherein the output device may include storage, memory, or network, as well as a display (or print out).

FIG. 12 illustrates the experimental setup and results that verify the accuracy of the computer implemented method 1100. FIG. 12(A) schematically illustrates a perspective view of the experimental setup 70 and FIG. 12(B) provides an enlarged partial side view of FIG. 12(A). The experimental setup 70 includes two channel walls 72 separated by a distance to form liquid channel 73, positioned between a heat sources 12, and filled with a working fluid (pentane) 5. A thermocouple 74 was attached to one of the channel walls 72 to measure the change in wall temperature due to evaporative cooling. Because heat flux cannot be measured directly, the transient wall-temperature distribution is used to verify the performance of the above mathematical model, which is then used to provide the heat flux. Initially, the channel 73 was filled with the working fluid 5. The thermocouple 74 was positioned below the meniscus 3 formed by the fluid 5. As heat was supplied by the heat sources 12 the working fluid 5 level dropped, at a measurable rate equal to $c_m$, within the channel 73 due to evaporation. As the meniscus 3 passed the thermocouple 74 the temperature of the channel wall 72 changed in proportion to the cooling effect produced by the three regions of the meniscus 3. This temperature change was recorded and used in conjunction with $c_m$ to calculate the heat flux across the thin-film profile.

Figure 12A:
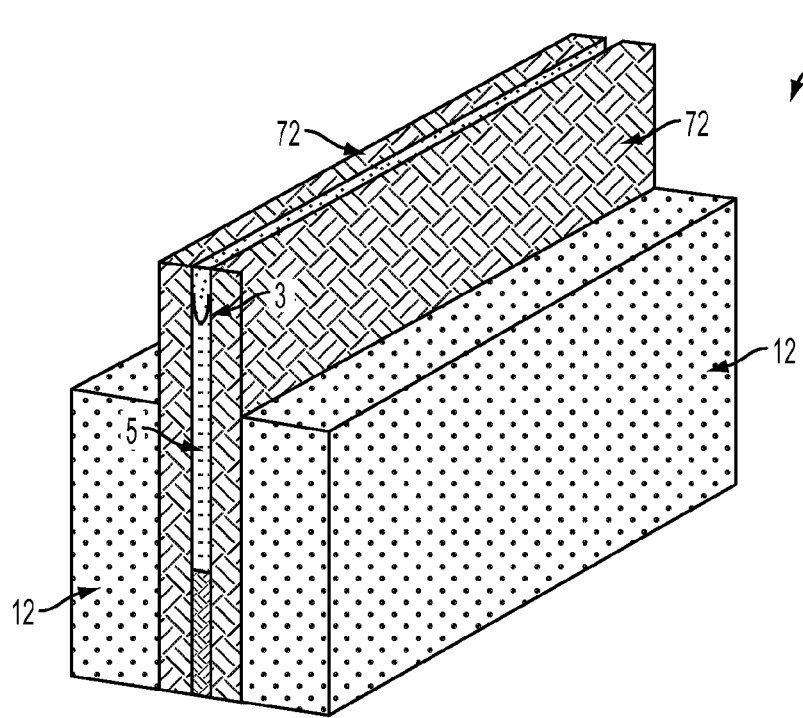
FIG. 12 illustrates the experimental setup and results that verify the accuracy of an embodiment of the computer implemented method.
Figure 12B:
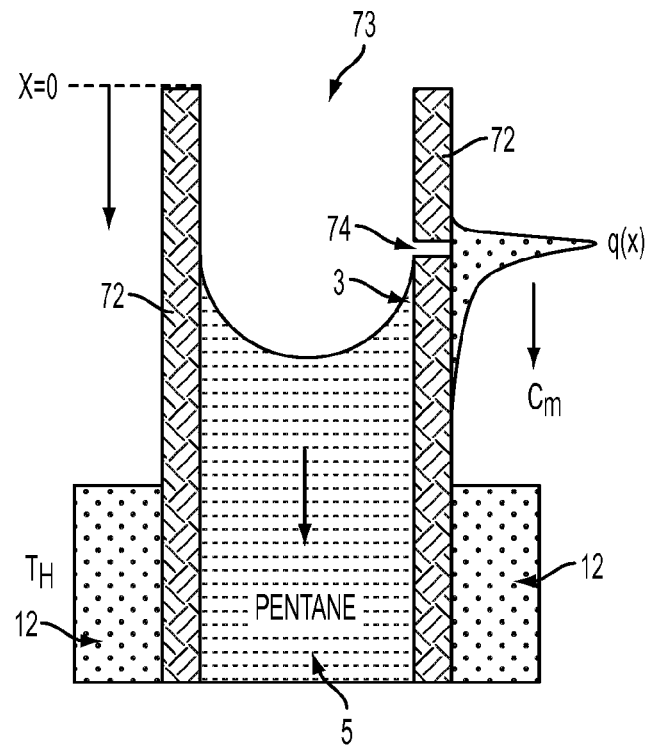
Figure 12C:
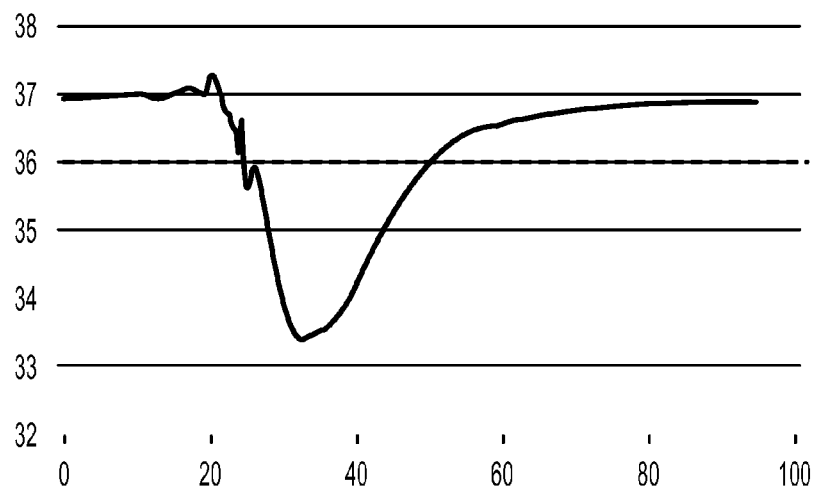
Figure 12D:
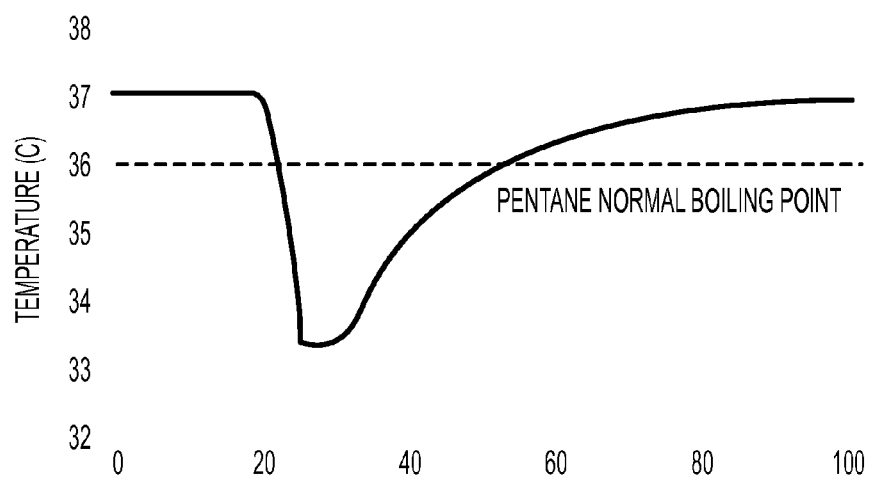

FIG. 12(C) graphically illustrates the experimental results for the temperature across the meniscus' thin-film from the setup performed in FIGS. 12(A) and 12(B). FIG. 12(D) graphically illustrates analytical results produced using method 1100 of an identical setup. As shown, the experimental results verified the analytical results in both the shape of the temperature curve produced and the magnitude temperature curve produced. These results are in stark contrast with conventional techniques for evaluating the heat transfer of a thin-film. (See e.g. H. Wang, S. V. Garimella, and J. Y. Murthy. Characteristics of an evaporating thin film in a microchannel. International Journal of Heat and Mass Transfer, 50(19-20):3933-3942, 2007. H. Wang, S. V. Garimella, and J. Y. Murthy and An analytical solution for the total heat transfer in the thin-film region of an evaporating meniscus. International Journal of Heat and Mass Transfer, 51(25-26): 6317-6322, 2008; of which are hereby incorporated by reference herein in their entirety, but are not admitted to be prior art with respect to the present invention by inclusion in this section) Thus, the method 1100 described above provides advantages over conventional techniques for evaluating thin-film evaporator performance in that the method 1100 will produce an accurate solution for any combination of channel (i.e., passage), such as having, for example a width of 1 micron or greater and any superheat of 1 K or less.

Figure 13:
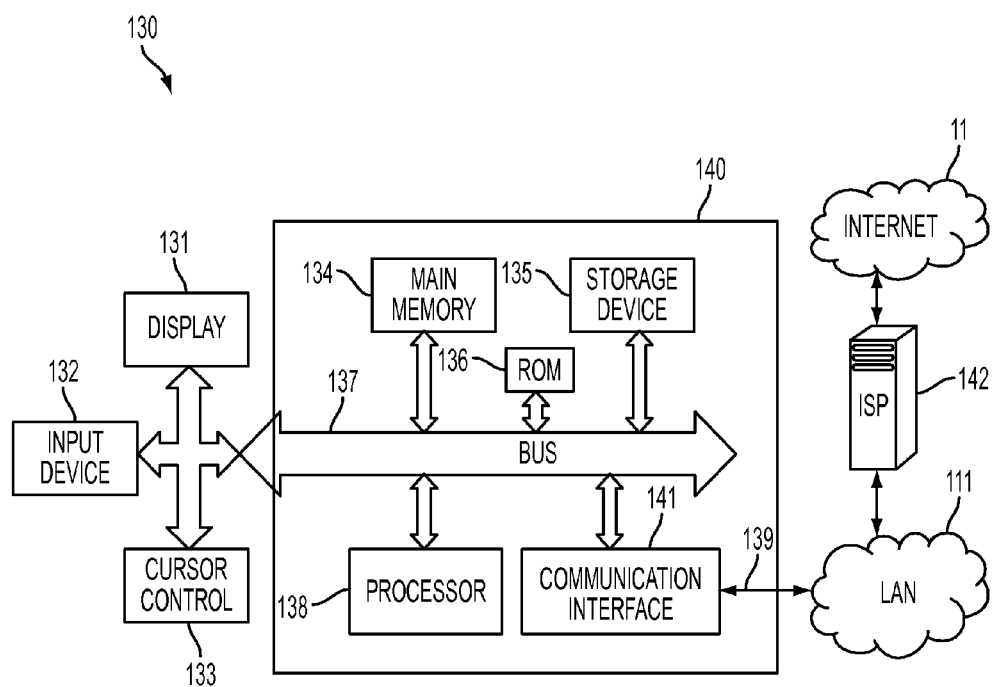
FIG. 13 schematically depicts a block diagram for a system or related method of an embodiment of the present invention in whole or in part.

FIG. 13 is a block diagram that illustrates a system 130 including a computer system 140 and the associated Internet 11 connection upon which an embodiment may be implemented. Such configuration is typically used for computers (hosts) connected to the Internet 11 and executing a server or a client (or a combination) software. A source computer such as laptop, an ultimate destination computer and relay servers, for example, as well as any computer or processor described herein, may use the computer system configuration and the Internet connection shown in FIG. 13. The system 140 may be used as a portable electronic device such as a notebook/laptop computer, a media player (e.g., MP3 based or video player), a cellular phone, a Personal Digital Assistant (PDA), an image processing device (e.g., a digital camera or video recorder), and/or any other handheld computing devices, or a combination of any of these devices. Note that while FIG. 13 illustrates various components of a computer system, it is not intended to represent any particular architecture or manner of interconnecting the components; as such details are not germane to the present invention. It will also be appreciated that network computers, handheld computers, cell phones and other data processing systems that have fewer components or perhaps more components may also be used. The computer system of FIG. 13 may, for example, be an Apple Macintosh computer or Power Book, or an IBM compatible PC. Computer system 140 may include a bus 137, an interconnect, or other communication mechanism for communicating information, and a processor 138, commonly in the form of an integrated circuit, coupled with bus 137 for processing information and for executing the computer executable instructions. Computer system 140 also includes a main memory 134, such as a Random Access Memory (RAM) or other dynamic storage device, coupled to bus 137 for storing information and instructions to be executed by processor 138.

Main memory 134 also may be used for storing temporary variables or other intermediate information during execution of instructions to be executed by processor 138. Computer system 140 further includes a Read Only Memory (ROM) 136, other non-volatile memory, or other static storage device coupled to bus 137 for storing static information and instructions for processor 138. A storage device 135 may be coupled to the bus 137 for storing information and instructions. The storage device 135 may include a magnetic disk or optical disk, a hard disk drive for reading from and writing to a hard disk, a magnetic disk drive for reading from and writing to a magnetic disk, and/or an optical disk drive (such as DVD) for reading from and writing to a removable optical disk. The hard disk drive, magnetic disk drive, and optical disk drive may be connected to the system bus by a hard disk drive interface, a magnetic disk drive interface, and an optical disk drive interface, respectively. The drives and their associated computer-readable media provide non-volatile storage of computer readable instructions, data structures, program modules and other data for the general purpose computing devices. Typically computer system 140 includes an Operating System (OS) stored in a non-volatile storage for managing the computer resources and provides the applications and programs with an access to the computer resources and interfaces. An operating system commonly processes system data and user input, and responds by allocating and managing tasks and internal system resources, such as controlling and allocating memory, prioritizing system requests, controlling input and output devices, facilitating networking and managing files. Non-limiting examples of operating systems are Microsoft Windows, Mac OS X, and Linux.

The term "processor" is meant to include any integrated circuit or other electronic device (or collection of devices) capable of performing an operation on at least one instruction including, without limitation, Reduced Instruction Set Core (RISC) processors, CISC microprocessors, Microcontroller Units (MCUs), CISC-based Central Processing Units (CPUs), and Digital Signal Processors (DSPs). The hardware of such devices may be integrated onto a single substrate (e.g., silicon "die"), or distributed among two or more substrates. Furthermore, various functional aspects of the processor may be implemented solely as software or firmware associated with the processor.

Computer system 140 may be coupled via bus 137 to a display 131, such as a Cathode Ray Tube (CRT), a Liquid Crystal Display (LCD), a flat screen monitor, a touch screen monitor or similar means for displaying text and graphical data to a user. The display may be connected via a video adapter for supporting the display. The display allows a user to view, enter, and/or edit information that is relevant to the operation of the system. An input device 132, including alphanumeric and other keys, may be coupled to bus 137 for communicating information and command selections to processor 138. Another type of user input device is cursor control 133, such as a mouse, a trackball, or cursor direction keys for communicating direction information and command selections to processor 138 and for controlling cursor movement on display 131. This input device typically has two degrees of freedom in two axes, a first axis (e.g., x) and a second axis (e.g., y), that allows the device to specify positions in a plane.

The computer system 140 may be used for implementing the methods and techniques described herein. According to one embodiment, those methods and techniques are performed by computer system 140 in response to processor 138 executing one or more sequences of one or more instructions contained in main memory 134. Such instructions may be read into main memory 134 from another computer-readable medium, such as storage device 135. Execution of the sequences of instructions contained in main memory 134 causes processor 138 to perform the process steps described herein. In alternative embodiments, hard-wired circuitry may be used in place of or in combination with software instructions to implement the arrangement. Thus, embodiments of the invention are not limited to any specific combination of hardware circuitry and software.

The term "computer-readable medium" (or "machine-readable medium") as used herein is an extensible term that refers to any medium or any memory, that participates in providing instructions to a processor, (such as processor 138) for execution, or any mechanism for storing or transmitting information in a form readable by a machine (e.g., a computer). Such a medium may store computer-executable instructions to be executed by a processing element and/or control logic, and data which is manipulated by a processing element and/or control logic, and may take many forms, including but not limited to, non-volatile medium, volatile medium, and transmission medium. Transmission media includes coaxial cables, copper wire and fiber optics, including the wires that comprise bus 137. Transmission media can also take the form of acoustic or light waves, such as those generated during radio wave and infrared data communications, or other form of propagated signals (e.g., carrier waves, infrared signals, digital signals, etc.). Common forms of computer-readable media include, for example, a floppy disk, a flexible disk, hard disk, magnetic tape, or any other magnetic medium, a CD-ROM, any other optical medium, punch-cards, paper-tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer-readable media may be involved in carrying one or more sequences of one or more instructions to processor 138 for execution. For example, the instructions may initially be carried on a magnetic disk of a remote computer. The remote computer can load the instructions into its dynamic memory and send the instructions over a telephone line using a modem. A modem local to computer system 140 can receive the data on the telephone line and use an infra-red transmitter to convert the data to an infra-red signal. An infra-red detector may receive the data carried in the infra-red signal and appropriate circuitry can place the data on bus 137. Bus 137 carries the data to main memory 134, from which processor 138 retrieves and executes the instructions. The instructions received by main memory 134 may optionally be stored on storage device 135 either before or after execution by processor 138.

Computer system 140 also may include a communication interface 141 coupled to bus 137. Communication interface 141 provides a two-way data communication coupling to a network link 139 that is connected to a local network 111. For example, communication interface 141 may be an Integrated Services Digital Network (ISDN) card or a modem to provide a data communication connection to a corresponding type of telephone line. As another non-limiting example, communication interface 141 may be a local area network (LAN) card to provide a data communication connection to a compatible LAN. For example, Ethernet based connection based on IEEE802.3 standard may be used such as 10/100BaseT, 1000BaseT (gigabit Ethernet), 10 gigabit Ethernet (10 GE or 10 GbE or 10 GigE per IEEE Std 802.3ae-2002 as standard), 40 Gigabit Ethernet (40 GbE), or 100 Gigabit Ethernet (100 GbE as per Ethernet standard IEEE P802.3ba), as described in Cisco Systems, Inc. Publication number 1-587005-001-3 (June 1999), "Internetworking Technologies Handbook", Chapter 7: "Ethernet Technologies", pages 7-1 to 7-38, which is incorporated in its entirety for all purposes as if fully set forth herein. In such a case, the communication interface 141 typically include a LAN transceiver or a modem, such as Standard Microsystems Corporation (SMSC) LAN91C111 10/100 Ethernet transceiver described in the Standard Microsystems Corporation (SMSC) data-sheet "LAN91C111 10/100 Non-PCI Ethernet Single Chip MAC+PHY" Data-Sheet, Rev. 15 (Feb. 20, 2004), which is incorporated in its entirety for all purposes as if fully set forth herein.

Wireless links may also be implemented. In any such implementation, communication interface 141 sends and receives electrical, electromagnetic or optical signals that carry digital data streams representing various types of information.

Network link 139 typically provides data communication through one or more networks to other data devices. For example, network link 139 may provide a connection through local network 111 to a host computer or to data equipment operated by an Internet Service Provider (ISP) 142. ISP 142 in turn provides data communication services through the world wide packet data communication network Internet 11. Local network 111 and Internet 11 both use electrical, electromagnetic or optical signals that carry digital data streams. The signals through the various networks and the signals on the network link 139 and through the communication interface 141, which carry the digital data to and from computer system 140, are exemplary forms of carrier waves transporting the information.

The processor 138 may execute received code as it is received, and/or stored in storage device 135, or other non-volatile storage for later execution. In this manner, computer system 140 may obtain application code in the form of a carrier wave.

The concept of determining performance characteristics (e.g., heat transfer characteristics) of a thin-film evaporator may be implemented and utilized with the related processors, networks, computer systems, internet, modules, and components and functions according to the schemes disclosed herein.

Figure 14:
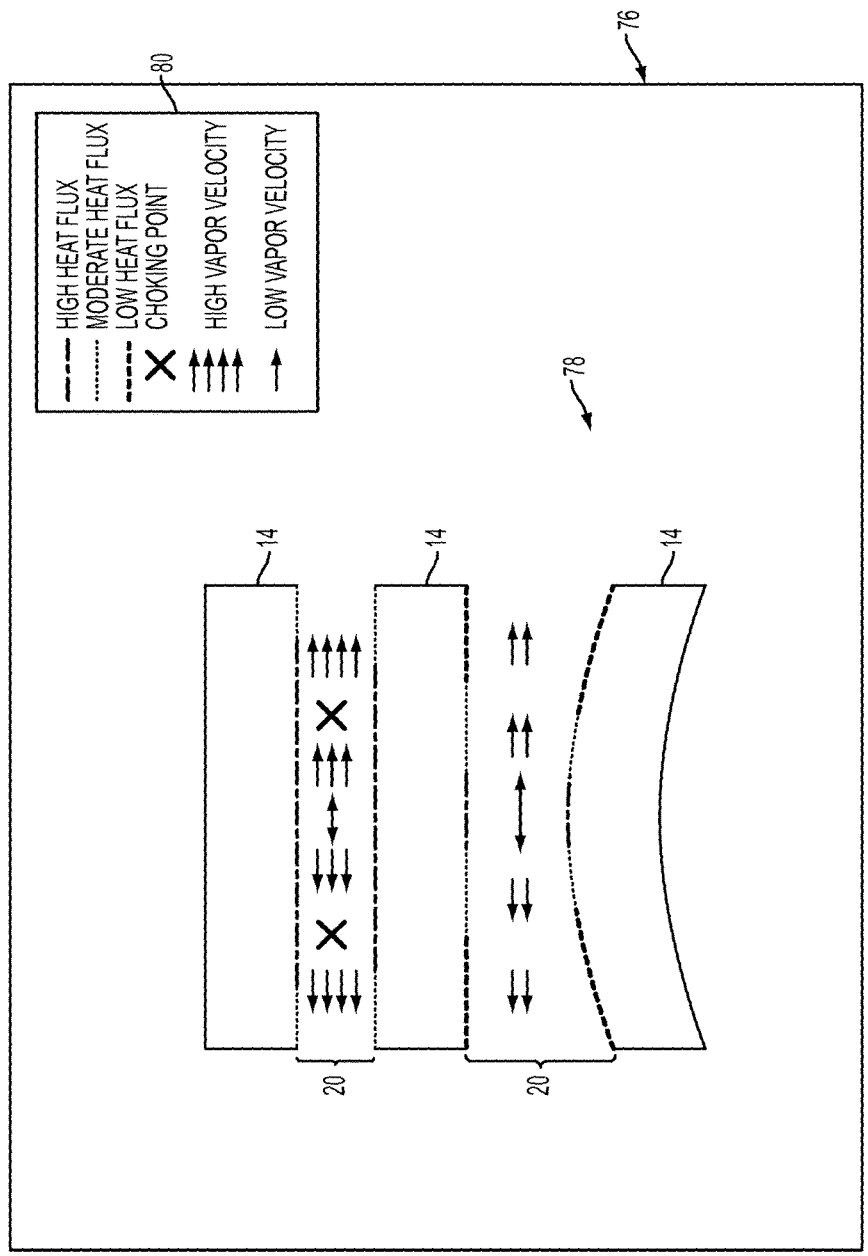
FIG. 14 illustrates an exemplary graphical display which may be used to present the heat transfer device's estimated performance characteristics.

FIG. 14 illustrates an exemplary graphical display 76 which may be used to present the heat transfer device's estimated performance characteristics in some embodiments of the invention. For example, the graphical display 76 (e.g., screenshot or printout) may include a graphical representation 78 of the heat transfer device, which the graphical representation 78 may, in some instances, be a representation of a graphical image (e.g., CAD drawing) received during step (1110) of method (1100); or, in the event that no graphical image is received, the graphical representation 78 may be generated by the computing device based on other heat transfer device characteristics received during step (1110). Performance characteristics may then be illustrated on the graphical representation 78 by use of various icons, shading, coloring, or hatching, for example. Additionally, a key 80 may be provided to aid a user in interpreting the icons, shading, coloring, or hatching. The exemplary graphical display 76 illustrates a graphical representation 78 including three elongated members 14 having respective vapor passages (i.e. channel) 20 generated with the use of shading to represent various ranges of evaporative mass flux (or heat flux) along the length of elongated members 14 (i.e., evaporator walls), and the use of icons (e.g. arrows and X's) to represent vapor velocity (or vapor flow rate) and possible vapor choking points within the vapor passages 20 (i.e., evaporator channels). In this particular illustration, the key provides a dot-dash shading for the high heat flux, a dot-large shading for low heat flux, and a dot-small shading for the moderate heat flux. Moreover, the key provides four arrows that represent high vapor velocity and one arrow that represent low vapor velocity. And wherein two or three arrows represent a gradation there between. It should be appreciated that additional performance characteristics may be displayed on similar graphical representations.

As discussed herein, an advantage associated with an embodiment of the present invention heat transfer device (or portions thereof) includes, but is not limited thereto, increased cooling capacity per unit area, controlled and optimized evaporation, prevention or reduction of volumetric boiling, and prevention or reduction of dry-out. For example, an embodiment of the heat transfer device may be used in high heat flux applications, such as, but not limited thereto, the following 1) electronic cooling, 2) hypersonic vehicle or crafts, 3) renewable energy systems or 4) energy recovery.

Figure 15A:
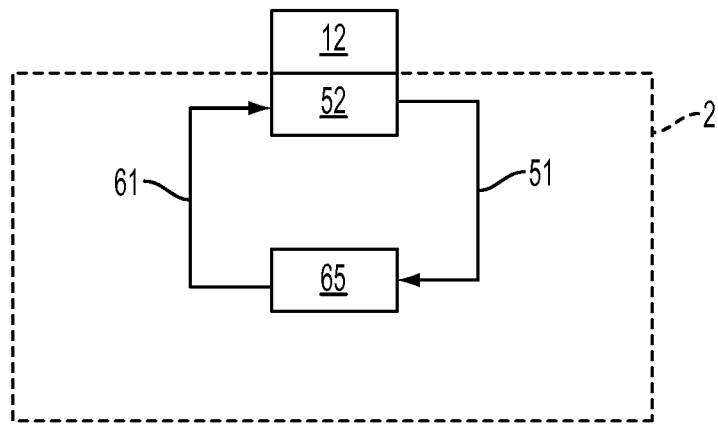
FIGS. 15(A) and 15(B) schematically illustrate embodiments of the heat transfer device implemented with a heat source or an electronic device or system, respectively.
Figure 15B:
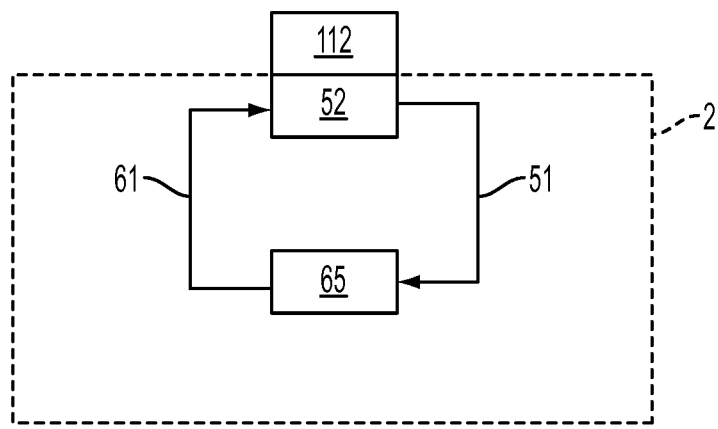

Electronic Cooling:

For example, regarding electronic cooling, heat fluxes of the order of 1 MW/m$^2$ or more need to be extracted from the high end computer processors and other semiconductor devices in particular applications. An aspect of an embodiment of the present invention heat transfer device conservatively provides the cooling capacity required for the steady and safe operation of high end computer processors and other semiconductor devices in particular applications. An aspect of an embodiment of the present invention heat transfer device provides the cooling technology that may be integrated into the structure of the electronic chips (such as computer processors and other semiconductor devices) to provide more effective cooling by targeting hotspots. Thermal management of 3D stacked electronic chips is another application of an aspect of an embodiment of the present invention cooling technology design. FIG. 15(A) schematically illustrate an embodiments of the present heat transfer device 2 implemented with a heat source 12. Also provided in the heat transfer device 2 is at least one evaporator 52 that is in communication by way of at least one vapor outlet 51 with at least one condenser 65 that is in communication by way of at least one liquid inlet 61 with the evaporator 52. For instance, as a non-limiting example, FIG. 15(B) schematically illustrate an embodiment of the present heat transfer device 2 implemented with an electronic device or system 112 that is responsible for the origin of generating the heat—thereby defining a heat source. Also provided in the heat transfer device 2 is at least one evaporator 52 that is in communication by way of at least one vapor outlet 51 with at least one condenser 65 that is in communication by way of at least one liquid inlet 61 with the evaporator 52.

Some exemplary and non-limiting devices and systems used for electronic cooling and therefore practiced as an embodiment of the present invention may include, but not limited thereto, the following: computer chip, semiconductor device, integrated circuit device, or high performance computing system (and other computing systems), or radio frequency (RF) system; as well as any other surface or volumetric heat dissipation device or system as desired, needed or required.

Hypersonic Vehicles or Crafts:

For example, regarding hypersonic vehicles or crafts, temperature control is a major consideration in design of supersonic and hypersonic vehicles or crafts. The leading edges are exposed to large heat fluxes due to interaction of the structure of the vehicle or craft with air molecules. An aspect of an embodiment of the present invention heat transfer device provides a cooling system that may be integrated into the structure of the vehicle or craft which are exposed to high temperatures. For instance, as a non-limiting example, FIG. 16 schematically illustrates an embodiment of the heat transfer device 2 implemented with a component of a craft 91 such as the following: aircraft, spacecraft, satellite, landcraft, or watercraft. The component 91 may be for example a wing or nose of the craft, or any other area, section, component, or part of the craft as desired, needed, or required. The hypersonic flow creates the heat, Q, (i.e., heat source) upon the component 91. Also provided in the heat transfer device 2 is at least one evaporator 52 that is in communication by way of at least one vapor outlet 51 with at least one condenser 65 that is in communication by way of at least one liquid inlet 61 with the evaporator 52. As a non-limiting example, liquid metal or molten metal may be implemented as the working fluid.

Figure 17:
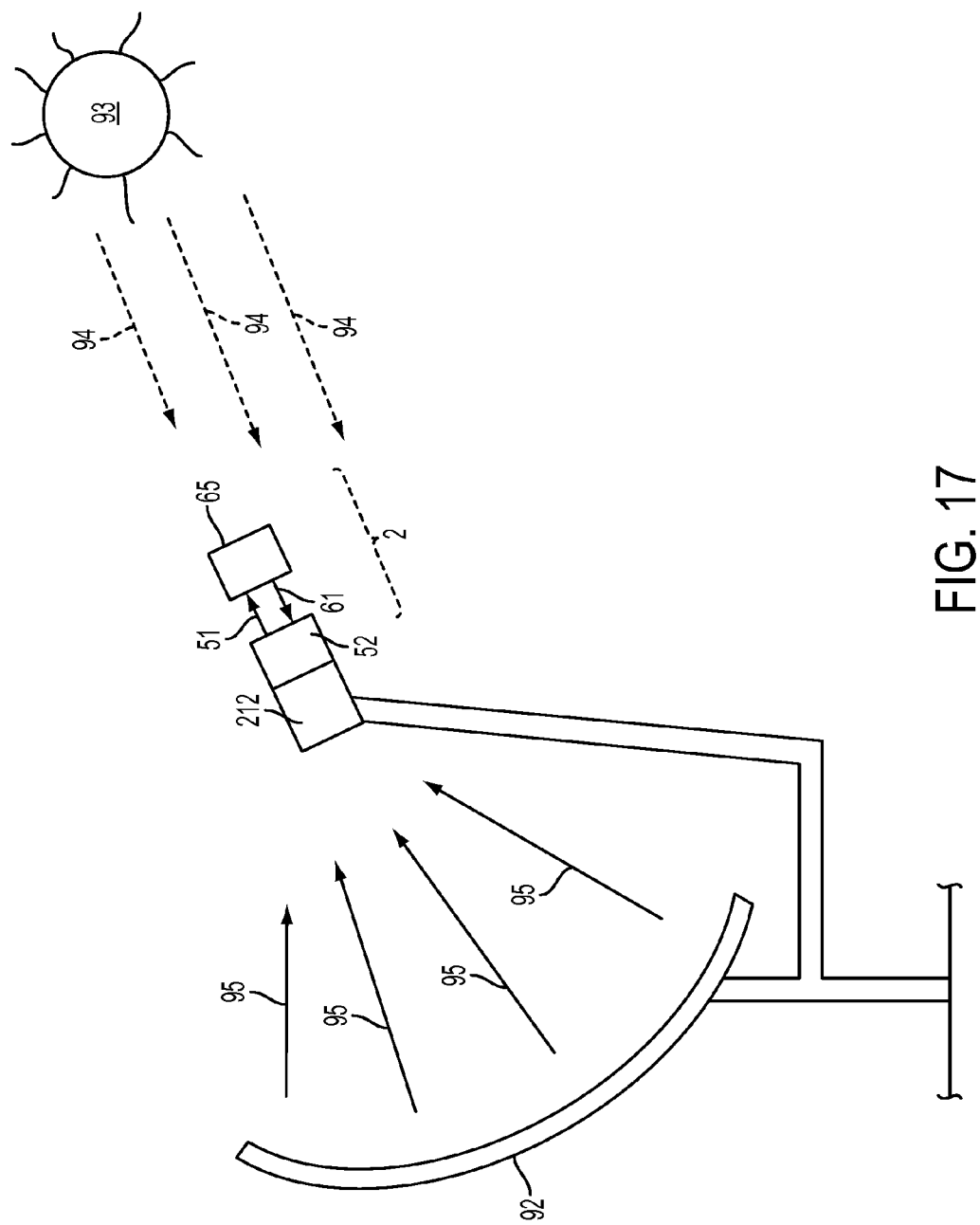
FIG. 17 schematically illustrates an embodiment of the heat transfer device implemented with a photo-voltaic cell or system.

Renewable Energy Systems:

For example, cooling of photovoltaic cells is one of the main challenges in solar energy industry. Overheating may cause efficiency loss and permanent degradation of the solar cells. Thermal management of densely packed solar cells exposed to high solar concentrations can only be realized using cooling systems with extremely low thermal resistance. An aspect of an embodiment of the present invention provides a heat transfer device that may be used to dissipate the heat and prevent the solar cells to be exposed to high temperatures. For instance, as a non-limiting example, FIG. 17 schematically illustrates an embodiment of the heat transfer device 2 implemented with a component of a photo-voltaic cell system or device 212. Heat is generated by the sun 93 that transmits rays 94 to the reflector or concentrator 92, which in turn are reflected as reflected rays 95 that are then transmitted to and received by the photo-voltaic cell system or device 212. Also provided in the heat transfer device 2 is at least one evaporator 52 that is in communication by way of at least one vapor outlet 51 with at least one condenser 65 that is in communication by way of at least one liquid inlet 61 with the evaporator 52.

Some exemplary and non-limiting devices and systems used for renewable energy systems and therefore practiced as an embodiment of the present invention may include, but not limited thereto, the following: solar cells, parabolic solar collector, photovoltaic or concentrated photovoltaic system; as well as any other surface or volumetric heat dissipation device or system as desired, needed or required.

Figure 18A:
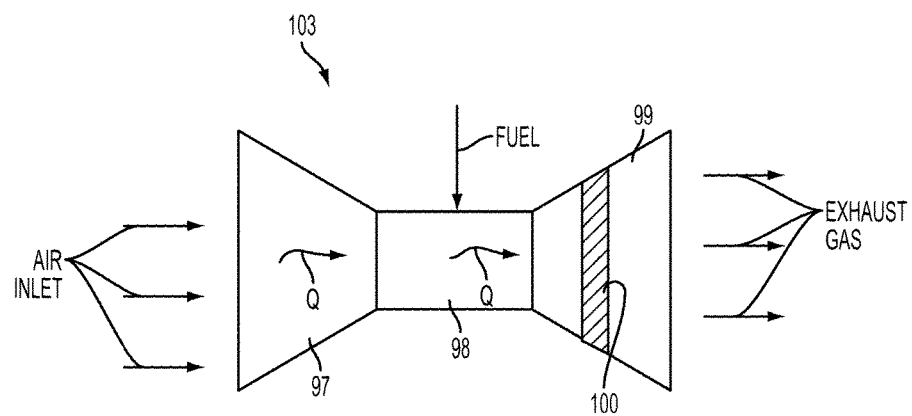
FIG. 18(A) schematically illustrates a turbine generator and FIG. 18(B) schematically illustrates a row of turbine blades identified in FIG. 18(A).
Figure 18B:
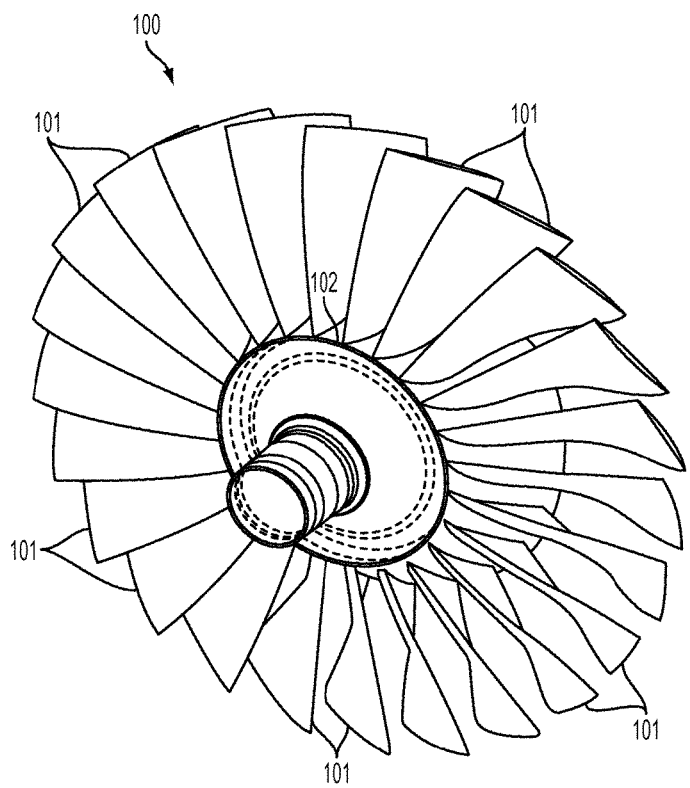
FIG. 18(C) schematically illustrates an embodiment of the heat transfer device implemented with a turbine blade from the row of blades.
Figure 18C:
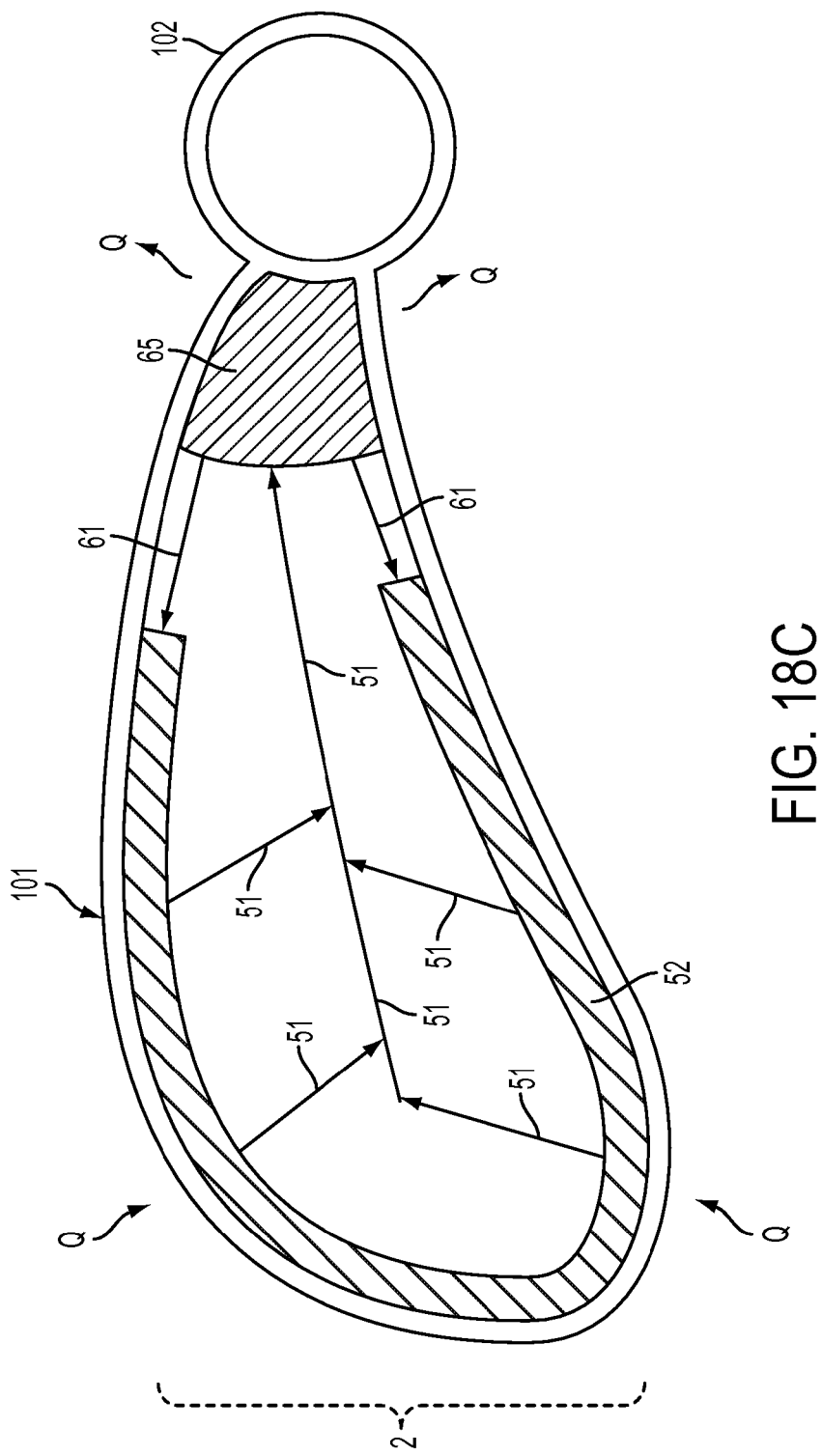

Energy Conversion and Propulsion Systems:

For example, gas turbines are widely used in energy conversion systems, power plants, and jet engines. The effective cooling of turbine blades is critical to improve the efficiency and increase the power output due to thermodynamic considerations. An aspect of an embodiment of the present invention heat transfer device provides a cooling system that may be embedded inside or disposed within (or in communication with) the structure of the blades to prevent overheating and structural damage considering the limited space inside the blades as well as high fluxes of thermal energy. For instance, as a non-limiting example, FIG. 18(A) schematically illustrates a turbine generator 103 and FIG. 18(B) schematically illustrates a row of turbine blades 100 identified in FIG. 18(A), which are disposed on a turbine shaft 102. FIG. 18(C) schematically illustrates an embodiment of the heat transfer device 2 implemented with a turbine blade 101 from the row blades 100. Referring to FIG. 18(A), during operation after air passes through the air inlet of the compressor 97 causing the air to be heated (i.e., creates heat, Q) and then fuel is mixed with the compressed air in the combustion chamber 98 thereby providing yet additional heat (i.e., creates heat, Q) so as to define a heat source. The hot air from the combustion chamber 98 is in communication with the at least one blade 100 as it pass through the turbine section 99 to provide the exhaust gas. FIG. 18(B) provides an enlarged detail view of a row of turbine blades 100 identified in FIG. 18(A). FIG. 18(C) provides an enlarged detail view of a turbine blade 101 identified in FIG. 18(B). Also provided in the heat transfer device 2 is at least one evaporator 52 that is in communication by way of at least one vapor outlet 51 with at least one condenser 65 that is in communication by way of at least one liquid inlet 61 with the evaporator 52.

Energy Recovery Potential:

An aspect of an embodiment of the present invention heat transfer device provides a cooling system, whereby the quality of the thermal energy removed from the heat source is preserved since the evaporation is essentially taking place at the temperature source. This will enable the heat transfer device of the cooling system to be integrated into an energy recovery unit to convert a fraction of the thermal energy to work/electricity. In large scales applications such as datacenters this could results in large savings and reduce the environmental impact of the operation of these facilities. For instance, as a non-limiting example, FIG. 8 schematically illustrates an embodiment of the heat transfer device 2 implemented with an evaporator 52, condenser 65, and an energy recovery unit 82. As heat is removed from the heat source 12 (such as the electronic system or the like), a portion of it may be recovered in the energy recovery unit 82 as recovered energy 84 and turned into useful work through the use of a thermal engine before the remainder is transferred to a cold reservoir 86. As an example, a thermoelectric device may be utilized as a type of an energy recovery unit 82. The origin of the heat source 12 may be the electronic systems or devices present in a data center, for example.

Figure 15C:
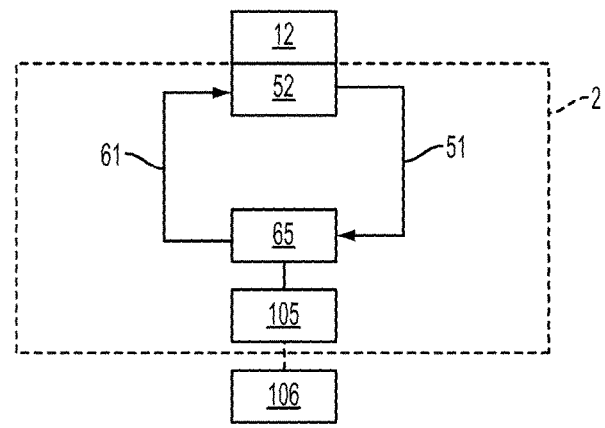
FIGS. 15(C)-15(E) schematically illustrate embodiments of the heat transfer device implemented with a heat exchanger device, as an open system, and a jet blast deflector system, respectively.

Thermal Management System:

For example, regarding thermal management systems, FIG. 15(C) schematically illustrate an embodiment of the present invention heat transfer device 2 implemented with a heat source 12. Also provided in the heat transfer device 2 is at least one evaporator 52 that is in communication by way of at least one vapor outlet 51 with at least one condenser 65 that is in communication by way of at least one liquid inlet 61 with the evaporator 52. An embodiment of the present may include a heat exchanger device or system 105 for a variety of uses that may be implemented with, in, on or adjacent to (or any combination thereof) the intended structure, surface, or component 106. For example, the heat exchanger device or system 105 may be any one of the following: boiler system or device, radiator system or device, pipe/conduit heating system or device, and air conditioner system or device. For example, the heat exchanger device or system 105 may be in thermal communication with any of the following structure, surface, or component (not specifically illustrated) to achieve its intended use with such intended structure, surface, or component 106: floor, wall, ceiling, beam, truss, or other structural surface of a container, electronic housing (i.e., of the type in the environment, application or use), machinery housing, tank, pool, swimming pool, reservoir (i.e., of the type in the environment, application or use), vehicle, ship, trailer, aircraft, watercraft, or spacecraft. These structures, surfaces or components may or may not be load bearing. For non-limiting examples of heat exchanger systems and applications see for example the following references: U.S. patent application Ser. No. 13/522,264, Wadley, et al., entitled "Multifunctional Thermal Management System and Related Method" filed Jul. 13, 2012; international Patent Application Serial No. PCT/US2011/021121, Wadley, et al., entitled "Multifunctional Thermal Management System and Related Method" filed Jan. 13, 2011; of which are hereby incorporated by reference herein in their entirety, but are not admitted to be prior art with respect to the present invention by inclusion herein. Some uses of a heat exchanger device or system 105 may include the following: heating water for hospitals or other commercial or residential dwellings; or air conditioner systems. It should be appreciated that the heating source 12 could be from heating a system capturing and utilizing solar energy or wind energy, system capturing and utilizing energy produced from fossil fuels (e.g., gas, coal or oil), or system capturing and utilizing a fire source—as well as any other available thermal related source, device or system.

Figure 15D:
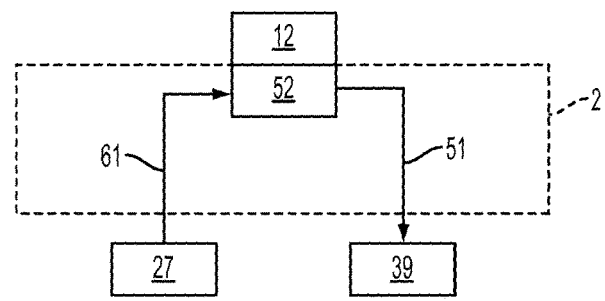

Open System:

FIG. 15(D) schematically illustrates an embodiment of the present invention heat transfer device 2 implemented with a heat source 12 represented in an open type system. Also provided in the heat transfer device 2 is at least one evaporator 52 that is in communication by way of at least one vapor outlet 51 with at least one vapor destination 39. At least one fluid source 27 is provided that is in communication by way of at least one liquid inlet 61 with the evaporator 52. It should be appreciated that a condenser may be optionally added to the overall system as well. Moreover, multiple evaporators, multiple condensers, multiple fluid sources, and multiple vapor destinations may be linked accordingly to achieve an overall system as desired or required.

Figure 15E:
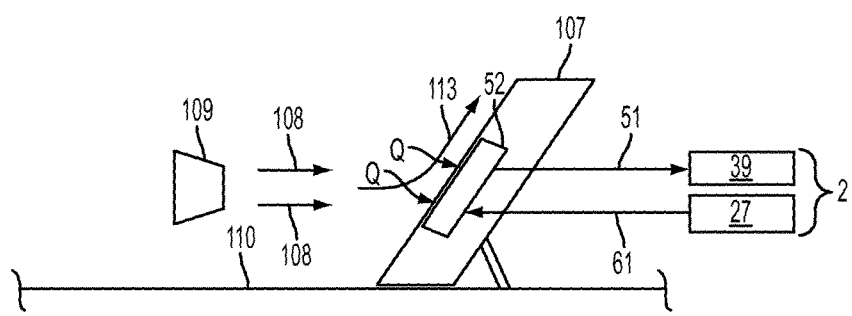

Jet Blast Deflector (JBD) System:

For example, a jet blast deflection system is widely used on air craft carriers and other take off areas. Referring to FIG. 15(E), during operation a jet aircraft 109 ejects a jet plume 108 (i.e., creates heat, Q) that hits the jet blast deflector system 107 and the plume is deflected 111. FIG. 15(E) schematically illustrates an embodiment of the heat transfer device 2 having at least one evaporator 52 that is implemented with the jet blast deflector system 107. The evaporator 52 may be in communication by way of at least one vapor outlet 51 with at least one vapor destination 39. A fluid source 27 is provided that is in communication by way of at least one liquid inlet 61 with the evaporator 52. In this application, the liquid inlet 61 may be in communication with a fluid source such as a water supply or filtered water supply (while sea water may be a possible choice it may lead to complications). In this application the vapor destination 39 may simply be open air, or may be a container, housing or the like. This approach, for example, may be more representative of a transient type heat source as opposed to a steady state type heat source. It should be appreciated that a condenser may be optionally added to the overall system as well. For examples of jet blast deflection systems see for example the following references: U.S. Pat. No. 8,360,361, Wadley, et al., entitled "Method and Apparatus for Jet Blast Deflection", issued Jan. 29, 2013; U.S. patent application Ser. No. 12/301,916, Wadley, et al., entitled "Method and Apparatus for Jet Blast Deflection", filed Oct. 7, 2009; International Patent Application Serial No. PCT/US2007/012268, Wadley, et al., entitled "Method and Apparatus for Jet Blast Deflection", filed May 23, 2007; of which are hereby incorporated by reference herein in their entirety, but are not admitted to be prior art with respect to the present invention by inclusion herein. Although the jet blast deflector 107 is depicted at an angle relative to the horizontal it should be appreciated that it may be a variety of angles including horizontal for jet aircrafts that land and take off vertically relative to the horizontal (e.g., ground, flight deck or tarmac). Moreover, although illustrated as an open system the present system may be implemented as a closed system. Moreover, at least one condenser may be included as part of the system, as well as additional evaporators. As an embodiment, wicking running the length of the Jet blast deflector may be implemented to help aid fluid flow.

Some exemplary and non-limiting devices and systems used for energy recovery systems and therefore practiced as an embodiment of the present invention may include, but not limited thereto, the following: data centers, manufacturing facilities; as well as any other surface or volumetric heat dissipation device or system as desired, needed or required.

Figure 19A:
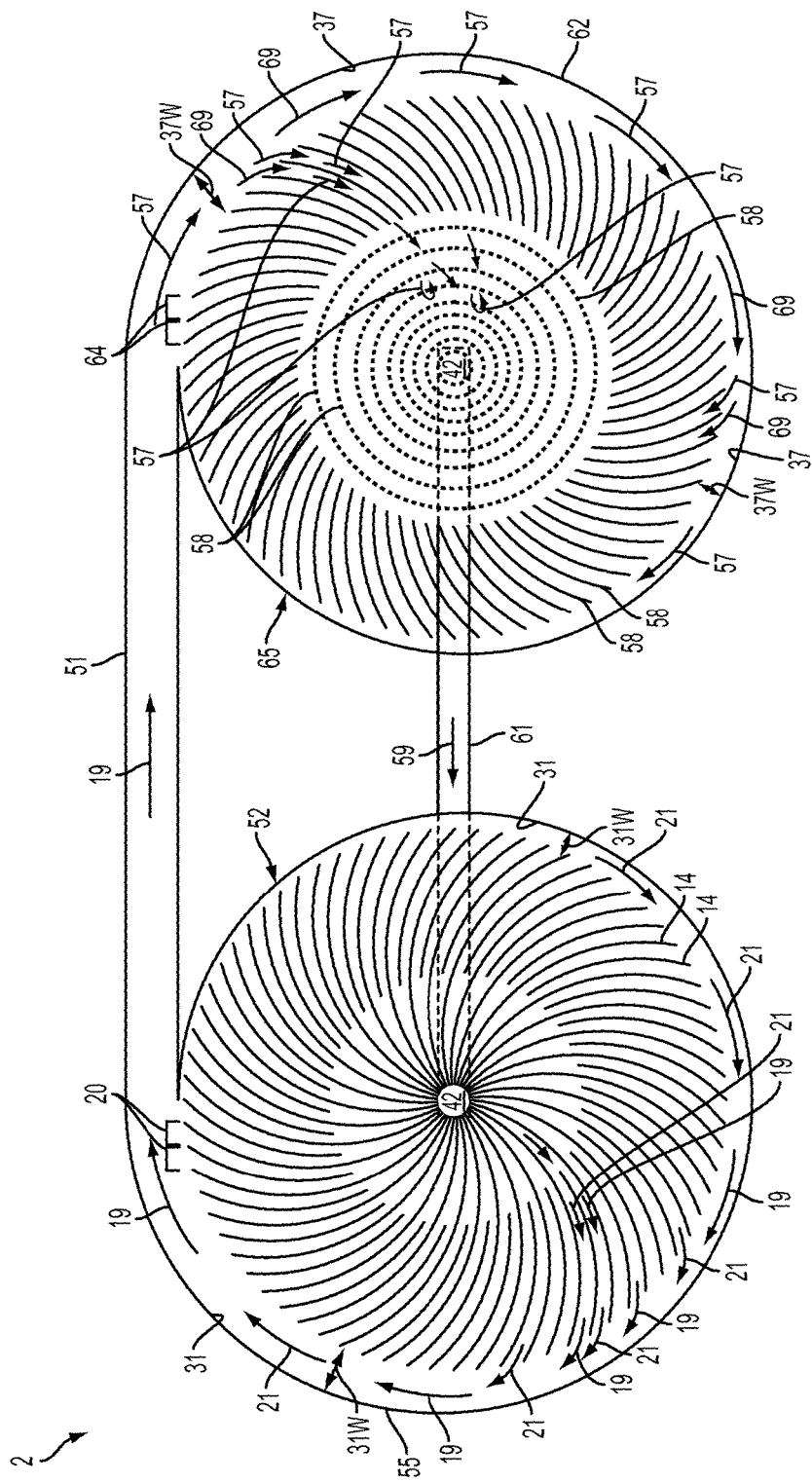
FIGS. 19(A)-(C) schematically illustrate respective embodiments of the heat transfer device that includes a heat transfer system whereby the evaporator utilizes, among other things, a vapor outlet and liquid inlet to communicate with the condenser.

FIG. 19(A) provides a schematic plan view of a representation of an embodiment of the present invention heat transfer device 2, which provides a heat transfer system that utilizes an evaporator 52 and a condenser 65. While not in view in this particular illustration, it should be appreciated that a base member (not shown) is configured to be in communication with a heat source (not shown) that receives conducted heat flow. Elongated members 14 extend from the base member (not shown) and are configured to be immersed (inserted) into a working fluid (not shown) contained in a reservoir (not shown). The elongated members 14 of the evaporator are configured to form passages 20 between the elongated members 14. As vapor is produced in the evaporator 52, the vapor travels in vapor pathways 21 through the passages 20 and into at least one vapor outlet 51, which is in communication with the passages 20. A plurality of passages 20 may be provided although they are not specifically referenced due to the limitations of the illustration itself. The vapor outlet 51 is in communication with the passages 64 of the condenser 65, and through the vapor outlet 51 the condenser 65 is able to receive the vapor produced in the evaporator 52. In an embodiment, at least one transition passage 31 may be provided in the evaporator 52 to allow for the flow of the vapor from the passages 20 to the vapor outlet 51. As shown in FIG. 19(A), the transition passage 31 (of the evaporator) includes a channel that is formed between the ends of the elongated members 14 and the wall 55 of the evaporator 52. The width 31W of the transition passage 31 of the evaporator 52 generally widens—moving in the circumferential direction, as well as the direction of the vapor flow 19 that occurs in the direction of the perimeter of the evaporator 52. Accordingly, the transition passage 31 increases in area as it approaches the vapor outlet 51 heading toward the condenser 65 (and/or other destination). The widening characteristic (e.g., area increase) of the transition passage 31 allows for and promotes the orderly accumulation of the vapor in the evaporator 52. The flow rate near the region of the transition passage 31 that is furthest from vapor outlet 51 (i.e., in the circumferential direction or perimeter direction) will be less compared to the flow rate near the region where the accumulated vapor flow passes from the evaporator 52 to the vapor outlet 51 heading toward the condenser 65 (and/or other destination or device). The gradual increase in the width of the transition channel in the perimeter direction and vapor flow 19 direction along the perimeter accounts for the collection of vapor mass. It should be appreciated that there may be one or multiple vapor outlets 51, as well as one or multiple passages 20 and transition passages 31 of the evaporator 52. Any of these passages or outlets may be in communication with one another on a one to one basis—individual connections or interface. Alternatively, any of these passages or outlets may be in communication by connecting or interfacing multiple components together down to a single connection or interface (or reduced number of connections)—and may be repeated and applied as necessary such as to account for the desired flow and operation. Alternatively, the connections may be a combination of both individual connections (interface) and group connections (interface) such as to account for the desired flow and operation. Moreover, similar principles apply to the liquid inlet 61 interfacing with the evaporator 52 (and condenser) and any components thereof to effect the connection and communication, such as to account for the liquid flow (and related vapor flow of the system) and overall operation. As vapor is received from the evaporator 52, the vapor travels in vapor pathways 69 through the passages 64 of the condenser 65. A plurality of passages 64 may be provided although they are not specifically referenced due to the limitations of the illustration itself. While not in view in this particular illustration, the condenser 65 is configured to be in communication with a base (not shown) serving as a cool source, and the vapor supplied to the condenser 65 condenses to form a liquid (not shown), which gathers in the reservoir (not shown) of the condenser 65. Additionally, in this embodiment, the evaporator 52 is supplied with liquid flow 59 produced in the condenser 65 that travels through at least one liquid inlet 61, which is in communication with the reservoir (not shown) of the evaporator 52. Although not shown, it should be appreciated that ancillary or alternative liquid sources may be provided to the evaporator as well. In an embodiment, at least one transition passage 37 may be provided in the condenser to allow for the flow of the vapor from the vapor outlet 51 to the passages 20. As shown in FIG. 19(A), the transition passage 37 (of the condenser) includes a channel that is formed between the ends of the elongated members 58 and the wall 62 of the condenser 65. The width 37W of the transition passage 37 of the condenser generally narrows—moving in the circumferential direction, as well as the direction of the vapor flow 57 that occurs in the direction of the perimeter of the condenser 65. The narrowing feature (referenced as 37W) of the transition passage 37 of the condenser allows for and promotes the orderly dispensation of the vapor in the condenser 65. Accordingly, the transition passage 37 decreases in area as it moves away from the vapor outlet 51 and travels through condenser 65 so as to disburse the vapor in the condenser 65. It should be appreciated that there may be one or multiple vapor outlets 51, as well as one or multiple passages 64 and transition passages 37 of the condenser 65. Any of these passages or outlets may be in communication with one another on a one to one basis—individual connections or interface. Alternatively, any of these passages or outlets may be in communication by connecting or interfacing multiple components together down to a single connection or interface (or reduced number of connections)—and may be repeated and applied as necessary such as to account for the desired flow and operation. Alternatively, the connections may be a combination of both individual connections (interface) and group connections (interface) such as to account for the desired flow and operation. Moreover, similar principles apply to the liquid inlet 61 interfacing with the condenser 65 (and evaporator) and any components thereof to effect the connection and communication, such as to account for the liquid flow (and related vapor flow of the system) and overall operation.

Still referring to FIG. 19(A), the evaporator 52 of the heat transfer device 2 is equipped with passages 20 (e.g., channels) with an arrangement whereby the vapor travels in vapor paths 21 through the passages 20 defined by the elongated members 14 toward the condenser 65. For example, this arrangement is configured to, among other things, collect and guide the vapor flow 19 such that the kinetic energy of the vapor flow 19 can be preserved so as to be used for, but not limited thereto, the following: 1) inducing and enhancing the circulation of the working fluid through the heat transfer device 2 and 2) an energy source, which can be recovered by use an energy recovery unit (not shown). For example, an energy recovery unit is discussed with FIG. 8. This benefit and characteristic is applicable to FIGS. 19(B) and (C), as well as other embodiments discussed herein.

Still referring to FIG. 19(A), the evaporator 52 includes an arrangement of passages 20 that are defined by the elongated members 14 in the outer perimeter having a configuration of spiral-shaped guiding channels. Similarly, the passages 20 are defined by the elongated members 14 in the inner perimeter that include a configuration of spiral-shaped guiding channels that are less densely populated compared to the outer perimeter. Next, the condenser 65 has an arrangement of passages 64 that are defined by the elongated members 58 in the outer perimeter having a configuration of spiral-shaped guiding channels. Additionally, the passages 64 are defined by the elongated members 58 in the inner perimeter that include a configuration of pin type structures. As discussed in FIGS. 5C and 5D, this may be accomplished, for example, by utilizing elongated members 58 fashioned in the form of pins, posts, rods, (or similar structure) or combinations thereof. It may be noted that the vapor flow 57 in the condenser that is shown having a tight curl pattern is intended to reflect the turbulence or vortex of the vapor flow 57 created by the arrangement of the elongated members 58. The turbulence and vortex of the vapor flow 57 may be present, for example, when the vapor velocity is high enough. However, with lower vapor velocity the turbulence and vortex may be absent. It should be appreciated that as the vapor travels through the condenser 65 the vapor gradually changes phase to a liquid, and as a result a mixture of the two phases may be present as well.

Figure 19B:
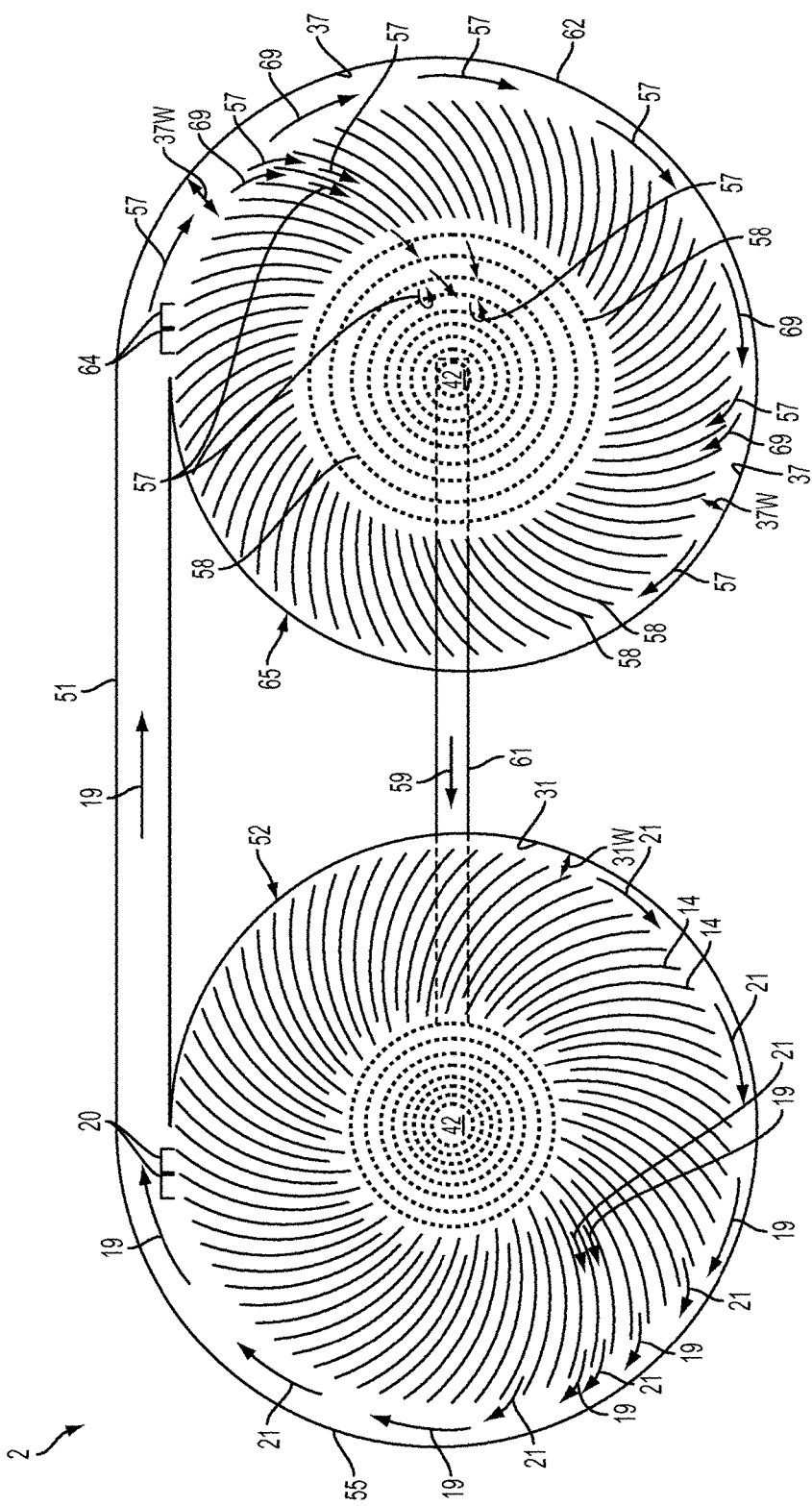

Next, turning to FIG. 19(B), FIG. 19(B) provides a schematic plan view of a representation of an embodiment of the present invention heat transfer device 2, which provides a heat transfer system that utilizes an evaporator 52 and a condenser 65. The heat transfer device shown in FIG. 19(B) is similar to the heat transfer device shown in FIG. 19(A) except for alternative design of the passages 20 as defined by the elongated members 14 present in the evaporator 52. In this embodiment, the evaporator 52 includes an arrangement of passages 20 that are defined by the elongated members 14 in the outer perimeter having a configuration of spiral-shaped guiding channels. Additionally, the evaporator 52 includes passages 20 defined by the elongated members 14 in the inner perimeter that include a configuration of pin type structures. As discussed in FIGS. 5C and 5D, this may be accomplished, for example, by utilizing elongated members 58 fashioned in the form of pins, posts, rods, (or similar structure) or combinations thereof. In general, it should be appreciated that the velocity of the vapor flow in the evaporator is generally less than the inner perimeter compared to the outer perimeter, i.e., the vapor flow will increase in the radial direction heading outward. This inner perimeter configuration of the evaporator 52 having pin type structures (e.g., posts, rods, (or similar structure) or combinations thereof) is provided to enhance the cooling capacity density where the vapor flow 57 is slow. (so as to target potential hot spots, for example). For example, the pin type arrangement with higher cooling performance can be used in the inner part of the perimeter because of the low vapor flow. The spirals passages can be used, for example, in the outer perimeter region to provide wider passage and to collect and guide (e.g., stream line) the vapor flow as it increases from the inner perimeter and out perimeter. It should be appreciated than in an alternative embodiment the entire region (i.e. encompassing the inner perimeter and outer perimeter) may be all pin type structures. In an approach of the all pin embodiment, the density of the pins would be designed to decrease to accommodate the increase vapor flow. For example, the density of the pins will decrease as it moves form inner perimeter region to the outer perimeter region. Alternatively, the relative scaling (overall size of the region) of the inner perimeter region and the out perimeter region may increase or decrease relative to one other. Still yet, while only two perimeters are illustrated, the design may be implemented with more than two perimeter regions. A benefit of altering or changing the region perimeters could be tailored to the type of working fluid and/or application. The configuration of the condenser 65 in this embodiment may be comparable to the condenser configuration provided in FIG. 19(A).

It should be appreciated that the inner perimeter region design and the pin type or spiral type channels is applicable to the condenser unit as well. A distinction is that the vapor flow decrease from the outer perimeter region to inner perimeter region.

Figure 19C:
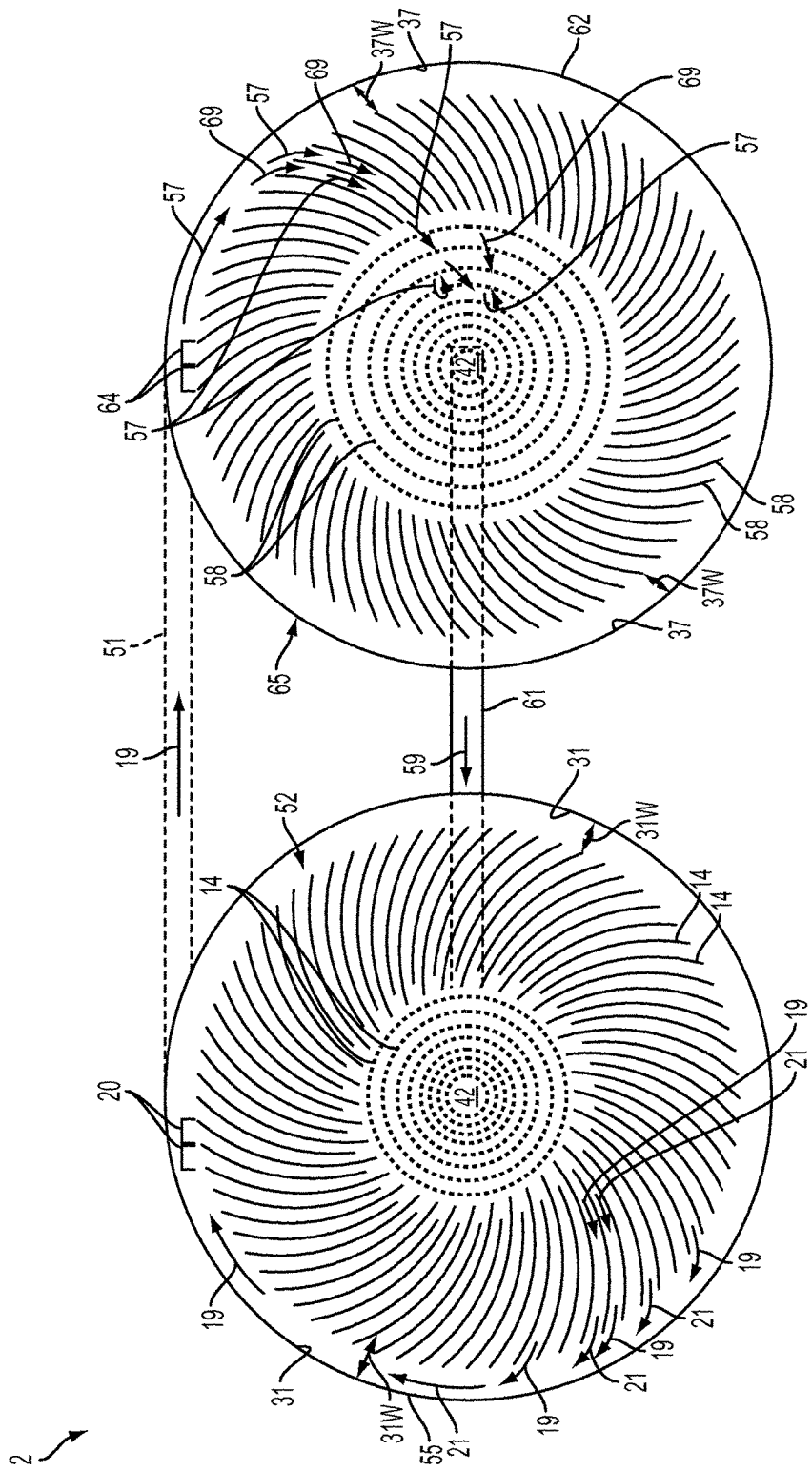

Next, turning to FIG. 19(C), FIG. 19(C) provides a schematic plan view of a representation of an embodiment of the present invention heat transfer device 2, which provides a heat transfer system that utilizes an evaporator 52 and a condenser 65. The heat transfer device shown in FIG. 19(C) is similar to the heat transfer device shown in FIG. 19(B) except for the alternative design of the transition passage 31 of the evaporator 52 and the transition passage 37 of the condenser 65. The embodiment of the heat transfer device 2 in FIG. 19(C) has transition passages 31, 37 that are uniform (unlike FIGS. 19(A) and 19(B) whereby the transition passages 31, 37 are tapered). The width 31W, 37W of the transition passages 31, 37 remains uniform or fixed along direction of the circumference or perimeter of the condenser, i.e., it's area remains constant.

It should be appreciated that uniform transition passages and tapered passages may be implemented as desired, needed or required for various embodiments and implementations. For example, in a given single heat device the condenser may have a uniform transition passage and the evaporator may have a tapered transition passage or vice versa. The transition passage may have any width, height, length or pitch as desired or required. It should be appreciated that the transition passages may have a variety of contours, bends, angles, and sizes as desired, needed or required for the given application or environment.

Moreover, it should be appreciated that the evaporator and condenser may be above or below one another (instead of side-by-side) if desired, needed or required. A vertical relationship may require suitable accommodations of pumping or wicking, for example; or alternative fluid supply for the evaporator rather than from the condenser or a fluid supply to augment the condenser.

It should be appreciated that the wall 55 of the evaporator 52 and the wall 62 of the condenser 65 may be an outer casing (or inner casing) or any wall with respect to the overall system or unit. It should be appreciated that more than one condenser or evaporator may be implemented within an overall system or unit as desired or required.

In some embodiments, the liquid inlet 61 may utilize a conduit that includes a wick structure (although not specifically illustrated in FIGS. 19(A)-(C)) in order to transfer liquid from the condenser 65 to the evaporator 52. It should be appreciated that other approaches may be utilized, such as systems similar to wicking or pumping systems. Such pumping systems may be installed between the evaporator and the condenser. Perhaps in some cases, for example, a pump might be installed between the evaporator and the condenser in cases where the cooling system is integrated with an energy recovery unit of a type that requires compression and expansion of the working fluid. In such an embodiment, the wick may be utilized to provide capillary draw in order to move the liquid produced in the condenser 65 to the evaporator 52. It should be appreciated that this wick structure may also be fashioned so that the portion within the evaporator 52 is adjacent to and in communication with the elongated members 14. In this manner, the wick can aid in providing liquid to the evaporation sites along the elongated members 14 and thus can reduce or avoid problems associated with dry-out.

In some embodiments, as illustrated in FIG. 19(A)(C), the evaporator 52 and the condenser 65 may be generally separated such that there is a reservoir for the liquid portion of the working fluid (not shown) contained in the evaporator 52 and a separate condenser reservoir (not shown) for the liquid (not shown) contained in the condenser 65. In such an embodiment, communication is maintained through the liquid inlets 61. In other embodiments, the evaporator 52 and condenser 65 may be configured to share the same common reservoir (not shown), rather than separate reservoirs. In such an embodiment, the liquid portion of the working fluid may be moved from the condenser 65 to the evaporator 52 by relying on gravity and allowing the condensed working fluid to pool back to the common reservoir (which is shared between the condenser and/or evaporator). Alternatively, an embodiment may include a combination of both approaches whereby the evaporator and condenser may have separate reservoirs, respectively, but they may also share a common reservoir as well. Also, it should be appreciated that an ancillary source for a reservoir may be implemented as well.

Although not disclosed in FIG. 19(A)-(C), it should be appreciated that for a given application or environment that multiple evaporators 52 and condensers 65 may be implemented and practiced as desired, needed, or required. Similarly, multiple vapor outlets 51 and liquid inlets 61 may be implemented to communicate between the multiple evaporators and condensers. Moreover, ancillary liquid sources may be used in place of or in addition to condensers. Similarly, ancillary vapor depositories may be used instead of condensers or in addition to condensers. Further yet, one or more energy recovery units may be utilized and in communication with the evaporators, condensers, and/or ancillary units.

FIG. 20(A) provides a schematic view of an exemplary integrated circuit (IC) package 371 in which the components are coupled to a chip carrier 373, such as a mother board or main board or the like. A heat transfer device 2 in accordance with an embodiment of the present invention is shown in FIG. 20(A). The evaporate 52 can be integrated into the structure of the IC die 375, such as a silicon die, or GaAs—or the like. The evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. The semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12. The elongated members 14 are placed away from the side of the semiconductor device 377. For example, evaporator is mounted on the opposite side of the semiconductor device 377 (e.g., processor) than the side of the semiconductor device 377 that is generally secured to the chip carrier 373. The IC die 375 may be secured to the chip carrier 373 by a plurality of solder balls 378 or the like—such as pins. The semiconductor device 377 is thermally coupled or in thermal communication with the base 6 and elongated members 14. It should be appreciated that the integration of the semiconductor device 377 and base 6 and elongated members 14 (i.e., the evaporator) into the IC die 375 as such, serves to, among other things, shorten the path that the thermal energy travels from the heat source (i.e., emanating from the semiconductor device 377) to the evaporating thin film region of the evaporating meniscus 3 located at the elongated members 14 at the immersion region. Furthermore, this integration (semiconductor device, base, and elongated members) serves to, among other things, reduce the thermal resistance between the heat source (i.e., emanating from the semiconductor device 377) and the evaporator 52 and the required temperature gradient to induce the heat flow.

FIG. 20(B) provides a schematic view of an exemplary integrated circuit (IC) package 371 in which the components are coupled to a chip carrier 373, such as a mother board or main board or the like. In this embodiment the structure of the IC die 375 is stacked on the structure of an additional IC die 475. While two stacked IC die are illustrated it should be appreciated that more than two die can be stacked in similar fashion as desired or required. As will be discussed, for chip stacking cooling applications the structure of the evaporator may be integrated into the packaged electronics so to, among other things, avoid the local spikes in temperature in the core. It should be noted that the integration of the microfluidic evaporative system into the electronic chip shall be made in a way to avoid the interference with the function of the device and the electric connections. A heat transfer device 2 in accordance with an embodiment of the present invention is shown in FIG. 20(B). The evaporate 52 can be integrated into the structure of the IC die 375, such as a silicon die, or GaAs—or the like. The evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. The semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12. The elongated members 14 are placed away from the side of the semiconductor device 377. For example, evaporator is mounted on the opposite side of the semiconductor device 377 (e.g., processor) than the side of the semiconductor device 377 that is generally secured to the chip carrier 373. The IC die 375 may be secured to the chip carrier 373 by a plurality of solder balls 378 or the like—such as pins. The semiconductor device 377 is thermally coupled or in thermal communication with the base 6 and elongated members 14. It should be appreciated that the integration of the semiconductor device 377 and base 6 and elongated members 14 (i.e., the evaporator) into the IC die 375 as such, serves to, among other things, shorten the path that the thermal energy travels from the heat source (i.e., emanating from the semiconductor device 377) to the evaporating thin film region of the evaporating meniscus located at the elongated members 14 at the immersion region. Furthermore, this integration (semiconductor device, base, and elongated members) serves to, among other things, reduce the thermal resistance between the heat source (i.e., emanating from the semiconductor device 377) and the evaporator 52 and the required temperature gradient to induce the heat flow.

In a similar fashion, a second evaporate 52 can be integrated into the structure of the IC die 475, such as a silicon die, or GaAs—or the like. The evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. The semiconductor device 477 (e.g., semiconductor chip), such as a processor, circuitry, central processor unit, memory unit, or the like may be integrated into the structure of the IC die 475. Electrical connectors 481 may be utilized to operatively couple the stacked IC die 375 and IC die 475. Additionally, a thermal insulator layer 483 may be provided. For both levels there may be implemented additional electronic components 385, 485, such as transistors, memory cache, etc.

Figure 20C:
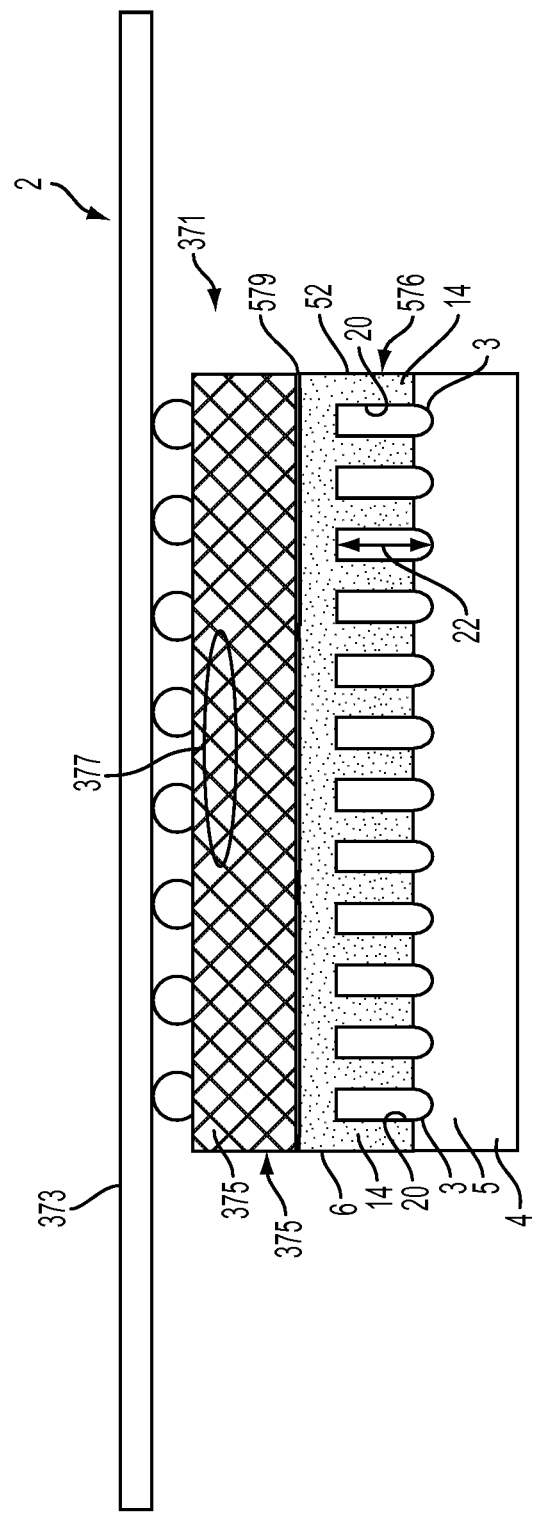
FIG. 20 provides a schematic view of exemplary embodiments of the integrated circuit (IC) package of the present invention.

FIG. 20(C) provides a schematic view of an exemplary integrated circuit (IC) package 371 in which the components are coupled to a chip carrier 373, such as a mother board or main board or the like. A heat transfer device 2 in accordance with an embodiment of the present invention is shown in FIG. 20(C). The evaporate 52 can be integrated into the structure of a distinct or separate die 576 that is different than the IC die 375 whereby the semiconductor device 377 (e.g., semiconductor chip), such as a processor, circuitry, central processor unit, memory unit, or the like may be integrated into. Therefore, the evaporator is in thermal communication with the semiconductor device 377 while it has an external structure thereto. Thermal glue/paste 579 may be used to reduce the contact thermal resistance between the surface of the IC die 375 where the semiconductor device 377 (e.g., CPU) is located and the die 576 where the evaporator is located. Still, in this manner, the evaporator is located on the opposite side of the semiconductor device 377 (e.g., processor) than the side whereby the semiconductor device 377 is generally secured to the chip carrier 373. Still referring to FIG. 20(C), the evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. As mentioned previously, the semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12. The elongated members 14 are placed away from the side of the semiconductor device 377. For example, evaporator is mounted on the opposite side of the semiconductor device 377 (e.g., processor) than the side of the semiconductor device 377 is generally secured to the chip carrier 373. The IC die 375 may be secured to the chip carrier 373 by a plurality of solder balls 378 or the like—such as pins. The semiconductor device 377 is thermally coupled or in thermal communication with the base 6 and elongated members 14. An example of one of a benefit associated with stacking is, among other things, the shortening of the electrical paths It should be appreciated that the embodiments the device and apparatus disclosed in FIGS. 20 and 22, as well as disclosed herein, may have the micro channels and various other components fabricated using commercially available practices, such as but not limited there to the following: photolithography, micromachining, patterning, etching, ion etching, deep reactive ion etching, plasma etching, laser etching, lithography, and milling. Other available techniques that are included in the context of the various embodiments of the invention include: soldering, brazing, welding, gluing. Moreover, any available coupling, adjoin, and securing techniques and securing structure/systems may be implemented as well within the context of practicing the various embodiments of the invention. Other components or systems may include substrates, chips, sealant, terminals for external connections—as well as others components necessary for the fabrication.

Regarding semiconductor devices that may require cooling the following provide some non-limiting examples of two-terminal devices: DIAC, Diode (rectifier diode), Gunn diode, IMPATT diode, Laser diode, Light-emitting diode (LED), Photocell, PIN diode, Schottky diode, Solar cell, Tunnel diode, VCSEL, VECSEL, Zener diode. Regarding semiconductor devices that may require cooling the following provide some non-limiting examples of three-terminal devices: Darlington transistor, Field-effect transistor, IGBT transistor, Silicon controlled rectifier, Thyristor, TRIAC, Unijunction transistor. Regarding semiconductor devices that may require cooling the following provide some non-limiting examples of four-terminal devices: Hall effect sensor (magnetic field sensor). Regarding semiconductor devices that may require cooling the following provide some non-limiting examples of multi-terminal devices: Integrated circuit (ICs), Charge-coupled device (CCD), Microprocessor Random-access memory (RAM), Read-only memory (ROM), or the like.

It should be appreciated that the embodiments the device and apparatus disclosed in FIG. 20 and FIG. 22, as well as disclosed herein, may utilize pumps for the fluid (as well as vapor), such as but not limited thereto, the following: electromechanical (e.g., MEMS-based) or electro-osmotic pumps (also referred to as "electric kinetic" or E-K" pumps).

Figure 21A:
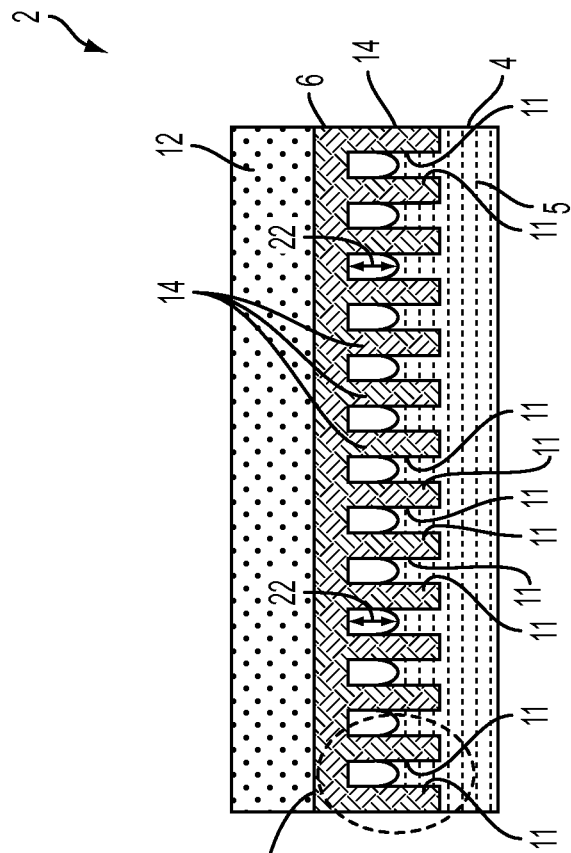
FIG. 21A schematically illustrates an exemplary embodiment of the present invention device.
Figure 21B:
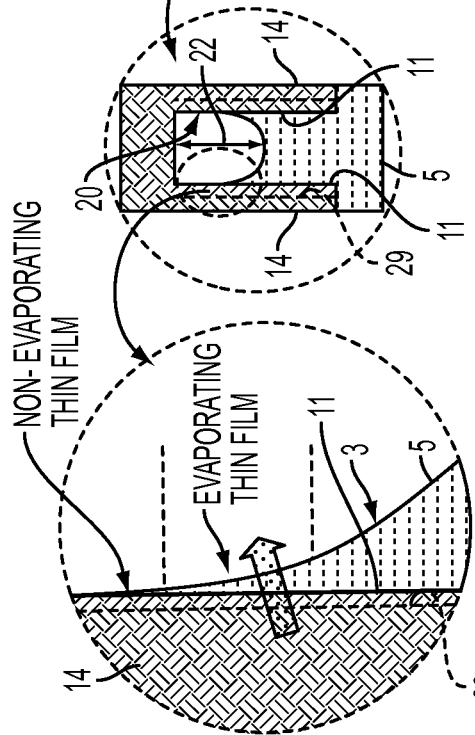
FIG. 21B provides an enlarged partial view of a single passage of an embodiment of the present invention shown in FIG. 21A.
Figure 21C:
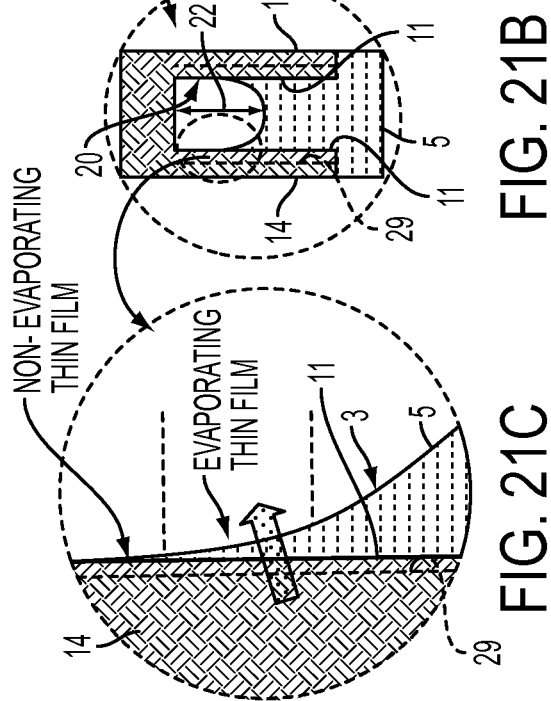
FIG. 21C provides an enlarged partial view of the thin film region as part of the meniscus as shown in FIG. 21B where the bulk of evaporation and heat transfer take place.

Referring generally now to FIG. 21, in an embodiment of the present invention phase change heat transfer device 2, a heat source 12 is in communication with a base member 6. Remaining various components disclosed in the associated heat transfer device of FIG. 2, can be implemented and carried forward in the associated heat transfer device of FIG. 21. FIG. 21B provides an enlarged partial view of a single passage 20 in FIG. 21A and FIG. 21C provides an enlarged partial view of the thin film region of the meniscus 3 as shown in FIG. 21B. The heat transfer device 2 comprises a recess topography 11 disposed on at least one wall of the elongated members 14, wherein the recess topography 11 is configured to accommodate the working fluid 5. The recess topography 11 may be on some, most, or all of the walls of the elongated members 14. The recess topography 11 may comprise one or more recesses 29. The recesses 29 may be a variety of structures including, but not limited thereto, the following: groove, slot, pipe, tube, trough, conduit, indentation, or flute, as well as any combination. The recesses 29 can have rectangular, trapezoidal, or triangular cross sections, among other possibilities. The recess topography 11 may comprises fractal topology. The fractal topology comprises recesses, wherein the number of recesses toward said end of elongated member to be closer to the heat source is greater than the number of recesses toward said end of elongated member to be inserted in a working fluid. For instance, the fractal topology comprises recesses, wherein the number of recesses toward the proximal end of elongated member is greater than the number of recesses toward the distal end of the elongated member. For instance, the fractal topology comprises recesses, wherein the number of recesses toward said end of elongated member to be closer to the evaporation site is greater than the number of recesses toward said end of elongated member to be inserted in a working fluid.

The recess topography is configured to provide a suction of the working fluid toward the heat source. For instance, the recess topography is configured to provide a suction of the working fluid in the direction toward the evaporation site. For instance, the recess topography is configured to provide a suction of the working fluid in the direction toward the proximal end of the elongated members. For instance, the recess topography is configured to provide a suction of the working fluid in the direction away from a reservoir configured to contain the working fluid.

The recess topology may occupy varying portions of the walls of any of the elongated members disclosed herein. For instance, the recess topology may apply to a partial area of the wall or complete area of the wall of any of the elongated members disclosed herein. Moreover, the recess topology may apply to different areas, locations, or portion sizes of the wall of any of the elongated members disclosed herein.

The recess topology may be disposed on or occupy a variety of components, parts, elements, or locations on the various embodiments disclosed herein. For example, the recess topology may be disposed on, but not limited thereto, any of the passages 20 or faces 8, 10 of the base member 6 (or the like). The recess topology may be disposed on varying portions of the passages, faces, or other components of the various embodiments disclosed herein. For instance, the recess topology may apply to a partial area of the passages, faces, or other components of the various embodiments disclosed or complete area of the passages, faces, or other components disclosed herein. Moreover, the recess topology may apply to different areas, locations, or portion sizes of the passages, faces, or other components of the various embodiments disclosed herein.

The recesses 29 are each wetted (as applicable) by the working fluid 5. The working fluid 5 is pulled into these recesses 11 where the working fluid 11 evaporates in the vicinity of the greatly—extended lines of contact of the working fluid 11 with the solid of the elongated members 14. The mechanism of evaporation pulls the working fluid 5 into these recesses 11, i.e. the device 2 is a thermal engine, which drives the flow whose change of phase provides cooling capability of the device 2.

An aspect of various embodiments of the present invention may provide a number of advantages. For example, compared to the embodiment such as generally disclosed in FIG. 2, the device 2 as generally disclosed in FIG. 21, having a recess topography, thereby provides a substantial increase in the length of contact line, by two orders of magnitude or more. This enhancement leads to a nearly proportional enhancement in the performance of the evaporator, i.e., heat transfer device. For example, compared to the embodiment such as generally disclosed in FIG. 2, the device 2 as generally disclosed in FIG. 21, having a recess topography, provides for the penetration of the evaporation site (line of contact) all the way to the base member 6 (or most distal portion of wall of elongated member 14), such as toward the heat source. This results in a lower temperature of the heat source for a given heat flux. This is so because the temperature of the phase change, is now at its closest possible distance to the heat source, so that the heat to be rejected needs to be transported over a shorter length of solid material than compared to the embodiment such as generally disclosed in FIG. 2. Therefore, the total temperature drop needed to drive this flux away from the heat source is much smaller; the temperature gradient remains the same, and is dictated by the flux generated by the source; but by shortening the distance between the source and the point of evaporation, the total temperature drop is less, thus resulting in a lower temperature of the source.

The recesses may have a pattern on the sidewalls of the elongated members 14 that need not be linear, or parallel. It is envisioned that a variety of hierarchical patterns/sizes exhibiting tree structures with the trunk disposed on the walls of the elongated members near the liquid reservoir providing liquid to an ever-increasing number of branches of shrinking width as they reach the end or near the end of the walls of the elongated members 14 near the heat source thereby maximizing the overall length of evaporation sites closest to the he source of heat, where they are needed the most.

FIG. 22(A) provides a schematic view of an exemplary integrated circuit (IC) package 371 in which the components are coupled to a chip carrier 373, such as a mother board or main board or the like. A heat transfer device 2 in accordance with an embodiment of the present invention is shown in FIG. 22(A). The evaporate 52 can be integrated into the structure of the IC die 375, such as a silicon die, or GaAs—or the like. The evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. The semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12.

Remaining various components disclosed in the associated heat transfer device of FIG. 20A, can be implemented and carried forward in the associated heat transfer device of FIG. 22A. As discussed above, the heat transfer device 2 comprises a recess topography 11 disposed on said at least one wall of said elongated members 14, wherein the recess topography 11 is configured to accommodate the working fluid 5. The recess topography 11 may be on some, most, or all of the walls of the elongated members 14. The recess topology may occupy varying portions of the walls of the elongated members 14, such as partial area of the wall or complete area of the wall. The recess topography 11 may comprise one or more recesses 29. The recesses 29 may be a variety of structures as disclosed herein. The recesses topography 11 may comprises fractal topology as disclosed herein.

Figure 22B:
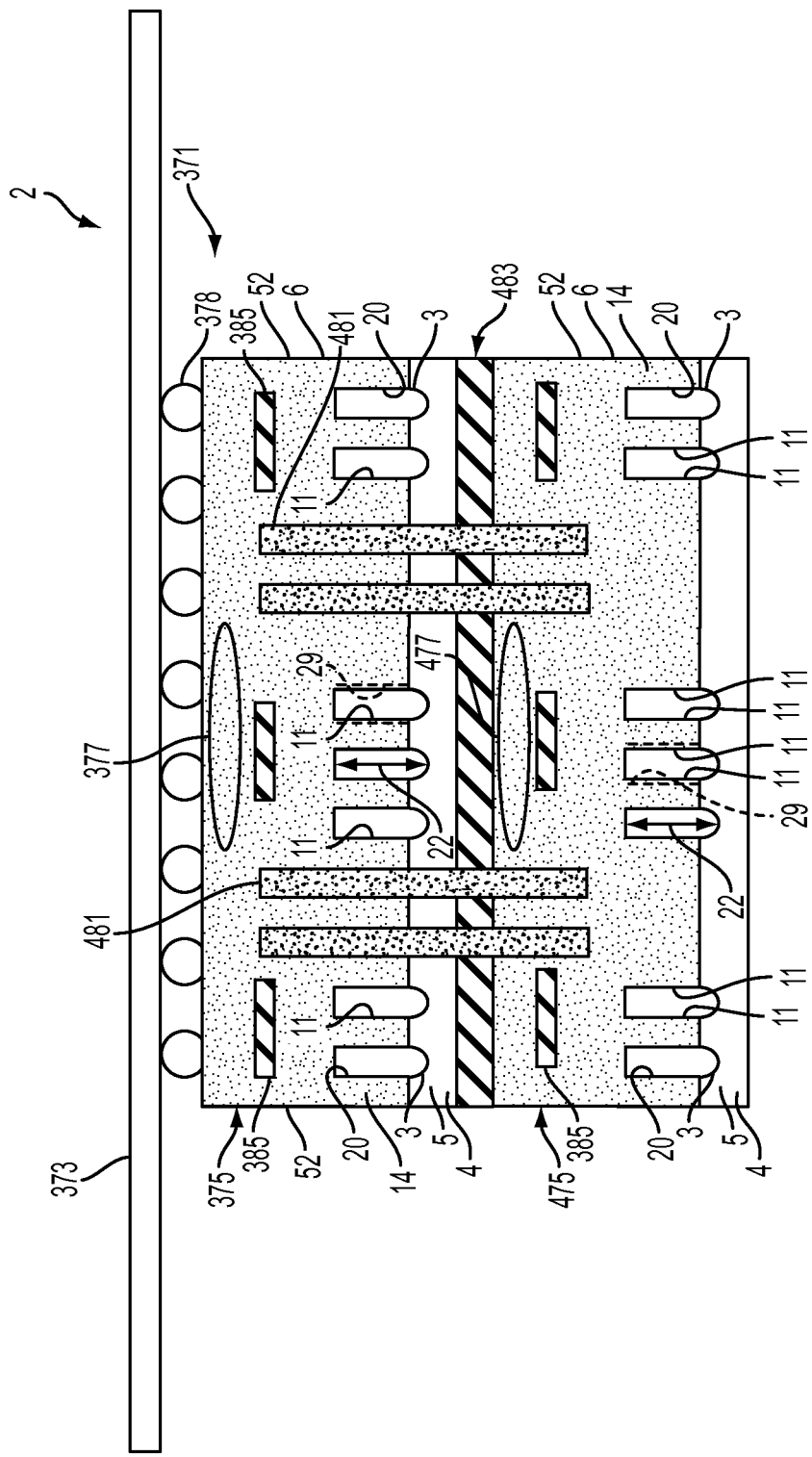
FIG. 22 provides a schematic view of exemplary embodiments of the integrated circuit (IC) package of the present invention.

FIG. 22(B) provides a schematic view of an exemplary integrated circuit (IC) package 371 in which the components are coupled to a chip carrier 373, such as a mother board or main board or the like. In this embodiment the structure of the IC die 375 is stacked on the structure of an additional IC die 475. While two stacked IC die are illustrated it should be appreciated that more than two die can be stacked in similar fashion as desired or required. As will be discussed, for chip stacking cooling applications the structure of the evaporator may be integrated into the packaged electronics so to, among other things, avoid the local spikes in temperature in the core. It should be noted that the integration of the microfluidic evaporative system into the electronic chip shall be made in a way to avoid the interference with the function of the device and the electric connections. A heat transfer device 2 in accordance with an embodiment of the present invention is shown in FIG. 22(B). The evaporate 52 can be integrated into the structure of the IC die 375, such as a silicon die, or GaAs—or the like. The evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. The semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12.

Remaining various components disclosed in the associated heat transfer device of FIG. 20B, can be implemented and carried forward in the associated heat transfer device of FIG. 22B. As discussed above, the heat transfer device 2 comprises a recess topography 11 disposed on said at least one wall of said elongated members 14, wherein the recess topography 11 is configured to accommodate the working fluid 5. The recess topography 11 may be on some, most, or all of the walls of the elongated members 14. The recess topology may occupy varying portions of the walls of the elongated members 14, such as partial area of the wall or complete area of the wall. The recess topography 11 may comprise one or more recesses 29. The recesses 29 may be a variety of structures as disclosed herein. The recesses topography 11 may comprises fractal topology as disclosed herein.

Figure 22C:
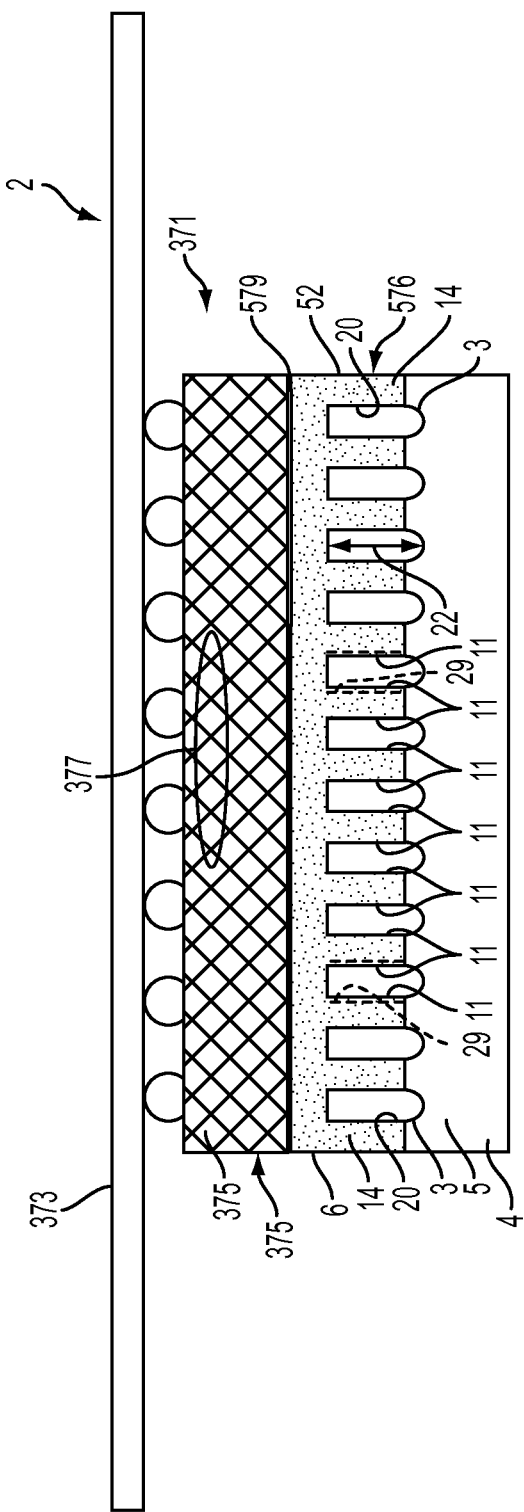

FIG. 22(C) provides a schematic view of an exemplary integrated circuit (IC) package 371 in which the components are coupled to a chip carrier 373, such as a mother board or main board or the like. A heat transfer device 2 in accordance with an embodiment of the present invention is shown in FIG. 22(C). The evaporate 52 can be integrated into the structure of a distinct or separate die 576 that is different than the IC die 375 whereby the semiconductor device 377 (e.g., semiconductor chip), such as a processor, circuitry, central processor unit, memory unit, or the like may be integrated into. Therefore, the evaporator is in thermal communication with the semiconductor device 377 while it has an external structure thereto. Thermal glue/paste 579 may be used to reduce the contact thermal resistance between the surface of the IC die 375 where the semiconductor device 377 (e.g., CPU) is located and the die 576 where the evaporator is located. Still, in this manner, the evaporator is located on the opposite side of the semiconductor device 377 (e.g., processor) than the side whereby the semiconductor device 377 is generally secured to the chip carrier 373. Still referring to FIG. 22(C), the evaporator 52 has a base 6 and a plurality of elongated members 14 configured to define passages 20 (such as micro channels, as well as nano-channels) between respective adjacent elongated members 14. The elongated members 14 are configured to be immersed into the reservoir 4 or working fluid 5. As mentioned previously, the semiconductor device 377 (e.g., semiconductor chip), such as a processor, circuitry, central processor unit, memory unit, or the like may be integrated into the structure of the IC die 375. During operation the semiconductor device 377 generates the heat due to, for example, resistive losses in its circuitry. This heat heats up the semiconductor device 377 (e.g., processor) that defines, for example, the heat source 12.

Remaining various components disclosed in the associated heat transfer device of FIG. 20C, can be implemented and carried forward in the associated heat transfer device of FIG. 22C. As discussed above, the heat transfer device 2 comprises a recess topography 11 disposed on said at least one wall of said elongated members 14, wherein the recess topography 11 is configured to accommodate the working fluid 5. The recess topography 11 may be on some, most, or all of the elongated walls 14. The recess topology may occupy varying portions of the walls of the elongated members 14, such as partial area of the wall or complete area of the wall. The recess topography 11 may comprise one or more recesses 29. The recesses 29 may be a variety of structures as disclosed herein. The recesses topography 11 may comprises fractal topology as disclosed herein.

Figure 23:
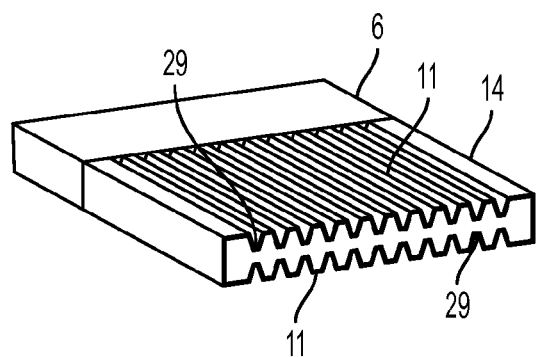
FIG. 23 provides a schematic perspective view of an elongated member having a base member.

FIG. 23 provides a schematic perspective view of an elongated member 14 having a base member 6 that may be configured to be used with a heat transfer device or exchanger, or other system for example. A recess topology 11 may be disposed on both (or just one) of the side walls of the elongated member 14. The recess topology may occupy varying portions of the walls of the elongated members 14, such as partial area of the wall or complete area of the wall. As disclosed herein, the recess topology 11 may have a plurality of recesses 29 or the like.

Figure 24:
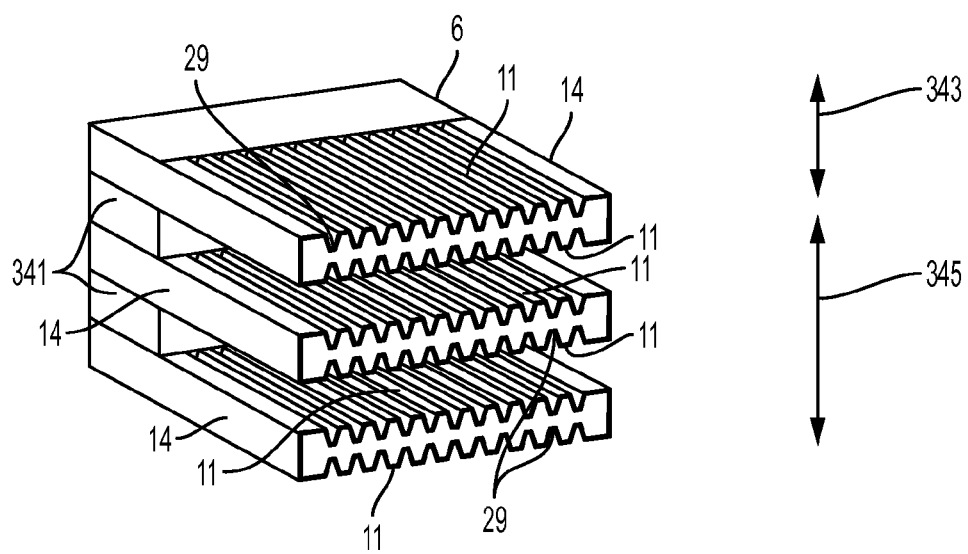
FIG. 24 provides a schematic perspective view of a plurality of elongated members, such as shown in FIG. 23.

FIG. 24 provides a schematic perspective view of a plurality of elongated members 14, such as shown in FIG. 23 for example, having respective base members 6. A recess topology 11 may be disposed on both (or just one) of the side walls of the elongated member 14. The recess topology may occupy varying portions of the walls of the elongated members 14, such as partial area of the wall or complete area of the wall. As disclosed herein, the recess topology 11 may have a plurality of recesses 29 or the like. A spacer 341 may be disposed, located, or placed between the elongated members 14. Various separation structures, material or members may be implemented to set the elongated members 14 apart as desired, needed or required for operational conditions, for example; as well as for manufacturing purposes. The spacer may be integrally or separately formed from the base and/or elongated members; as well as integrally or separately formed with other components of the device and system. The base member 6 may be a variety of lengths or widths. The length may be reduced to a length so as to essentially consist of the utmost proximal edge of the elongated members. Said differently, the base may occupy varying portions and sizes relative to the elongated members.

Reference 343 approximates the width (343) of a elongated member 14 and a spacer 341, for example, to have a nominal distance of 0.5 cm (or 5.0 mm). It should be appreciated that such width (343) may range from 1 mm to 5 cm, or any integer, fraction, or decimal there between. Moreover, the width (343) may be less than 1 mm or greater than 5.0 cm to meet operational requirements or needs.

Reference 345 approximates the width (345) of two elongated members 14 and a spacer 341, for example, to have a nominal distance of 1.0 cm (or 10.0 mm). It should be appreciated that such width (345) may range from 0.1 cm to 10 cm, or any integer, fraction, or decimal there between. Moreover, the width (345) may be less than 0.1 cm or greater than 10 cm to meet operational requirements or needs.

FIG. 25 provides a schematic side view of an elongated member 14 that may be configured to be used with a heat transfer device or exchanger, or other system for example. A recess topology 11 may be disposed on opposite side walls (or alternatively only one side wall) of the elongated member 14. The recess topology may occupy varying portions of the walls of the elongated members 14, such as partial area of the wall or complete area of the wall. As disclosed herein, the recess topology 11 may have a plurality of recesses 29 or the like.

Reference 221 approximates the depth (221) of a recess 29 (e.g., groove) to have a nominal distance of 90 µm. It should be appreciated that such depth (221) may range from 1 µm to 150 µm, or any integer, fraction, or decimal there between. Moreover, the depth (221) may be less than 1 µm or greater than 150 µm to meet operational requirements or needs.

Reference 229 approximates the width (229) of an elongated member 24 to have a nominal distance of 300 µm. It should be appreciated that such width (229) may range from 50 µm to 500 µm, or any integer, fraction, or decimal there between. Moreover, the depth (229) may be less than 50 µm or greater than 500 µm to meet operational requirements or needs.

Reference 223 approximates the outer width (223) of a recess 29 (e.g., groove) to have a nominal distance of 50 µm. It should be appreciated that such outer width (223) may range from 1 µm to 200 µm, or any integer, fraction, or decimal there between. Moreover, the outer width (223) may be less than 1 µm or greater than 200 µm to meet operational requirements or needs.

Reference 225 approximates the inner width (225) of a recess 29 (e.g., groove) to have a nominal distance of 20 µm. It should be appreciated that such inner width (223) may range from 0 µm to 100 µm, or any integer, fraction, or decimal there between. Moreover, the inner width (225) may be greater than 100 µm to meet operational requirements or needs.

Reference 227 approximates the width (227) between two recesses 29 (e.g., grooves) to have a nominal distance of 30 µm. It should be appreciated that such width (227) may range from 1 µm to 200 µm, or any integer, fraction, or decimal there between. Moreover, the depth (221) may be less than 1 µm or greater than 200 µm to meet operational requirements or needs.

FIG. 26 provides a schematic perspective partial view of an elongated member 14 having a recess topology 11 on its side wall comprising, for example, recesses 29 (or the like) with working fluid 5 therein. Heat conduction or flow 13 is shown generally in the longitudinal direction headed away from the heat source (not shown) and lateral direction headed across the elongated member 14 and resulting in the form of evaporation 15. For instance, this demonstrates, among other things, how heat flows from the heat source (not shown), through the solid and then exchanged into latent heat of evaporation at the contact of liquid (working fluid 5) with the edges of the recesses 11 in the sidewalls of the elongated members 14.

Figure 29:
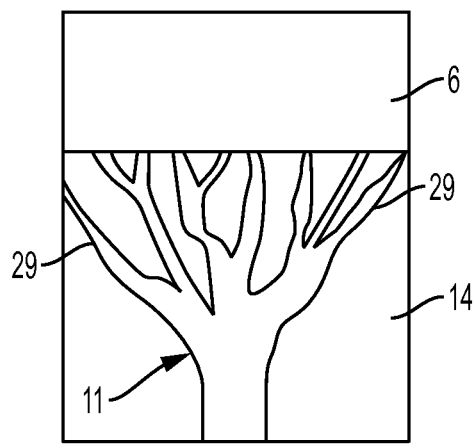
FIG. 29 provides a schematic plan view of an elongated member having a base member and recess topology disposed on the side wall of the elongated member.

FIG. 29 provides a schematic plan view of an elongated member 14 having a base member 6 that may be configured to be used with a heat transfer device or exchanger, or other system for example. A recess topology 11 may be disposed on one or both of the side walls of the elongated member 14. The recess topology may occupy varying portions of the walls of the elongated members 14, such as partial area of the wall or complete area of the wall. In an approach, the recess topology 11 may be fractal topology or hierarchical patterns/sizes. For example, as disclosed the recess topology 11 may have recesses 29 or the like that are shaped in a tree-like structure. For example, the patterns/sizes exhibiting tree structures with the trunk disposed on the walls of the elongated members, near and/or in the liquid reservoir, providing liquid to an ever-increasing number of branches of shrinking width as they reach the end or near the end of the walls of the elongated members 14 near the heat source thereby maximizing the overall length of evaporation sites closest to the source of heat, where they are needed the most. The branches may have a reduced width compared to the trunk width, not necessarily having a continuously reducing width (i.e., uniform). Although the branches (recesses) may reduce and taper down in size as they run from the reservoir toward heat source.

Figure 30:
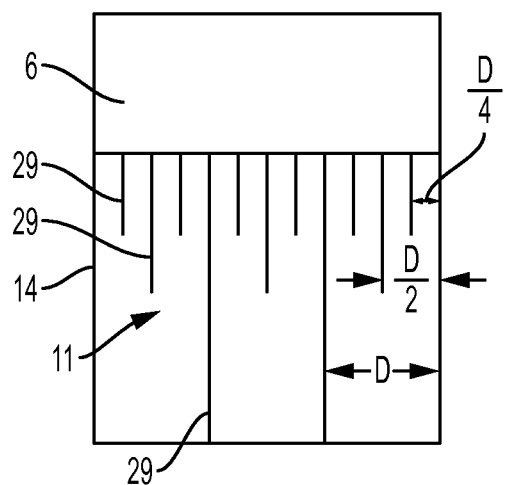
FIG. 30 provides a schematic plan view of an elongated member having a base member and recess topology disposed on the side wall of the elongated member.

FIG. 30 provides a schematic plan view of an elongated member 14 having a base member 6 that may be configured to be used with a heat transfer device or exchanger, or other system for example. A recess topology 11 may be disposed on one or both of the side walls of the elongated member 14. The recess topology may occupy varying portions of the walls of the elongated members 14, such as partial area of the wall or complete area of the wall. In an approach, the recess topology 11 may be fractal topology or hierarchical patterns/sizes. For example, as disclosed the recess topology 11 may have recesses 29 or the like that are offset and narrowing. For example, the patterns/sizes exhibiting recesses with greater width disposed on the walls of the elongated members, near and/or in the liquid reservoir, providing liquid to an ever-increasing number of recesses having narrower widths as they reach the end or near the end of the walls of the elongated members 14 near the heat source thereby maximizing the overall length of evaporation sites closest to the source of heat, where they are needed the most. The branches may have a reduced width compared to the trunk width, while not necessarily having a continuously reducing width (i.e., uniform). Although the branches (recesses) may reduce and taper down in size as they run from the reservoir toward heat source.

Practice of an aspect of an embodiment (or embodiments) of the invention will be still more fully understood from the following examples and prototypes, which are presented herein for illustration only and should not be construed as limiting the invention in any way.

Figure 27:
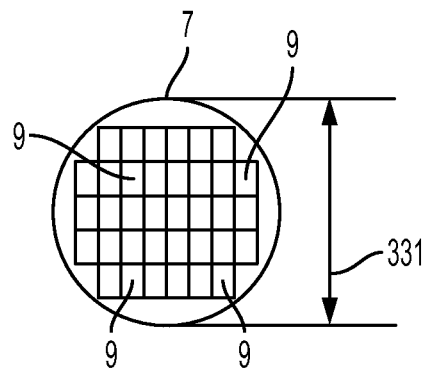
FIG. 27 provides schematic plan view of a silicon wafer prototype having thirty-six tiles.
Figure 28:
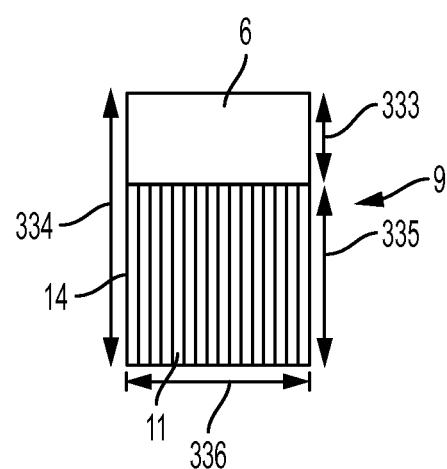
FIG. 28 provides a schematic plan view of a single tile, obtained, for example, from the wafer disclosed in FIG. 27, that is configured to be used as an elongated member.

FIGS. 27-28 pertain to an exemplary related method of manufacture and resultant prototype. For instance, FIG. 27 provides schematic plan view of a silicon wafer 7 having thirty-six tiles 9. A nominal diameter 331, for example, is 10 cm in diameter. FIG. 28 provides a schematic plan view of a single tile 9 obtained, for example, from the wafer 7 disclosed in FIG. 27 that is configured to be used as an elongated member 14 for purpose of a heat transfer device. The elongated member 14 (tile in this instance) has a base 6 and recess topology 11 disposed on the elongated members 14. The top part to the tile may be left flat to provide the base that may have a nominal length 333 of 0.5 cm. The bottom area may have the recessed topology 11 disposed thereon with a nominal length 335 of 1 cm. and a nominal height 336 of 1 cm. The overall length of the base and elongated members is 1.5. cm. As this embodiment is merely a prototype it should be noted that the dimension may vary to meet operational requirements and desires. For instance rather than 1.5 cm long by 1 cm high, the dimension may be 10 cm long by 7 cm high, or any dimension made up of integers, fractions, or decimals there between. Moreover, the dimensions be less than or greater than such explicit dimensions illustrated and discussed to meet operational requirements, desires or needs.

An aspect of an embodiment of the present invention provides thermal management systems disclosed herein that can be applied to exposed surfaces of the stacked processor or computer chip and extract the total heat through the exposed surfaces. Depending on the exact application and performance numbers, many layers of processors can be implemented and maintained within their normal operating temperature range through this scheme.

An aspect of various embodiments of the present invention may be utilized for a number of products and services, such as but not limited thereto, the following: Electronics cooling; high-performance chip cooling; stacked-chip cooling; novel concentrated solar devices with 1) Rankine cycle thermal engine, and 2) thermoelectric power generation. An aspect of various embodiments of the present invention may be utilized, for example, stack processors and memory, to create volumetric processors, with the advantage of shortened electronic paths (and computational times).

It should be appreciated that that the various components (e.g., components and elements stacked upon one another or relative to each other; or components and elements layered or disposed upon one another relative to each other) as disclosed in FIGS. 21-22 (as well as any embodiments disclosed herein) may be multiplied (i.e., additional layering or stacking) according the operational and volumetric requirements and needs.

The devices, systems, compositions, computer readable medium, and methods of various embodiments of the invention disclosed herein may utilize aspects disclosed in the following references, applications, publications and patents and which are hereby incorporated by reference herein in their entirety (and which are not admitted to be prior art with respect to the present invention by inclusion in this section). For example, any of the methods of 1) using the devices and systems (or portions thereof) or 2) manufacturing the devices and systems (or portions thereof) as disclosed in the references, applications, publications and patents as disclosed in the following references are also incorporated by reference and may therefore be considered as part of the present invention and employed within the context of the present invention (and which are not admitted to be prior art with respect to the present invention by inclusion in this section).

1. U.S. Pat. No. 6,934,154 B2, Prasher, R., et al., "Micro-Channel Heat Exchangers and Spreaders", Aug. 23, 2005.
2. U.S. Patent Application Publication No. 2002/0135980 A1, Vafai, K., "High Heat Flux Electronic Cooling Apparatus, Devices and Systems Incorporating Same", Sep. 26, 2002.
3. U.S. Patent Application Publication Serial No. 2008/0170368 A1, Chen, et al., "Apparatuses for Dissipating Heat from Semiconductor Devices", Jul. 17, 2008.
4. U.S. Pat. No. 7,123,479 B2, Chang, et al., "Enhanced Flow Channel for Component Cooling in Computer Systems", Oct. 17, 2006.
5. U.S. Pat. No. 7,369,410 B2, Chen, et al., "Apparatuses for Dissipating Heat from Semiconductor Devices", May 6, 2008.
6. U.S. Pat. No. 7,571,618 B2, Dessiatoun, S., "Compact Heat Exchanging Device Based on Microfabricated Heat Transfer Surfaces", Aug. 11, 2009.
7. U.S. Patent Application Publication No. 2008/0295996 A1, Bhavnani, et al., "Stable Cavity-Induced Two-Phase Heat Transfer in Silicon Microchannels", Dec. 4, 2008.
8. U.S. Pat. No. 7,059,396 B2, Foli, A., "System for Configuring the Geometric Parameters for a Micro Channel Heat Exchanger and Micro Channel Heat Exchangers Configured Thereby", Jun. 13, 2006.
9. U.S. Patent Application Publication No. 2008/0128109 A1, Gwin, et al., "Two-Phase Cooling Technology for Electronic Cooling Applications", Jun. 5, 2008.
10. U.S. Patent Application Publication No. 2010/0314088 A1, Yoo, Y., et al., "Heat Exchanger Having Micro-Channels", Dec. 16, 2010.
11. U.S. Pat. No. 7,665,511 B2, Bhatti, et al., "Orientation Insensitive Thermosiphon Capable of Operation in Upside Down Position, Feb. 23, 2010.
12. U.S. Pat. No. 4,351,388, Calhoun, et al., "Inverted Meniscus Heat Pipe", Sep. 28, 1982.
13. U.S. Patent Application Publication No. 2007/0240856 A1, Liu, et al., "Heat Pipe", Oct. 18, 2007.
14. U.S. Pat. No. 8,081,465 B2, Nishiura, A., "Cooling Apparatus for Semiconductor Chips", Dec. 20, 2011.
15. U.S. Pat. No. 8,255,193 B2, Humphrey, et al., "Blood Flow Bypass Catheters and Methods for the Delivery of Medium to the Vasculature and Body Ducts", Aug. 28, 2012.
16. U.S. Pat. No. 8,165,702 B2, Wyatt, et al., "Article Manufacturing Process", Apr. 24, 2012.
17. H. Wang, S. V. Garimella, and J. Y. Murthy. Characteristics of an Evaporating Thin Film in a Microchannel. International Journal of Heat and Mass Transfer, 50(19-20):3933-3942, 2007.
18. H. Wang, S. V. Garimella, and J. Y. Murthy and An Analytical Solution for the Total Heat Transfer in the Thin-film Region of an Evaporating Meniscus. International Journal of Heat and Mass Transfer, 51(25-26): 6317-6322, 2008.
19. U.S. patent application Ser. No. 13/522,264, Wadley, et al., entitled "Multifunctional Thermal Management System and Related Method" filed Jul. 13, 2012.
20. International Patent Application Serial No. PCT/US2011/021121, Wadley, et al., entitled "Multifunctional Thermal Management System and Related Method" filed Jan. 13, 2011.
21. U.S. Pat. No. 8,360,361, Wadley, et al., entitled "Method and Apparatus for Jet Blast Deflection", issued Jan. 29, 2013.
22. U.S. patent application Ser. No. 12/301,916, Wadley, et al., entitled "Method and Apparatus for Jet Blast Deflection", filed Oct. 7, 2009.
23. International Patent Application Serial No. PCT/US2007/012268, Wadley, et al., entitled "Method and Apparatus for Jet Blast Deflection", filed May 23, 2007.
24. U.S. Patent Application Publication No. US 2011/0075372 A1, Zimbeck, et al., "Evaporators for Use in Heat Transfer Systems, Apparatus Including Such Evaporators and Related Methods", Mar. 31, 2011.
25. U.S. Pat. No. 5,411,077, Tousignant, L., "Flexible Thermal Transfer Apparatus for Cooling Electronic Components", May 2, 1995.
26. U.S. Patent Application Publication No. US 2007/0034356 A1, Kenny, et al., "Cooling Systems Incorporating Heat Exchangers and Thermoelectric Layers", Feb. 15, 2007.
27. U.S. Patent Application Publication No. US 2005/0081552 A1, Nilson, et al., "Axially Tapered and Bilayer Microchannels for Evaporative Cooling Devices", Apr. 21, 2005.

28. U.S. Patent Application Publication No. US 2008/0229759 A1, Ouyang, et al., "Method and Apparatus for Cooling Integrated Circuit Chips Using Recycled Power", Sep. 25, 2008.
29. U.S. Patent Application Publication No. US 2005/0085018 A1, Kim, et al., "Electroosmotic Pumps Using Porous Frits for Cooling Integrated Circuit Stacks", Apr. 21, 2005.
30. U.S. Patent Application Publication No. US 2007/0039720 A1, Ghosh, et al., "Radial Flow Micro-Channel Heat Sink with Impingement Cooling", Feb. 22, 2007.
31. U.S. Pat. No. 6,140,707, Plepys, et al., "Laminated Integrated Circuit Package", Oct. 31, 2008.

EXAMPLES

Practice of an aspect of an embodiment (or embodiments) of the invention will be still more fully understood from the following examples, which are presented herein for illustration only and should not be construed as limiting the invention in any way.

Example 1

An aspect of an embodiment of present invention provides, but not limited thereto, a two phase heat transfer device. The device may comprise: a reservoir configured for carrying a working fluid; a base member having a first face and a second face, wherein said first face and said second face are generally away from each other, said first face of said base member configured to receive thermal energy from a heat source; elongated members extending distally away from said second face of said base member and configured to define respective passages between adjacent elongated members; said elongated members include a proximal region and a distal region, wherein said distal region is configured to be at least partially inserted into the working fluid; and said passages are configured to accommodate vapor produced from the working fluid so as to define a vapor space.

Example 2

The device of example 1 (as well as subject matter of one or more of any one combination of examples 2-84, 86-105, 107-126, 128-139, and 246-271), wherein said first face of said base member configured to be in communication with and adjacent to the heat source.

Example 3

The device of claim 1 (as well as subject matter of one or more of any one combination of examples 2-84, 86-105, 107-126, 128-139, and 246-271), wherein at least some of said elongated members comprise a protrusion.

Example 4

The device of claim 1 (as well as subject matter of one or more of any one combination of examples 2-84, 86-105, 107-126, 128-139, and 246-271), wherein at least some of said elongated members comprise a wall or panel.

Example 5

The device of example 4 (as well as subject matter of one or more of any one combination of examples 2-84, 86-105, 107-126, 128-139, and 246-271), wherein at least some of said walls or panels are configured to form a pathway for the vapor accommodation.

Example 6

The device of example 4 (as well as subject matter of one or more of any one combination of examples), wherein said wall or panel has a configuration that has at least one of the following: curve, angle, or contour, or any combination thereof.

Example 7

The device of example 4 (as well as subject matter of one or more of any one combination of examples 2-84, 86-105, 107-126, 128-139, and 246-271), wherein said wall or panel has a configuration that is substantially planar.

Example 8

The device of example 1 (as well as subject matter of one or more of any one combination of examples 2-84, 86-105, 107-126, 128-139, and 246-271), wherein said base member has a configuration that has at least one of the following: curve, angle, or contour, or any combination thereof.

Example 9

The device of example 1 (as well as subject matter of one or more of any one combination of examples 2-84, 86-105, 107-126, 128-139, and 246-271), wherein said base member has a configuration that is substantially planar.

Example 10

The device of example 4 (as well as subject matter of one or more of any one combination of examples 2-84, 86-105, 107-126, 128-139, and 246-271), wherein at least some of said walls or panels are configured to define channels for the vapor accommodation.

Example 11

The device of example 10 (as well as subject matter of one or more of any one combination of examples 2-84, 86-105, 107-126, 128-139, and 246-271), wherein said respective channels are microchannels or nanochannels, or a combination of microchannels and nanochannels.

Example 12

The device of example 1 (as well as subject matter of one or more of any one combination of examples 2-84, 86-105, 107-126, 128-139, and 246-271), wherein at least some of said passages are configured to define channels for the vapor accommodation.

Example 13

The device of example 12 (as well as subject matter of one or more of any one combination of examples 2-84, 86-105, 107-126, 128-139, and 246-271), wherein said respective channels are microchannels or nanochannels, or a combination of microchannels and nanochannels.

Example 14

The device of example 1 (as well as subject matter of one or more of any one combination of examples 2-84, 86-105, 107-126, 128-139, and 246-271), wherein said passages are configured to confine vapor between said reservoir and said second face of said base member.

Example 15

The device of example 1 (as well as subject matter of one or more of any one combination of examples 2-84, 86-105, 107-126, 128-139, and 246-271), wherein said passages are configured to confine vapor between said reservoir and said base member.

Example 16

The device of example 1 (as well as subject matter of one or more of any one combination of examples 2-84, 86-105, 107-126, 128-139, and 246-271), wherein said vapor space is located between the heat source and said reservoir.

Example 17

The device of example 1 (as well as subject matter of one or more of any one combination of examples 2-84, 86-105, 107-126, 128-139, and 246-271), wherein said vapor space is located between the heat source and the working fluid.

Example 18

The device of example 1 (as well as subject matter of one or more of any one combination of examples 2-84, 86-105, 107-126, 128-139, and 246-271), wherein at least some of said elongated members comprise: a pin, post, or rod.

Example 19

The device of example 18 (as well as subject matter of one or more of any one combination of examples 2-84, 86-105, 107-126, 128-139, and 246-271), wherein at least some of said pins, posts, or rods are configured to form a pathway for the vapor accommodation.

Example 20

The device of example 1 (as well as subject matter of one or more of any one combination of examples 2-84, 86-105, 107-126, 128-139, and 246-271), further comprising a wetting region located at at least a portion of said distal region of said elongated members.

Example 21

The device of example 20 (as well as subject matter of one or more of any one combination of examples 2-84, 86-105, 107-126, 128-139, and 246-271), wherein said wetting region comprises at least one hydrophilic material or lyophilic material.

Example 22

The device of example 20 (as well as subject matter of one or more of any one combination of examples 2-84, 86-105, 107-126, 128-139, and 246-271), wherein said wetting region comprises a coating at at least a portion of said distal region of said elongated members.

Example 23

The device of example 20 (as well as subject matter of one or more of any one combination of examples 2-84, 86-105, 107-126, 128-139, and 246-271), wherein said wetting region comprises a substrate located on or in at least a portion of said distal region of said elongated members.

Example 24

The device of example 20 (as well as subject matter of one or more of any one combination of examples 2-84, 86-105, 107-126, 128-139, and 246-271), further comprising a non-wetting region located at at least a portion of said proximal region of said elongated members.

Example 25

The device of example 24 (as well as subject matter of one or more of any one combination of examples 2-84, 86-105, 107-126, 128-139, and 246-271), wherein said non-wetting region comprises at least one hydrophobic material or lyophobic material.

Example 26

The device of example 24 (as well as subject matter of one or more of any one combination of examples 2-84, 86-105, 107-126, 128-139, and 246-271), wherein said non-wetting region comprises a coating at at least a portion of said proximal region of said elongated members.

Example 27

The device of example 24 (as well as subject matter of one or more of any one combination of examples 2-84, 86-105, 107-126, 128-139, and 246-271), wherein said non-wetting region comprises a substrate located on or in at least a portion of said proximal region of said elongated members.

Example 28

The device of example 24 (as well as subject matter of one or more of any one combination of examples 2-84, 86-105, 107-126, 128-139, and 246-271), further comprising a non-wetting region located at at least a portion of said second face of said base member located between at least some of said elongated members.

Example 29

The device of example 28 (as well as subject matter of one or more of any one combination of examples 2-84, 86-105, 107-126, 128-139, and 246-271), wherein said non-wetting region located at at least said portion of said second face comprises at least one hydrophobic material or lyophobic material.

Example 30

The device of example 28 (as well as subject matter of one or more of any one combination of examples 2-84, 86-105, 107-126, 128-139, and 246-271), wherein said non-wetting region located at at least said portion of said second face comprises a coating at at least a portion of said second face of said base member located between at least some of said elongated members.

Example 31

The device of example 28 (as well as subject matter of one or more of any one combination of examples 2-84, 86-105, 107-126, 128-139, and 246-271), wherein said non-wetting region located at at least said portion of said second face comprises a substrate located on or in at least a portion of said second face of said base member located between at least some of said elongated members.

Example 32

The device of example 1 (as well as subject matter of one or more of any one combination of examples 2-84, 86-105, 107-126, 128-139, and 246-271), further comprising a non-wetting region located at at least a portion of said proximal region of said elongated members.

Example 33

The device of example 32 (as well as subject matter of one or more of any one combination of examples 2-84, 86-105, 107-126, 128-139, and 246-271), wherein said non-wetting region comprises at least one hydrophobic material or lyophobic material.

Example 34

The device of example 32 (as well as subject matter of one or more of any one combination of examples 2-84, 86-105, 107-126, 128-139, and 246-271), wherein said non-wetting region comprises a coating at at least a portion of said proximal region of said elongated members.

Example 35

The device of example 35 (as well as subject matter of one or more of any one combination of examples 2-84, 86-105, 107-126, 128-139, and 246-271), wherein said non-wetting region comprises a substrate located on or in at least a portion of said proximal region of said elongated members.

Example 36

The device of example 32 (as well as subject matter of one or more of any one combination of examples 2-84, 86-105, 107-126, 128-139, and 246-271), further comprising a non-wetting region located at at least a portion of said second face of said base member located between at least some of said elongated members.

Example 37

The device of example 36 (as well as subject matter of one or more of any one combination of examples 2-84, 86-105, 107-126, 128-139, and 246-271), wherein said non-wetting region located at at least said portion of said second face comprises at least one hydrophobic material or lyophobic material.

Example 38

The device of example 36 (as well as subject matter of one or more of any one combination of examples 2-84, 86-105, 107-126, 128-139, and 246-271), wherein said not-wetting region located at at least said portion of said second face comprises a coating at at least a portion of said second face of said base member located between at least some of said elongated members.

Example 39

The device of example 36 (as well as subject matter of one or more of any one combination of examples 2-84, 86-105, 107-126, 128-139, and 246-271), wherein said not-wetting region located at at least said portion of said second face comprises a substrate located on or in at least a portion of said second face of said base member located between at least some of said elongated members.

Example 40

The device of example 1 (as well as subject matter of one or more of any one combination of examples 2-84, 86-105, 107-126, 128-139, and 246-271), wherein said second face is aligned so as to face the direction of gravitational force.

Example 41

The device of example 1, wherein the proximal portion of at least some of said elongated members are wider than distal portions of at least some of said elongated members.

Example 42

The device of example 1 (as well as subject matter of one or more of any one combination of examples 2-84, 86-105, 107-126, 128-139, and 246-271), wherein the proximal portion of at least some of said elongated members are narrower than distal portions of at least some of said elongated members.

Example 43

The device of example 1 (as well as subject matter of one or more of any one combination of examples 2-84, 86-105, 107-126, 128-139, and 246-271), wherein the proximal portion of at least some of said elongated members have a cross section that is substantially equal to the distal portions of at least some of said elongated members.

Example 44

The device of example 1 (as well as subject matter of one or more of any one combination of examples 2-84, 86-105, 107-126, 128-139, and 246-271), wherein the working fluid includes at least one of the following: water, oils, metal, octane, hydrocarbon, Pentane, R-245ca, R-245fa, Iso-Pentane, halogenated hydrocarbon, halogenated alkane, alkene, ketone, alcohol, or alkali metal.

Example 45

The device of example 1 (as well as subject matter of one or more of any one combination of examples 2-84, 86-105, 107-126, 128-139, and 246-271), wherein the working fluid comprises a mineral liquid.

Example 46

The device of example 1 (as well as subject matter of one or more of any one combination of examples 2-84, 86-105, 107-126, 128-139, and 246-271), wherein the working fluid comprises a synthetic liquid.

Example 47

The device of example 1 (as well as subject matter of one or more of any one combination of examples 2-84, 86-105, 107-126, 128-139, and 246-271), wherein the device comprises a working fluid and a vapor configured to provide two phase heat transfer.

Example 48

The device of example 47 (as well as subject matter of one or more of any one combination of examples 2-84, 86-105, 107-126, 128-139, and 246-271), wherein an evaporating thin film region is provided on at least some of said elongated members at the region of insertion into the working fluid.

Example 49

The device of example 48 (as well as subject matter of one or more of any one combination of examples 2-84, 86-105, 107-126, 128-139, and 246-271), wherein the evaporating thin film region is between the heat source and said reservoir.

Example 50

The device of example 49 (as well as subject matter of one or more of any one combination of examples 2-84, 86-105, 107-126, 128-139, and 246-271), wherein the thermal energy travels through said elongated members and beyond the vapor space toward the evaporating thin film region.

Example 51

The device of example 50 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 52

The device of example 48 (as well as subject matter of one or more of any one combination of examples 2-84, 86-105, 107-126, 128-139, and 246-271), wherein the evaporating thin film region is between the heat source and the working fluid.

Example 53

The device of example 52 (as well as subject matter of one or more of any one combination of examples 2-84, 86-105, 107-126, 128-139, and 246-271), wherein the thermal energy travels through said elongated members and beyond the vapor space toward the evaporating thin film region.

Example 54

The device of example 53 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 55

The device of example 1 (as well as subject matter of one or more of any one combination of examples 2-84, 86-105, 107-126, 128-139, and 246-271), wherein said base member and at least some of said elongated members are comprised of at least one of the following materials: silicon, diamond, copper, SiC (silicon carbide), graphite, silver, gold, copper, graphene, and platinum.

Example 56

The device of example 1 (as well as subject matter of one or more of any one combination of examples 2-84, 86-105, 107-126, 128-139, and 246-271), wherein said base member and at least some of said elongated members are comprised of at least one thermally-conducting non-porous solid.

Example 57

The device of example 1 (as well as subject matter of one or more of any one combination of examples 2-84, 86-105, 107-126, 128-139, and 246-271), wherein said base member and at least some of said elongated members have a layering comprising at least one of gold, platinum, copper, graphene, and silicon oxide.

Example 58

The device of example 1 (as well as subject matter of one or more of any one combination of examples 2-84, 86-105, 107-126, 128-139, and 246-271), wherein said heat source is at least one semiconductor device or electronic device.

Example 59

The device of example 58 (as well as subject matter of one or more of any one combination of examples 2-84, 86-105, 107-126, 128-139, and 246-271), wherein a plurality of said semiconductor devices form a system comprising at least one of the following: processor unit or memory unit.

Example 60

The device of example 1 (as well as subject matter of one or more of any one combination of examples 2-84, 86-105, 107-126, 128-139, and 246-271), wherein said heat source is at least one of the following: integrated circuit, concentrated thermal and optic radiation, chemical reactions, high temperature liquid/vapor flows, high velocity flows, or high velocity shear flows.

Example 61

The device of example 1 (as well as subject matter of one or more of any one combination of examples 2-84, 86-105, 107-126, 128-139, and 246-271), wherein said heat source is at least one of the following: High Performance Computing Systems, RF systems, photovoltaic system, concentrated photovoltaic system, hypersonic vehicle or craft, jet blast deflector, or turbine blade.

Example 62

The device of example 61 (as well as subject matter of one or more of any one combination of examples 2-84, 86-105, 107-126, 128-139, and 246-271), wherein said high performance computing system comprises at least one of the following: 3D Stacking computer chip, computer processor unit (CPU), graphics processor unit (GPU), or memory unit.

Example 63

The device of example 1 (as well as subject matter of one or more of any one combination of examples 2-84, 86-105, 107-126, 128-139, and 246-271), further comprising a heat exchanger in thermal communication with said heat transfer device.

Example 64

The device of example 63 (as well as subject matter of one or more of any one combination of examples 2-84, 86-105, 107-126, 128-139, and 246-271), wherein at least a portion of said heat exchanger device acts as at least one of the following: floor, wall, ceiling, beam, truss, or other structural surface of a container, electronic housing, machinery housing, tank, pool, swimming pool, environment reservoir, vehicle, ship, trailer, aircraft, watercraft, or spacecraft.

Example 65

The device of example 63 (as well as subject matter of one or more of any one combination of examples 2-84, 86-105, 107-126, 128-139, and 246-271), wherein said heat exchanger device is in thermal communication with at least one of the following: floor, wall, ceiling, beam, truss, or other structural surface of a container, electronic housing, machinery housing, tank, pool, swimming pool, environment reservoir, vehicle, ship, trailer, aircraft, watercraft, or spacecraft.

Example 66

The device of example 63 (as well as subject matter of one or more of any one combination of examples 2-84, 86-105, 107-126, 128-139, and 246-271), wherein said heat exchanger device is in mechanical communication with at least one of the following: floor, wall, ceiling, beam, truss, or other structural surface of a container, electronic housing, machinery housing, tank, pool, swimming pool, environment reservoir, vehicle, ship, trailer, aircraft, watercraft, or spacecraft.

Example 67

The device of example 1 (as well as subject matter of one or more of any one combination of examples 2-84, 86-105, 107-126, 128-139, and 246-271), further comprising: a condenser in communication with said reservoir.

Example 68

The device of example 67 (as well as subject matter of one or more of any one combination of examples 2-84, 86-105, 107-126, 128-139, and 246-271), wherein said condenser communication with said reservoir includes: at least one vapor outlet in communication with at least some of said passages; at least one liquid inlet in communication with said reservoir; or said at least one vapor outlet in communication with at least some of said passages and said at least one liquid inlet in communication with said reservoir.

Example 69

The device of example 67 (as well as subject matter of one or more of any one combination of examples 2-84, 86-105, 107-126, 128-139, and 246-271), further comprising an energy recovery unit in communication with said condenser.

Example 70

The device of example 1 (as well as subject matter of one or more of any one combination of examples 2-84, 86-105, 107-126, 128-139, and 246-271), further comprising:
at least one vapor outlet in communication with at least one of said passages; and
at least one transition passage in communication between said at least one vapor outlet and said at least one of said passages.

Example 71

The device of example 1 (as well as subject matter of one or more of any one combination of examples 2-84, 86-105, 107-126, 128-139, and 246-271), further comprising:
at least one vapor outlet in communication with at least one of said passages; and at least one liquid inlet in communication with said reservoir.

Example 72

The device of example 71 (as well as subject matter of one or more of any one combination of examples 2-84, 86-105, 107-126, 128-139, and 246-271), further comprising:
a condenser in communication with at least one of said vapor outlets to receive the vapor produced; and
said condenser comprising at least one condenser transition passages, said at least one condenser transition passages configured for receiving vapor from said at least one vapor outlet.

Example 73

The device of example 71 (as well as subject matter of one or more of any one combination of examples 2-84, 86-105, 107-126, 128-139, and 246-271), further comprising:
a condenser in communication with at least one of said vapor outlets to receive the vapor produced; and said condenser in communication with at least one of said liquid inlets to supply the liquid to said evaporator.

Example 74

The device of example 73 (as well as subject matter of one or more of any one combination of examples 2-84, 86-105, 107-126, 128-139, and 246-271), further comprising an energy recovery unit configured to convert a portion of heat leaving said condenser into useful energy.

Example 75

The device of example 74 (as well as subject matter of one or more of any one combination of examples 2-84, 86-105, 107-126, 128-139, and 246-271), wherein said energy recovery unit is a thermoelectric device.

Example 76

The device of example 67 (as well as subject matter of one or more of any one combination of examples 2-84, 86-105, 107-126, 128-139, and 246-271), further comprising an energy recovery unit configured to convert a portion of heat leaving said condenser into useful energy.

Example 77

The device of example 73 (as well as subject matter of one or more of any one combination of examples 2-84, 86-105, 107-126, 128-139, and 246-271), wherein said communication with at least one of said liquid inlets to supply the liquid to the reservoir comprises at least one conduit.

Example 78

The device of example 77 (as well as subject matter of one or more of any one combination of examples 2-84, 86-105, 107-126, 128-139, and 246-271), wherein at least one of said conduits comprise a wick structure.

Example 79

The device of example 77 (as well as subject matter of one or more of any one combination of examples 2-84, 86-105, 107-126, 128-139, and 246-271), wherein at least one of said conduits comprise a pump.

Example 80

The device of example 1 (as well as subject matter of one or more of any one combination of examples 2-84, 86-105, 107-126, 128-139, and 246-271), wherein said vapor space defined by said passages generally widens in a direction of vapor flow.

Example 81

The device of example 80 (as well as subject matter of one or more of any one combination of examples 2-84, 86-105, 107-126, 128-139, and 246-271), further comprising a central region, wherein said passages extend radially from said central region to form a pathway for the vapor accommodation, wherein the pathway is radial from said central region.

Example 82

The device of example 81 (as well as subject matter of one or more of any one combination of examples 2-84, 86-105, 107-126, 128-139, and 246-271), wherein at least one of said elongated members comprises a wall or panel.

Example 83

The device of example 81 (as well as subject matter of one or more of any one combination of examples 2-84, 86-105, 107-126, 128-139, and 246-271), wherein at least one of said elongated members comprises a pin, post, or rod.

Example 84

The device of example 80 (as well as subject matter of one or more of any one combination of examples 2-84, 86-105, 107-126, 128-139, and 246-271), wherein said passages are generally parallel and the number of said elongated members configured to form said passages is reduced in said direction of vapor flow to accommodate said widening of said passages.

Example 85

An aspect of an embodiment of present invention provides, but not limited thereto, a two phase heat transfer device. The device may comprise: a reservoir configured for carrying a working fluid; a base member, said base member configured to receive thermal energy from a heat source; elongated members extending distally away from said base member and configured to define respective passages between adjacent elongated members; said elongated members include a proximal region and a distal region, wherein said distal region is configured to be at least partially inserted into the working fluid; and said passages are configured to accommodate vapor produced from the working fluid so as to define a vapor space.

Example 86

The device of example 85 (as well as subject matter of one or more of any one combination of examples 2-84, 86-105, 107-126, 128-139, and 246-271), wherein said base member configured to be in communication with and adjacent to the heat source.

Example 87

The device of example 85 (as well as subject matter of one or more of any one combination of examples 2-84, 86-105, 107-126, 128-139, and 246-271), wherein at least some of said passages are channels, respectively.

Example 88

The device of example 87 (as well as subject matter of one or more of any one combination of examples 2-84, 86-105, 107-126, 128-139, and 246-271), wherein at least some of said channels are microchannels or nanochannels, or a combination of microchannels and nanochannels.

Example 89

The device of example 85 (as well as subject matter of one or more of any one combination of examples 2-84, 86-105, 107-126, 128-139, and 246-271), wherein the device comprises a working fluid and a vapor configured to provide two phase heat transfer.

Example 90

The device of example 85 (as well as subject matter of one or more of any one combination of examples 2-84, 86-105, 107-126, 128-139, and 246-271), wherein said passages are configured to confine vapor between said reservoir and said base member.

Example 91

The device of example 90 (as well as subject matter of one or more of any one combination of examples 2-84, 86-105, 107-126, 128-139, and 246-271), wherein an evaporating thin film region is provided on at least some of said elongated members at the region of insertion into the working fluid.

Example 92

The device of example 91 (as well as subject matter of one or more of any one combination of examples 2-84, 86-105, 107-126, 128-139, and 246-271), wherein the evaporating thin film region is between the heat source and said reservoir.

Example 93

The device of example 92 (as well as subject matter of one or more of any one combination of examples 2-84, 86-105, 107-126, 128-139, and 246-271), wherein the thermal energy travels through said elongated members and beyond the vapor space toward the evaporating thin film region.

Example 94

The device of example 93 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 95

The device of example 91 (as well as subject matter of one or more of any one combination of examples 2-84, 86-105, 107-126, 128-139, and 246-271), wherein the evaporating thin film region is between the heat source and the working fluid.

Example 96

The device of example 95 (as well as subject matter of one or more of any one combination of examples 2-84, 86-105, 107-126, 128-139, and 246-271), wherein the thermal energy travels through said elongated members and beyond the vapor space toward the evaporating thin film region.

Example 97

The device of example 96 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 98

The device of example 85 (as well as subject matter of one or more of any one combination of examples 2-84, 86-105, 107-126, 128-139, and 246-271), wherein said vapor space is located between the heat source and said reservoir.

Example 99

The device of example 85 (as well as subject matter of one or more of any one combination of examples 2-84, 86-105, 107-126, 128-139, and 246-271), wherein said vapor space is located between the heat source and the working fluid.

Example 100

The device of example 1 (as well as subject matter of one or more of any one combination of examples 2-84, 86-105, 107-126, 128-139, and 246-271), wherein said heat source is at least one semiconductor device or electronic device.

Example 101

The device of example 100 (as well as subject matter of one or more of any one combination of examples 2-84, 86-105, 107-126, 128-139, and 246-271), wherein a plurality of said semiconductor devices form a system comprising at least one of the following: processor unit or memory unit.

Example 102

The device of example 1 (as well as subject matter of one or more of any one combination of examples 2-84, 86-105, 107-126, 128-139, and 246-271), wherein said heat source is at least one of the following: integrated circuit, concentrated thermal and optic radiation, chemical reactions, high temperature liquid/vapor flows, high velocity flows, or high velocity shear flows.

Example 103

The device of example 1 (as well as subject matter of one or more of any one combination of examples 2-84, 86-105, 107-126, 128-139, and 246-271), wherein said heat source is at least one of the following: High Performance Computing Systems, RF systems, photovoltaic system, concentrated photovoltaic system, hypersonic vehicle or craft, jet blast deflector, or turbine blade.

Example 104

The device of example 103 (as well as subject matter of one or more of any one combination of examples 2-84, 86-105, 107-126, 128-139, and 246-271), wherein said high performance computing system comprises at least one of the following: 3D Stacking computer chip, computer processor unit (CPU), graphics processor unit (GPU), or memory unit.

Example 105

The device of example 1 (as well as subject matter of one or more of any one combination of examples 2-84, 86-105, 107-126, 128-139, and 246-271), further comprising a heat exchanger in thermal communication with said heat transfer device.

Example 106

An aspect of an embodiment of present invention provides, but not limited thereto, a two phase heat transfer device. The device may comprise: a reservoir configured for carrying a working fluid; a base member, said base member configured to receive thermal energy from a heat source; elongated members extending distally away from said base member and configured to define respective passages between adjacent elongated members; and said elongated members include a proximal region and a distal region, wherein said distal region is configured to be at least partially inserted into the reservoir.

Example 107

The device of example 106 (as well as subject matter of one or more of any one combination of examples 2-84, 86-105, 107-126, 128-139, and 246-271), wherein said base member configured to be in communication with and adjacent to the heat source.

Example 108

The device of example 106 (as well as subject matter of one or more of any one combination of examples 2-84, 86-105, 107-126, 128-139, and 246-271), wherein at least some of said passages are channels, respectively.

Example 109

The device of example 108 (as well as subject matter of one or more of any one combination of examples 2-84, 86-105, 107-126, 128-139, and 246-271), wherein at least some of said channels are microchannels or nanochannels, or a combination of microchannels and nanochannels.

Example 110

The device of example 106 (as well as subject matter of one or more of any one combination of examples 2-84, 86-105, 107-126, 128-139, and 246-271), wherein the device comprises a working fluid to be carried by said reservoir and a vapor configured to provide two phase heat transfer.

Example 111

The device of example 110 (as well as subject matter of one or more of any one combination of examples 2-84, 86-105, 107-126, 128-139, and 246-271), wherein an evaporating thin film region is provided on at least some of said elongated members at the region of insertion into the working fluid.

Example 112

The device of example 111 (as well as subject matter of one or more of any one combination of examples 2-84, 86-105, 107-126, 128-139, and 246-271), wherein the evaporating thin film region is between the heat source and said reservoir.

Example 113

The device of example 112 (as well as subject matter of one or more of any one combination of examples 2-84, 86-105, 107-126, 128-139, and 246-271), wherein the thermal energy travels through said elongated members and beyond the vapor space toward the evaporating thin film region.

Example 114

The device of example 113 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 115

The device of example 111 (as well as subject matter of one or more of any one combination of examples 2-84, 86-105, 107-126, 128-139, and 246-271), wherein the evaporating thin film region is between the heat source and the working fluid.

Example 116

The device of example 115 (as well as subject matter of one or more of any one combination of examples 2-84, 86-105, 107-126, 128-139, and 246-271), wherein the thermal energy travels through said elongated members and beyond the vapor space toward the evaporating thin film region.

Example 117

The device of example 116 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 118

The device of example 110 (as well as subject matter of one or more of any one combination of examples 2-84, 86-105, 107-126, 128-139, and 246-271), wherein said passages are configured to confine vapor between said reservoir and said base member.

Example 119

The device of example 118 (as well as subject matter of one or more of any one combination of examples 2-84, 86-105, 107-126, 128-139, and 246-271), wherein said passages accommodate the vapor produced from the working fluid so as to define a vapor space, and wherein said vapor space is located between the heat source and said reservoir.

Example 120

The device of example 118 (as well as subject matter of one or more of any one combination of examples 2-84, 86-105, 107-126, 128-139, and 246-271), wherein said passages accommodate the vapor produced from the working fluid so as to define a vapor space, and wherein said vapor space is located between the heat source and the working fluid.

Example 121

The device of example 106 (as well as subject matter of one or more of any one combination of examples 2-84, 86-105, 107-126, 128-139, and 246-271), wherein said heat source is at least one semiconductor device or electronic device.

Example 122

The device of example 121 (as well as subject matter of one or more of any one combination of examples 2-84, 86-105, 107-126, 128-139, and 246-271), wherein a plurality of said semiconductor devices form a system comprising at least one of the following: processor unit or memory unit.

Example 123

The device of example 106 (as well as subject matter of one or more of any one combination of examples 2-84, 86-105, 107-126, 128-139, and 246-271), wherein said heat source is at least one of the following: integrated circuit, concentrated thermal and optic radiation, chemical reactions, high temperature liquid/vapor flows, high velocity flows, or high velocity shear flows.

Example 124

The device of example 106 (as well as subject matter of one or more of any one combination of examples 2-84, 86-105, 107-126, 128-139, and 246-271), wherein said heat source is at least one of the following: High Performance Computing Systems, RF systems, photovoltaic system, concentrated photovoltaic system, hypersonic vehicle or craft, jet blast deflector, or turbine blade.

Example 125

The device of example 124 (as well as subject matter of one or more of any one combination of examples 2-84, 86-105, 107-126, 128-139, and 246-271), wherein said high performance computing system comprises at least one of the following: 3D Stacking computer chip, computer processor unit (CPU), graphics processor unit (GPU), or memory unit.

Example 126

The device of example 106 (as well as subject matter of one or more of any one combination of examples 2-84, 86-105, 107-126, 128-139, and 246-271), further comprising a heat exchanger in thermal communication with said heat transfer device.

Example 127

An aspect of an embodiment of present invention provides, but not limited thereto, a two phase heat transfer device. The device may comprise: reservoir configured for carrying a working fluid; a base member, said base member configured to receive thermal energy from a heat source; elongated members extending distally away from said base member and configured to define respective passages between adjacent elongated members; and at least some of said elongated members are configured to be at least partially inserted into the reservoir.

Example 128

The device of example 127 (as well as subject matter of one or more of any one combination of examples 2-84, 86-105, 107-126, 128-139, and 246-271), wherein said base member configured to be in communication with and adjacent to the heat source.

Example 129

The device of example 127 (as well as subject matter of one or more of any one combination of examples 2-84, 86-105, 107-126, 128-139, and 246-271), wherein at least some of said passages are channels, respectively.

Example 130

The device of example 129 (as well as subject matter of one or more of any one combination of examples 2-84, 86-105, 107-126, 128-139, and 246-271), wherein at least some of said channels are microchannels or nanochannels, or a combination of microchannels and nanochannels.

Example 131

The device of example 127 (as well as subject matter of one or more of any one combination of examples 2-84, 86-105, 107-126, 128-139, and 246-271), wherein the device comprises a working fluid to be carried by said reservoir and a vapor configured to provide two phase heat transfer.

Example 132

The device of example 131 (as well as subject matter of one or more of any one combination of examples 2-84, 86-105, 107-126, 128-139, and 246-271), wherein an evaporating thin film region is provided on at least some of said elongated members at the region of insertion into the working fluid.

Example 133

The device of example 132 (as well as subject matter of one or more of any one combination of examples 2-84, 86-105, 107-126, 128-139, and 246-271), wherein the evaporating thin film region is between the heat source and said reservoir.

Example 134

The device of example 127 (as well as subject matter of one or more of any one combination of examples 2-84, 86-105, 107-126, 128-139, and 246-271), wherein said heat source is at least one semiconductor device or electronic device.

Example 135

The device of example 134 (as well as subject matter of one or more of any one combination of examples 2-84, 86-105, 107-126, 128-139, and 246-271), wherein a plurality of said semiconductor devices form a system comprising at least one of the following: processor unit or memory unit.

Example 136

The device of example 127 (as well as subject matter of one or more of any one combination of examples 2-84, 86-105, 107-126, 128-139, and 246-271), wherein said heat source is at least one of the following: integrated circuit, concentrated thermal and optic radiation, chemical reactions, high temperature liquid/vapor flows, high velocity flows, or high velocity shear flows.

Example 137

The device of example 127 (as well as subject matter of one or more of any one combination of examples 2-84, 86-105, 107-126, 128-139, and 246-271), wherein said heat source is at least one of the following: High Performance Computing Systems, RF systems, photovoltaic system, concentrated photovoltaic system, hypersonic vehicle or craft, jet blast deflector, or turbine blade.

Example 138

The device of example 137 (as well as subject matter of one or more of any one combination of examples 2-84, 86-105, 107-126, 128-139, and 246-271), wherein said high performance computing system comprises at least one of the following: 3D Stacking computer chip, computer processor unit (CPU), graphics processor unit (GPU), or memory unit.

Example 139

The device of example 127 (as well as subject matter of one or more of any one combination of examples 2-84, 86-105, 107-126, 128-139, and 246-271), further comprising a heat exchanger in thermal communication with said heat transfer device.

Example 140

An aspect of an embodiment of present invention provides, but not limited thereto, a method of making a two phase heat transfer device. The method may comprise: providing a reservoir configured for carrying a working fluid; providing a base member configured to receive thermal energy from a heat source; providing elongated members extending distally away from said base member and configured to define respective passages between adjacent elongated members, said elongated members include a proximal region and a distal region; and configuring said distal region of said elongated members to be able to at least partially be inserted into the working fluid.

Example 141

The method of example 140, wherein said base member is configured to be in communication with and adjacent to the heat source.

Example 141A

The method of making a two phase heat transfer device or portions thereof using techniques known to those skilled in the art to produce any the devices provided in examples 1, 85, 106, 127, 142, 151, 162, 245, 274, 288, and 304.

Example 141B

The method of making a two phase heat transfer device or portions thereof using techniques known to those skilled in the art to produce any the devices or apparatus provided in examples 2-84, 86-105, 107-126, 128-139, and 246-271.

Example 141C

The method of making a two phase heat transfer device or apparatus or portions thereof using techniques known to those skilled in the art to produce any the devices or apparatus provided in examples 143-150, 152-161, 163-172, 275-287, 289-303, and 305-319.

Example 142

An aspect of an embodiment of present invention provides, but not limited thereto, an apparatus that may comprise: a reservoir configured for carrying a working fluid; an integrated circuit (IC) die. The IC die may comprise a heat source and a two phase heat transfer device. And wherein the two phase heat transfer device may comprise: a base member, said base member configured to receive thermal energy from the heat source; elongated members extending distally away from said base member and configured to define respective passages between adjacent elongated members; at least some said elongated members configured to be at least partially inserted into the working fluid; and said passages are configured to accommodate vapor produced from the working fluid so as to define a vapor space.

Example 143

The apparatus of example 142 (as well as subject matter of one or more of any one combination of examples 2-84, 86-105, 107-126, 128-139, 143-150, 152-161, 163-172, 275-287, 289-303, and 305-319), wherein said IC die is in communication with a chip carrier.

Example 144

The apparatus of example 143 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 145

The apparatus of example 144 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 146

The apparatus of example 142 (as well as subject matter of one or more of any one combination of examples 2-84, 86-105, 107-126, 128-139, 143-150, 152-161, 163-172, 275-287, 289-303, and 305-319), wherein at least some of said passages comprise microchannels, respectively.

Example 147

The apparatus of example 142 (as well as subject matter of one or more of any one combination of examples 2-84, 86-105, 107-126, 128-139, 143-150, 152-161, 163-172, 275-287, 289-303, and 305-319), wherein at least some of said passages comprise nanochannels, respectively.

Example 148

The apparatus of example 142 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 149

The apparatus of example 148 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 150

The apparatus of example 148 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 151

An aspect of an embodiment of present invention provides, but not limited thereto, an apparatus that may comprise: a first reservoir configured for carrying a working fluid; a first integrated circuit (IC) die, said IC die comprises a heat source and a two phase heat transfer device. And wherein said two phase heat transfer device of said first IC die comprises: a base member, said base member configured to receive thermal energy from the heat source; elongated members extending distally away from said base member and configured to define respective passages between adjacent elongated members; at least some said elongated members configured to be at least partially inserted into the working fluid; and said passages are configured to accommodate vapor produced from the working fluid so as to define a vapor space. The apparatus further comprises: a second reservoir configured for carrying a working fluid; a second integrated circuit (IC) die, said IC die comprises a heat source and a two phase heat transfer device. And wherein the two phase heat transfer device of said second IC die may comprise: a base member, said base member configured to receive thermal energy from the heat source; elongated members extending distally away from said base member and configured to define respective passages between adjacent elongated members; at least some said elongated members configured to be at least partially inserted into the working fluid; and said passages are configured to accommodate vapor produced from the working fluid so as to define a vapor space. Moreover, the first IC die and said second IC operatively coupled together.

Example 152

The apparatus of example 151 (as well as subject matter of one or more of any one combination of examples 2-84, 86-105, 107-126, 128-139, 143-150, 152-161, 163-172, 275-287, 289-303, and 305-319), wherein said first IC die is in communication with a chip carrier.

Example 153

The apparatus of example 152 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 154

The apparatus of example 153 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 155

The apparatus of example 151 (as well as subject matter of one or more of any one combination of examples 2-84, 86-105, 107-126, 128-139, 143-150, 152-161, 163-172, 275-287, 289-303, and 305-319), wherein at least some of said passages comprises microchannels, respectively.

Example 156

The apparatus of example 151 (as well as subject matter of one or more of any one combination of examples 2-84, 86-105, 107-126, 128-139, 143-150, 152-161, 163-172, 275-287, 289-303, and 305-319), wherein said at least some of said passages comprises nanochannels, respectively.

Example 157

The apparatus of example 151 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 158

The apparatus of example 157 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 159

The apparatus of example 157 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 160

The apparatus of example 151 (as well as subject matter of one or more of any one combination of examples 2-84, 86-105, 107-126, 128-139, 143-150, 152-161, 163-172, 275-287, 289-303, and 305-319), wherein said first IC die and said second IC are electrically connected to one another.

Example 161

The apparatus of example 151 (as well as subject matter of one or more of any one combination of examples 2-84, 86-105, 107-126, 128-139, 143-150, 152-161, 163-172, 275-287, 289-303, and 305-319), further comprising a thermal insulator layer disposed between said first IC die and said second IC.

Example 162

An aspect of an embodiment of present invention provides, but not limited thereto, an apparatus that may comprise: a reservoir configured for carrying a working fluid; an integrated circuit (IC) die, said IC die comprises a heat source; a two phase heat transfer device thermally connected to said IC die. And wherein said two phase heat transfer device may comprise: a base member, said base member configured to receive thermal energy from the heat source; elongated members extending distally away from said base member and configured to define respective passages between adjacent elongated members; at least some said elongated members configured to be at least partially inserted into the working fluid; and said passages are configured to accommodate vapor produced from the working fluid so as to define a vapor space.

Example 163

The apparatus of example 162 (as well as subject matter of one or more of any one combination of examples 2-84, 86-105, 107-126, 128-139, 143-150, 152-161, 163-172, 275-287, 289-303, and 305-319), wherein said IC die is in communication with a chip carrier.

Example 164

The apparatus of example 163 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 165

The apparatus of example 164 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 166

The apparatus of example 162 (as well as subject matter of one or more of any one combination of examples 2-84, 86-105, 107-126, 128-139, 143-150, 152-161, 163-172, 275-287, 289-303, and 305-319), wherein at least some of said passages comprise microchannels, respectively.

Example 167

The apparatus of example 162 (as well as subject matter of one or more of any one combination of examples 2-84, 86-105, 107-126, 128-139, 143-150, 152-161, 163-172, 275-287, 289-303, and 305-319), wherein at least some of said passages comprise nanochannels, respectively.

Example 168

The apparatus of example 162 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 169

The apparatus of example 168 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 170

The apparatus of example 168 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 171

The apparatus of example 170 (as well as subject matter of one or more of any one combination of examples 2-84, 86-105, 107-126, 128-139, 143-150, 152-161, 163-172, 275-287, 289-303, and 305-319), wherein said integrated circuit (IC) die and a two phase heat transfer device are mechanically connected with to one another.

Example 172

The apparatus of examples 171 (as well as subject matter of one or more of any one combination of examples 2-84, 86-105, 107-126, 128-139, 143-150, 152-161, 163-172, 275-287, 289-303, and 305-319), wherein said mechanical connection includes an adhesive.

Example 173

An aspect of an embodiment of present invention provides, but not limited thereto, a computer implemented method for estimating the performance characteristics of a thin-film heat transfer device. The method may comprise: receiving characteristic of said heat transfer device; determining a thickness of a non-evaporating portion of a meniscus formed by a liquid on a surface of channels of said heat transfer device; determining a value for a thickness profile matching parameter; performing a first algorithm to determine a thickness profile of an evaporating portion of said meniscus formed by said liquid on said surface, said first algorithm based on said thickness profile matching parameter and an assumption that said non-evaporating portion of the meniscus has a curved profile; determining that said thickness profile of said evaporating portion is within a threshold range; performing a second algorithm to determine performance characteristics of said heat transfer device; and providing said performance characteristics of said heat transfer device to an output device.

Example 174

The method of example 173 (as well as subject matter of one or more of any one combination of examples 174-190, 192-206, 243, or 244), wherein said performance characteristics may include any one or more of:
 a) total heat dissipation of said heat transfer device;
 b) likelihood of choking or entrainment in any of said channels of said heat transfer device;
 c) possible location of choking in any of said channels of said heat transfer device; or
 d) specific statistics for any of said channels.

Example 175

The method of example 174 (as well as subject matter of one or more of any one combination of examples 174-190, 192-206, 243, or 244), wherein said specific statistics of any of said channels may include any one or more of:
 a) vapor velocity at at least one point in any of said channels;

b) vapor volumetric flow rates at at least one point in any of said channels; or c) amount of heat dissipation at at least one point in any of said channels.

Example 176

The method of example 173 (as well as subject matter of one or more of any one combination of examples 174-190, 192-206, 243, or 244), wherein said output device includes storage, memory, network, or a display.

Example 177

The method of example 173 (as well as subject matter of one or more of any one combination of examples 174-190, 192-206, 243, or 244), wherein said heat transfer device characteristics include at least one of:
a) a liquid,
b) a substrate material,
c) a channel width,
d) a wall temperature,
e) an operating pressure, and
f) an operating temperature.

Example 178

The method of example 173 (as well as subject matter of one or more of any one combination of examples 174-190, 192-206, 243, or 244), wherein said determining that said thickness profile of said evaporating portion is within a threshold range comprises:

determining, based on said thickness profile, a function describing the curvature of the meniscus;

calculating, using said function describing the curvature of the meniscus, values for the curvature of the meniscus along said thickness profile until a constant curvature value is obtained; and determining whether said constant value for the curvature of the meniscus is greater than or equal to a lower bound of said threshold range and less than or equal to an upper bound of said threshold range.

Example 179

The method of example 178 (as well as subject matter of one or more of any one combination of examples 174-190, 192-206, 243, or 244), wherein:

said lower bound of said threshold range equals 0.99 times 2 divided by said channel width, and said upper bound of said threshold range equals 1.01 times 2 divided by said channel width.

Example 180

The method of example 178 (as well as subject matter of one or more of any one combination of examples 174-190, 192-206, 243, or 244), wherein:

said lower bound of said threshold range equals $(1-\Delta_1)$ times 2 divided by said channel width, and said upper bound of said threshold range equals $(1+\Delta_2)$ times 2 divided by said channel width.

Example 181

The method of example 173 (as well as subject matter of one or more of any one combination of examples 174-190, 192-206, 243, or 244), wherein said first algorithm comprises:

defining a set of boundary conditions, said boundary conditions represented by a set of equations:

$$\delta(0)=\delta_0(1+\varepsilon_0) \qquad a)$$

$$\delta'(0)=\delta_0\varepsilon_0 B \qquad b)$$

$$\delta''(0)=\delta_0\varepsilon_0 B^2, \text{ and} \qquad c)$$

$$\delta^{(3)}(0)=\delta_0\varepsilon_0 B^2; \text{ and} \qquad d)$$

wherein $\varepsilon_0$ is said thickness profile matching parameter, wherein A is a dispersion constant, wherein $\delta$ is a surface tension value for the liquid, and wherein $\delta_o$ is said thickness of said non-evaporating portion of said meniscus; and solving, using said set of boundary conditions a fourth order ordinary differential equation for said thickness profile of said evaporating portion of the meniscus.

Example 182

The method of example 173 (as well as subject matter of one or more of any one combination of examples 174-190, 192-206, 243, or 244), wherein said second algorithm comprises solving a system of equations to determine said performance characteristics of said heat transfer device, said system of equations including:

$$\frac{3v}{\delta^2}\dot{m}_{evap}(x) = \frac{3A\delta'^2}{\delta^4} - \frac{3A\delta''}{\delta^3} + \frac{3\sigma\delta'(-3\delta'\delta''^2 + \delta^{(3)} + \delta'^2\delta^{(3)})}{(1+\delta'^2)^{5/2}} + \qquad a)$$

$$\frac{\sigma\delta\left[3(-1+4\delta'^2)\delta''^3 - 9\delta'(1+\delta'^2)\delta''\delta^{(3)} + (1+\delta'^2)^2\delta^{(4)}\right]}{(1+\delta'^2)^{7/2}}.$$

$$\dot{m}_{evap} = \frac{2c}{2-c}\left(\frac{M}{2\pi R}\right)^{\frac{1}{2}}\left(\frac{P_{eq}(T_{lv})}{T_{lv}^{\frac{1}{2}}} - \frac{P_v}{T_v^{\frac{1}{2}}}\right). \qquad b)$$

and $$P_{eq}(x) = P_{sat}(T_{lv})\exp\left[\frac{P_{eq}(x) - P_{sat}(T_{lv}) - P_c(x) - P_d(x)}{\rho_l RT_{lv}/M}\right]. \qquad c)$$

$$\dot{m}_{evap}(x) = \frac{k_l(T_w - T_{lv}(x))}{\delta(x)h_{fg}}.; \qquad d)$$

and wherein A is a dispersion constant, wherein $\rho_l$ is the density of said liquid, wherein $T_w$ is the temperature of the wall, wherein R is the gas constant, wherein $\sigma$ is a surface tension of said liquid, wherein $P_{sat}$ is a saturation pressure, wherein $P_v$ is a vapor pressure, wherein $k_l$ is the thermal conductivity of said liquid, wherein c is the evaporation constant, wherein M is the molecular mass of said liquid, wherein $\delta(x)$ represents said thickness profile of said evaporating portion of said meniscus as a function of position along said profile, wherein $\dot{m}_{evap}(x)$ represents an evaporative mass flux as a function of position along said profile, wherein $T_{lv}(x)$ represents a liquid-vapor interface temperature as a function of position along said profile, wherein $P_{eq}(x)$ represents equilibrium vapor pressure as a function of position along said profile, wherein $P_c(x)$ represents a capillary pressure as a function of position along said profile, and wherein $P_d(x)$ represents the disjoining pressure as a function of position along said profile.

Example 183

The method of example 173 (as well as subject matter of one or more of any one combination of examples 174-190, 192-206, 243, or 244), wherein at least one of said received heat transfer device characteristics includes an array of values, each value in said array of values for said at least one characteristic representing an alternate heat transfer device design, and said method further comprises determining at least one value of in said array of values which produces optimal performance characteristics for said heat transfer device.

Example 184

The method of example 173 (as well as subject matter of one or more of any one combination of examples 174-190, 192-206, 243, or 244), wherein said received heat transfer device characteristics include a graphical representation of at least one aspect of said heat transfer device and further comprises determining at least one value for an heat transfer device characteristic from said graphical representation.

Example 185

The method of example 183 (as well as subject matter of one or more of any one combination of examples 174-190, 192-206, 243, or 244), wherein providing said performance characteristics to an output device includes:

providing a graph, wherein one axis of said graph represents said array of values; and indicating on said graph said at least one value of in said array of values which provided optimal performance characteristics for said heat transfer device.

Example 186

The method of example 173 (as well as subject matter of one or more of any one combination of examples 174-190, 192-206, 243, or 244), wherein said second algorithm includes determining a total vapor volumetric flow rate at at least one point within a channel of said heat transfer device.

Example 187

The method of example 186 (as well as subject matter of one or more of any one combination of examples 174-190, 192-206, 243, or 244), wherein said second algorithm includes determining, based on a volume of said channel, whether vapor choking is likely to occur in said channel of said heat transfer device.

Example 188

The method of example 186 (as well as subject matter of one or more of any one combination of examples 174-190, 192-206, 243, or 244), wherein said second algorithm includes determining whether liquid entrainment is likely to occur in vapor flowing out of said channel of said heat transfer device.

Example 189

The method of example 186 (as well as subject matter of one or more of any one combination of examples 174-190, 192-206, 243, or 244), wherein said second algorithm includes determining, based on a volume of said channel, whether vapor choking is likely to occur in said channel of said heat transfer device.

Example 190

The method of example 189 (as well as subject matter of one or more of any one combination of examples 174-190, 192-206, 243, or 244), wherein said optimal performance characteristics for said heat transfer device include characteristics that a) produce a highest value for evaporative heat flux and b) do not cause choking to occur.

Example 191

An aspect of an embodiment of present invention provides, but not limited thereto, a computer implemented method for estimating the performance characteristics of a thin-film heat transfer device. The method may comprise: receiving characteristics of said heat transfer device; determining a thickness of a non-evaporating portion of a meniscus formed by a liquid on a surface of channels of said heat transfer device; determining a value for a thickness profile matching parameter; performing a first algorithm to determine a thickness profile of an evaporating portion of said meniscus formed by said liquid on said surface, said first algorithm based on said thickness profile matching parameter an assumption that said non-evaporating portion of the meniscus has a curved profile; determining that said first thickness profile of said evaporating portion is not within a threshold range; choosing a second value for said thickness profile matching parameter; performing said first algorithm to determine a second thickness profile of an evaporating portion of said meniscus based on the second value for said thickness profile matching parameter; determining that said second thickness profile of said evaporating portion is within said threshold range; performing a second algorithm to determine performance characteristics of said heat transfer device; and providing said performance characteristics of said heat transfer device to an output device.

Example 192

The method of example 191 (as well as subject matter of one or more of any one combination of examples 174-190, 192-206, 243, or 244), wherein said output device includes storage, memory, network, or a display.

Example 193

The method of example 191 (as well as subject matter of one or more of any one combination of examples 174-190, 192-206, 243, or 244), wherein said heat transfer device characteristics include at least one of:
  a) a liquid,
  b) a substrate material,
  c) a channel width,
  d) a wall temperature,
  e) an operating pressure, and
  f) an operating temperature.

Example 194

The method of example 191 (as well as subject matter of one or more of any one combination of examples 174-190, 192-206, 243, or 244), wherein said determining that said thickness profile of said evaporating portion is within a threshold range comprises:

determining, based on said thickness profile, a function describing the curvature of the meniscus;

calculating, using said function describing the curvature of the meniscus, values for the curvature of the meniscus along said thickness profile until a constant curvature value is obtained; and determining whether said constant value for the curvature of the meniscus is greater than or equal to a lower bound of said threshold range and less than or equal to an upper bound of said threshold range.

Example 195

The method of example 194 (as well as subject matter of one or more of any one combination of examples 174-190, 192-206, 243, or 244), wherein:

said lower bound of said threshold range equals 0.99 times 2 divided by said channel width, and said upper bound of said threshold range equals 1.01 times 2 divided by said channel width.

Example 196

The method of example 194, wherein:

said lower bound of said threshold range equals $(1-\Delta_1)$ times 2 divided by said channel width, and said upper bound of said threshold range equals $(1+\Delta_2)$ times 2 divided by said channel width.

Example 197

The method of example 191 (as well as subject matter of one or more of any one combination of examples 174-190, 192-206, 243, or 244), wherein said first algorithm comprises:

defining a set of boundary conditions, said boundary conditions represented by a set of equations:

$$\delta(0)=\delta_0(1+\varepsilon_0) \quad \text{a)}$$

$$\delta'(0)=\delta_0\varepsilon_0 B \quad \text{b)}$$

$$\delta''(0)=\delta_0\varepsilon_0 B^2, \text{ and} \quad \text{c)}$$

$$\delta^{(3)}(0)=\delta_0\varepsilon_0 B^2; \text{ and} \quad \text{d)}$$

wherein $\varepsilon_0$ is said thickness profile matching parameter,
wherein A is a dispersion constant,
wherein $\delta$ is a surface tension value for the liquid, and
wherein $\delta_o$ is said thickness of said non-evaporating portion of said meniscus; and solving, using said set of boundary conditions a fourth order ordinary differential equation for said thickness profile of said evaporating portion of the meniscus.

Example 198

The method of example 191 (as well as subject matter of one or more of any one combination of examples 174-190, 192-206, 243, or 244), wherein said second algorithm comprises solving a system of equations to determine said performance characteristics of said heat transfer device, said system of equations including:

$$\frac{3\nu}{\delta^2}\dot{m}_{evap}(x) = \frac{3A\delta'^2}{\delta^4} - \frac{3A\delta''}{\delta^3} + \frac{3\sigma\delta'(-3\delta'\delta''^2 + \delta^{(3)} + \delta'^2\delta^{(3)})}{(1+\delta'^2)^{5/2}} + $$
$$\frac{\sigma\delta[3(-1+4\delta'^2)\delta''^3 - 9\delta'(1+\delta'^2)\delta''\delta^{(3)} + (1+\delta'^2)^2\delta^{(4)}]}{(1+\delta'^2)^{7/2}}. \quad \text{a)}$$

$$\dot{m}_{evap} = \frac{2c}{2-c}\left(\frac{M}{2\pi R}\right)^{\frac{1}{2}}\left(\frac{P_{eq}(T_{lv})}{T_{lv}^{\frac{1}{2}}} - \frac{P_v}{T_v^{\frac{1}{2}}}\right). \quad \text{b)}$$

and $$P_{eq}(x) = P_{sat}(T_{lv})\exp\left[\frac{P_{eq}(x) - P_{sat}(T_{lv}) - P_c(x) - P_d(x)}{\rho_l RT_{lv}/M}\right]. \quad \text{c)}$$

$$\dot{m}_{evap}(x) = \frac{k_l(T_w - T_{lv}(x))}{\delta(x)h_{fg}}, ; \quad \text{d)}$$

and
wherein A is a dispersion constant,
wherein $\rho_l$ is the density of said liquid,
wherein $T_w$ is the temperature of the wall,
wherein R is the gas constant,
wherein $\sigma$ is a surface tension of said liquid,
wherein $P_{sat}$ is a saturation pressure,
wherein $P_v$ is a vapor pressure,
wherein $k_l$ is the thermal conductivity of said liquid,
wherein c is the evaporation constant,
wherein M is the molecular mass of said liquid,
wherein $\delta(x)$ represents said thickness profile of said evaporating portion of said meniscus as a function of position along said profile, wherein $\dot{m}_{evap}(x)$ represents an evaporative mass flux as a function of position along said profile,
wherein $T_{lv}(x)$ represents a liquid-vapor interface temperature as a function of position along said profile,
wherein $P_{eq}(x)$ represents equilibrium vapor pressure as a function of position along said profile,
wherein $P_c(x)$ represents a capillary pressure as a function of position along said profile, and
wherein $P_d(x)$ represents the disjoining pressure as a function of position along said profile.

Example 199

The method of example 191 (as well as subject matter of one or more of any one combination of examples 174-190, 192-206, 243, or 244), wherein at least one of said received heat transfer device characteristics includes an array of values, each value in said array of values for said at least one characteristic representing an alternate heat transfer device design, and said method further comprises determining at least one value of in said array of values which produces optimal performance characteristics for said heat transfer device.

Example 200

The method of example 191 (as well as subject matter of one or more of any one combination of examples 174-190, 192-206, 243, or 244), wherein said received heat transfer device characteristics include a graphical representation of at least one aspect of said heat transfer device and further comprises determining at least one value for an heat transfer device characteristic from said graphical representation.

Example 201

The method of example 199 (as well as subject matter of one or more of any one combination of examples 174-190,

87

192-206, 243, or 244), wherein said providing said performance characteristics to an output device includes:
providing a graph, wherein one axis of said graph represents said array of values; and
indicating on said graph said at least one value of in said array of values which provided optimal performance characteristics for said heat transfer device.

Example 202

The method of example 191 (as well as subject matter of one or more of any one combination of examples 174-190, 192-206, 243, or 244), wherein said second algorithm includes determining a total vapor volumetric flow rate at at least one point within a channel of said heat transfer device.

Example 203

The method of example 202 (as well as subject matter of one or more of any one combination of examples 174-190, 192-206, 243, or 244), wherein said second algorithm includes determining, based on a volume of said channel, whether vapor choking is likely to occur in said channel of said heat transfer device.

Example 204

The method of example 202 (as well as subject matter of one or more of any one combination of examples 174-190, 192-206, 243, or 244), wherein said second algorithm includes determining whether liquid entrainment is likely to occur in vapor flowing out of said channel of said heat transfer device.

Example 205

The method of example 202 (as well as subject matter of one or more of any one combination of examples 174-190, 192-206, 243, or 244), wherein the second algorithm includes determining, based on a volume of said channel, whether vapor choking is likely to occur in said channel of said heat transfer device.

Example 206

The method of example 205 (as well as subject matter of one or more of any one combination of examples 174-190, 192-206, 243, or 244), wherein optimal performance characteristics for said heat transfer device include characteristics that a) produce a highest value for evaporative heat flux and b) do not cause choking to occur.

Example 207

An aspect of an embodiment of present invention provides, but not limited thereto, a non-transitory computer readable medium including instructions executable by a processor for estimating the performance characteristics of a thin-film heat transfer device. The instructions may comprise: receiving characteristics of heat transfer device; determining a thickness of a non-evaporating portion of a meniscus formed by a liquid on a surface of channels of said heat transfer device; determining a value for a thickness profile matching parameter; performing a first algorithm to determine a thickness profile of an evaporating portion of said meniscus formed by said liquid on said surface, said first algorithm based on said thickness profile matching param-

88 eter and an assumption that said non-evaporating portion of the meniscus has a curved profile; determining that said thickness profile of said evaporating portion is within a threshold range; performing a second algorithm to determine performance characteristics of said heat transfer device; and providing said performance characteristics of said heat transfer device to an output device.

Example 208

The non-transitory computer readable medium of example 207, wherein said performance characteristics may include any one or more of:
a) total heat dissipation of said heat transfer device;
b) likelihood of choking or entrainment in any of said channels of said heat transfer device;
c) possible location of choking in any of said channels of said heat transfer device; or
d) specific statistics for any of said channels.

Example 209

The non-transitory computer readable medium of example 208, wherein said specific statistics of any of said channels may include any one or more of:
a) vapor velocity at given points in any of said channels;
b) vapor volumetric flow rates at given points in any of said channels; or
c) amount of heat dissipation at given points in any of said channels.

Example 210

The non-transitory computer readable medium of example 207, wherein said output device includes storage, memory, network, or a display.

Example 211

The non-transitory computer readable medium of example 207, wherein said heat transfer device characteristics include at least one of:
a) a liquid,
b) a substrate material,
c) a channel width,
d) a wall temperature,
e) an operating pressure, and
f) an operating temperature.

Example 212

The non-transitory computer readable medium of example 207, wherein determining that said thickness profile of said evaporating portion is within a threshold range comprises:
determining, based on said thickness profile, a function describing the curvature of the meniscus;
calculating, using said function describing the curvature of the meniscus, values for the curvature of the meniscus along said thickness profile until a constant curvature value is obtained; and
determining whether said constant value for the curvature of the meniscus is greater than or equal to a lower bound of said threshold range and less than or equal to an upper bound of said threshold range.

Example 213

The non-transitory computer readable medium of example 212, wherein:

said lower bound of said threshold range equals 0.99 times 2 divided by said channel width, and said upper bound of said threshold range equals 1.01 times 2 divided by said channel width.

Example 214

The method of example 212, wherein:
said lower bound of said threshold range equals $(1-\Delta_1)$ times 2 divided by said channel width, and said upper bound of said threshold range equals $(1+\Delta_2)$ times 2 divided by said channel width.

Example 215

The non-transitory computer readable medium of example 207, wherein said first algorithm comprises:
defining a set of boundary conditions, said boundary conditions represented by a set of equations:

$$\delta_n(0)=1+\varepsilon_0$$

$$\delta(0)=\delta_0(1+\varepsilon_0) \qquad \text{a)},$$

$$\delta'(0)=\delta_0\varepsilon_0 B \qquad \text{b)}$$

$$\delta''(0)=\delta_0\varepsilon_0 B^2, \text{ and} \qquad \text{c)}$$

$$\delta^{(3)}(0)=\delta_0\varepsilon_0 B^3; \text{ and} \qquad \text{d)}$$

wherein $\varepsilon_0$ is said thickness profile matching parameter,
wherein A is a dispersion constant,
wherein $\sigma$ is a surface tension value for the liquid
wherein $\delta_o$ is said thickness of said non-evaporating portion of said meniscus; and solving, using said set of boundary conditions a fourth order ordinary differential equation for said thickness profile of said evaporating portion of the meniscus.

Example 216

The non-transitory computer readable medium of example 207, wherein the second algorithm comprises solving a system of equations to determine said performance characteristics of said heat transfer device, said system of equations including:

$$\frac{3v}{\delta^2}\dot{m}_{evap}(x) = \frac{3A\delta'^2}{\delta^4} - \frac{3A\delta''}{\delta^3} + \frac{3\sigma\delta'(-3\delta'\delta''^2 + \delta^{(3)} + \delta'^2\delta^{(3)})}{(1+\delta'^2)^{5/2}} + \qquad \text{a)}$$

$$\frac{\sigma\delta[3(-1+4\delta'^2)\delta''^3 - 9\delta'(1+\delta'^2)\delta''\delta^{(3)} + (1+\delta'^2)^2\delta^{(4)}]}{(1+\delta'^2)^{7/2}}.$$

$$\dot{m}_{evap} = \frac{2c}{2-c}\left(\frac{M}{2\pi R}\right)^{\frac{1}{2}}\left(\frac{P_{eq}(T_{lv})}{T_{lv}^{\frac{1}{2}}} - \frac{P_v}{T_v^{\frac{1}{2}}}\right). \qquad \text{b)}$$

and $$P_{eq}(x) = P_{sat}(T_{lv})\exp\left[\frac{P_{eq}(x) - P_{sat}(T_{lv}) - P_c(x) - P_d(x)}{\rho_l R T_{lv}/M}\right]. \qquad \text{c)}$$

$$\dot{m}_{evap}(x) = \frac{k_l(T_w - T_{lv}(x))}{\delta(x)h_{fg}}, ; \qquad \text{d)}$$

and
wherein A is a dispersion constant,
wherein $\rho_l$ is the density of said liquid,
wherein $T_w$ is the temperature of the wall,
wherein R is the gas constant,
wherein $\sigma$ is the surface tension of said liquid,
wherein $P_{sat}$ is a saturation pressure,
wherein $P_v$ is the vapor pressure,
wherein $k_l$ is the thermal conductivity of said liquid,
wherein c is the evaporation constant,
wherein M is the molecular mass of said liquid,
wherein $\delta(x)$ represents said thickness profile of said evaporating portion of said meniscus as a function of position along said profile,
wherein $\dot{m}_{evap}(x)$ represents an evaporative mass flux as a function of position along said profile,
wherein $T_{lv}(x)$ represents a liquid-vapor interface temperature as a function of position along said profile,
wherein $P_{eq}(x)$ represents equilibrium vapor pressure as a function of position along said profile,
wherein $P_c(x)$ represents the capillary pressure as a function of position along said profile, and
wherein $P_d(x)$ represents the disjoining pressure as a function of position along said profile.

Example 217

The non-transitory computer readable medium of example 207, wherein at least one of said received heat transfer device characteristics includes an array of values, each value in said array of values for said at least one characteristic representing an alternate heat transfer device design, and
said method further comprises determining at least one value of in said array of values which produces optimal performance characteristics for said heat transfer device.

Example 218

The non-transitory computer readable medium of example 207, wherein said received heat transfer device characteristics include a graphical representation of at least one aspect of said heat transfer device and further comprises determining at least one value for an heat transfer device characteristic from said graphical representation.

Example 219

The non-transitory computer readable medium of example 217, wherein providing said performance characteristics to an output device includes:
providing a graph, wherein one axis of said graph represents said array of values; and
indicating on said graph said at least one value of in said array of values which provided optimal performance characteristics for said heat transfer device.

Example 220

The non-transitory computer readable medium of example 207, wherein said second algorithm includes determining a total vapor volumetric flow rate at at least one point within a channel of said heat transfer device.

Example 221

The non-transitory computer readable medium of example 220, wherein said second algorithm includes determining, based on a volume of said channel, whether vapor choking is likely to occur in said channel of said heat transfer device.

Example 222

The non-transitory computer readable medium of example 220, wherein said second algorithm includes determining whether liquid entrainment is likely to occur in vapor flowing out of said channel of said heat transfer device.

Example 223

The non-transitory computer readable medium of example 220, wherein said second algorithm includes determining, based on a volume of said channel, whether vapor choking is likely to occur in said channel of said heat transfer device.

Example 224

The non-transitory computer readable medium of example 223, wherein said optimal performance characteristics for said heat transfer device include characteristics that a) produce a highest value for evaporative heat flux and b) do not cause choking to occur.

Example 225

An aspect of an embodiment of present invention provides, but not limited thereto, an apparatus that may comprise: one or more processors; and a memory containing instructions that, when executed by said one or more processors, cause said one or more processors to perform a set of steps. The set of steps may comprise: receiving characteristics of a heat transfer device; determining a thickness of a non-evaporating portion of a meniscus formed by a liquid on a surface of channels of said heat transfer device; determining a value for a thickness profile matching parameter; performing a first algorithm to determine a thickness profile of an evaporating portion of said meniscus formed by said liquid on said surface, said first algorithm based on said thickness profile matching parameter and an assumption that said non-evaporating portion of the meniscus has a curved profile; determining that said thickness profile of said evaporating portion is within a threshold range; performing a second algorithm to determine performance characteristics of said heat transfer device; and providing said performance characteristics of said heat transfer device to an output device.

Example 226

The apparatus of example 225, wherein said performance characteristics may include any one or more of:
a) total heat dissipation of said heat transfer device;
b) likelihood of choking or entrainment in any of said channels of said heat transfer device;
c) possible location of choking in any of said channels of said heat transfer device; or
d) specific statistics for any of said channels.

Example 227

The apparatus of example 226, wherein said specific statistics of any of said channels may include any one or more of:
a) vapor velocity at given points in any of said channels;
b) vapor volumetric flow rates at given points in any of said channels; or
c) amount of heat dissipation at given points in any of said channels.

Example 228

The apparatus of example 225, wherein said output device includes storage, memory, network, or a display.

Example 229

The apparatus of example 225, wherein said heat transfer device characteristics include at least one of:
a) a liquid,
b) a substrate material,
c) a channel width,
d) a wall temperature,
e) an operating pressure, and
f) an operating temperature.

Example 230

The apparatus of example 225, wherein said determining that said thickness
determining, based on said thickness profile, a function describing the curvature of the meniscus;
calculating, using said function describing the curvature of the meniscus, values for the curvature of the meniscus along said thickness profile until a constant curvature value is obtained; and
determining whether said constant value for the curvature of the meniscus is greater than or equal to a lower bound of said threshold range and less than or equal to an upper bound of said threshold range.

Example 231

The apparatus of example 230, wherein:
said lower bound of said threshold range equals 0.99 times 2 divided by said channel width, and
said upper bound of said threshold range equals 1.01 times 2 divided by said channel width.

Example 232

The method of example 230, wherein:
said lower bound of said threshold range equals $(1-\Delta_1)$ times 2 divided by said channel width, and
said upper bound of said threshold range equals $(1+\Delta_2)$ times 2 divided by said channel width.

Example 233

The apparatus of example 225, wherein said first algorithm comprises: defining a set of boundary conditions, said boundary conditions represented by a set of equations:

$$\delta(0)=\delta_0(1+\varepsilon_0) \quad \text{a)}$$

$$\delta'(0)=\delta_0\varepsilon_0 B \quad \text{b)}$$

$$\delta''(0)=\delta_0\varepsilon_0 B^2, \text{ and} \quad \text{c)}$$

$$\delta^{(3)}(0)=\delta_0\varepsilon_0 B^2; \text{ and} \quad \text{d)}$$

wherein $\varepsilon_0$ is said thickness profile matching parameter,
wherein A is a dispersion constant,
wherein $\sigma$ is a surface tension value for the liquid,
wherein $\delta_o$ is said thickness of said non-evaporating portion of said meniscus; and solving, using said set of boundary conditions a fourth order ordinary differential equation for said thickness profile of said evaporating portion of the meniscus.

Example 234

The apparatus of example 225, wherein said second algorithm comprises solving a system of equations to determine said performance characteristics of said heat transfer device, said system of equations including:

$$\frac{3v}{\delta^2}\dot{m}_{evap}(x) = \frac{3A\delta'^2}{\delta^4} - \frac{3A\delta''}{\delta^3} + \frac{3\sigma\delta'(-3\delta'\delta''^2 + \delta^{(3)} + \delta'^2\delta^{(3)})}{(1+\delta'^2)^{5/2}} + \frac{\sigma\delta[3(-1+4\delta'^2)\delta''^3 - 9\delta'(1+\delta'^2)\delta''\delta^{(3)} + (1+\delta'^2)^2\delta^{(4)}]}{(1+\delta'^2)^{7/2}}.$$  a)

$$\dot{m}_{evap} = \frac{2c}{2-c}\left(\frac{M}{2\pi R}\right)^{\frac{1}{2}}\left(\frac{P_{eq}(T_{lv})}{T_{lv}^{\frac{1}{2}}} - \frac{P_v}{T_v^{\frac{1}{2}}}\right).$$  b)

and $$P_{eq}(x) = P_{sat}(T_{lv})\exp\left[\frac{P_{eq}(x) - P_{sat}(T_{lv}) - P_c(x) - P_d(x)}{\rho_l RT_{lv}/M}\right].$$  c)

$$\dot{m}_{evap}(x) = \frac{k_l(T_w - T_{lv}(x))}{\delta(x)h_{fg}}.;$$  d)

and
  wherein A is a dispersion constant,
  wherein $\rho_l$ is the density of said liquid,
  wherein $T_w$ is the temperature of the wall,
  wherein R is the gas constant,
  wherein $\sigma$ is the surface tension of said liquid,
  wherein $P_{sat}$ is a saturation pressure,
  wherein $P_v$ is the vapor pressure,
  wherein c is the evaporation constant,
  wherein M is the molecular mass of said liquid,
  wherein $\delta(x)$ represents said thickness profile of said evaporating portion of said meniscus as a function of position along said profile,
  wherein $\dot{m}_{evap}(x)$ represents an evaporative mass flux as a function of position along said profile,
  wherein $T_{lv}(x)$ represents a liquid-vapor interface temperature as a function of position along said profile,
  wherein $P_{eq}(x)$ represents equilibrium vapor pressure as a function of position along said profile,
  wherein $P_c(x)$ represents the capillary pressure as a function of position along said profile, and
  wherein $P_d(x)$ represents the disjoining pressure as a function of position along said profile.

Example 235

The apparatus of example 225, wherein at least one of said received heat transfer device characteristics includes an array of values, each value in said array of values for said at least one characteristic representing an alternate heat transfer device design, and
  said method further comprises determining at least one value of in said array of values which produces optimal performance characteristics for said heat transfer device.

Example 236

The apparatus of example 225, wherein said received heat transfer device characteristics include a graphical representation of at least one aspect of said heat transfer device and further comprises determining at least one value for an heat transfer device characteristic from said graphical representation.

Example 237

The apparatus of example 235, wherein providing said performance characteristics to an output device includes:
  providing a graph, wherein one axis of said graph represents said array of values; and
  indicating on said graph said at least one value of in said array of values which provided optimal performance characteristics for said heat transfer device.

Example 238

The apparatus of example 225, wherein said second algorithm includes determining a total vapor volumetric flow rate at at least one point within a channel of said heat transfer device.

Example 239

The apparatus of example 238, wherein said second algorithm includes determining, based on a volume of said channel, whether vapor choking is likely to occur in said channel of said heat transfer device.

Example 240

The apparatus of example 238, wherein said second algorithm includes determining whether liquid entrainment is likely to occur in vapor flowing out of said channel of said heat transfer device.

Example 241

The apparatus of example 238, wherein said second algorithm includes determining, based on a volume of said channel, whether vapor choking is likely to occur in said channel of said heat transfer device.

Example 242

The apparatus of example 241, wherein said optimal performance characteristics for said heat transfer device include characteristics that a) produce a highest value for evaporative heat flux and b) do not cause choking to occur.

Example 243

An aspect of an embodiment of present invention provides, but not limited thereto, a. A computer implemented method for determining the performance characteristics of a heat transfer device. The method may comprise: receiving the heat transfer device characteristics; receiving the heat source characteristics; receiving any ancillary characteristics; determining the performance characteristics of the heat transfer device; determining whether the determined performance characteristics of the heat transfer device are acceptable. And wherein if the performance characteristics of the heat transfer device: are acceptable, then providing such performance characteristics of the heat transfer device; or are not acceptable, then revising the heat transfer device characteristics or provide additional data, and then providing such performance characteristics of the heat transfer device.

Example 244

An aspect of an embodiment of present invention provides, but not limited thereto, a computer implemented method for determining the heat transfer device characteristics. The method may comprise: receiving the heat transfer device performance characteristics; receiving the heat source characteristics; receiving any ancillary characteristics; determining the heat transfer device characteristics; determining whether the determined heat transfer device characteristics are acceptable. And wherein if the determined heat transfer device characteristics of the heat transfer device: are acceptable, then providing such heat transfer device characteristics; or are not acceptable, then revising the performance characteristics of the heat transfer device or provide additional data, and then providing such heat transfer device characteristics.

Example 244

Undertaking a method or participating in a method for using any of the devices or apparatuses or portions of the devices or apparatuses provided in one or more of Examples 1-172 and 245-39.

Example 245

An aspect of an embodiment of present invention provides, but not limited thereto, a two phase heat transfer device. The device may comprise: a reservoir configured for carrying a working fluid; a base member, said base member configured to receive thermal energy from a heat source; elongated members having at least one wall, said elongated members extending distally away from said base member and configured to define respective passages between adjacent elongated members; wherein said elongated members include a proximal region and a distal region, wherein said distal region is configured to be at least partially inserted into the working fluid; a recess topography disposed on said at least one wall of said elongated members, wherein said recess topography is configured to accommodate the working fluid; and said passages are configured to accommodate vapor produced from the working fluid so as to define a vapor space.

Example 246

The device of example 245 (as well as subject matter of one or more of any one combination of examples 2-84, 86-105, 107-126, 128-139, and 246-271), wherein said base member configured to be in communication with and adjacent to the heat source.

Example 247

The device of example 245 (as well as subject matter of one or more of any one combination of examples 2-84, 86-105, 107-126, 128-139, and 246-271), wherein at least some of said passages are channels, respectively.

Example 248

The device of example 247 (as well as subject matter of one or more of any one combination of examples 2-84, 86-105, 107-126, 128-139, and 246-271), wherein at least some of said channels are microchannels or nanochannels, or a combination of microchannels and nanochannels.

Example 249

The device of example 245 (as well as subject matter of one or more of any one combination of examples 2-84, 86-105, 107-126, 128-139, and 246-271), wherein said recess topography comprises one or more recesses.

Example 250

The device of example 249 (as well as subject matter of one or more of any one combination of examples 2-84, 86-105, 107-126, 128-139, and 246-271), wherein said one or more recesses comprises: a groove, slot, pipe, tube, trough, conduit, indentation, or flute, as well as any combination.

Example 251

The device of example 245 (as well as subject matter of one or more of any one combination of examples 2-84, 86-105, 107-126, 128-139, and 246-271), wherein said recess topography comprises fractal topology.

Example 252

The device of example 251 (as well as subject matter of one or more of any one combination of examples 2-84, 86-105, 107-126, 128-139, and 246-271), wherein said fractal topology comprises recesses, wherein the number of recesses toward said end of elongated member to be closer to the heat source is greater than the number of recesses toward said end of elongated member to be inserted in a working fluid.

Example 253

The device of example 245 (as well as subject matter of one or more of any one combination of examples 2-84, 86-105, 107-126, 128-139, and 246-271), wherein said recess topography is configured to provide a suction of the working fluid in the direction toward the heat source.

Example 254

The device of example 245 (as well as subject matter of one or more of any one combination of examples 2-84, 86-105, 107-126, 128-139, and 246-271), wherein the device comprises a working fluid and a vapor configured to provide two phase heat transfer.

Example 255

The device of example 245 (as well as subject matter of one or more of any one combination of examples 2-84, 86-105, 107-126, 128-139, and 246-271), wherein said passages are configured to confine vapor between said reservoir and said base member.

Example 256

The device of example 255 (as well as subject matter of one or more of any one combination of examples 2-84, 86-105, 107-126, 128-139, and 246-271), wherein an evaporating thin film region is provided on at least some of said elongated members at the region of insertion into the working fluid.

Example 257

The device of example 256 (as well as subject matter of one or more of any one combination of examples 2-84, 86-105, 107-126, 128-139, and 246-271), wherein the evaporating thin film region is between the heat source and said reservoir.

Example 258

The device of example 257 (as well as subject matter of one or more of any one combination of examples 2-84, 86-105, 107-126, 128-139, and 246-271), wherein the thermal energy travels through said elongated members and beyond the vapor space toward the evaporating thin film region.

Example 259

The device of example 258 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 260

The device of example 259 (as well as subject matter of one or more of any one combination of examples 2-84, 86-105, 107-126, 128-139, and 246-271), wherein the evaporating thin film region is between the heat source and the working fluid.

Example 261

The device of example 260 (as well as subject matter of one or more of any one combination of examples 2-84, 86-105, 107-126, 128-139, and 246-271), wherein the thermal energy travels through said elongated members and beyond the vapor space toward the evaporating thin film region.

Example 262

The device of example 261 (as well as subject matter of one or more of any one combination of examples 2-84, 86-105, 107-126, 128-139, and 246-271), wherein said proximal region of said elongated members has a saturation temperature that is greater than the saturation temperature of the evaporating film region.

Example 263

The device of example 245 (as well as subject matter of one or more of any one combination of examples 2-84, 86-105, 107-126, 128-139, and 246-271), wherein said vapor space is located between the heat source and said reservoir.

Example 264

The device of example 245 (as well as subject matter of one or more of any one combination of examples 2-84, 86-105, 107-126, 128-139, and 246-271), wherein said vapor space is located between the heat source and the working fluid.

Example 265

The device of example 245, wherein said heat source is at least one semiconductor device or electronic device.

Example 266

The device of example 265 (as well as subject matter of one or more of any one combination of examples 2-84, 86-105, 107-126, 128-139, and 246-271), wherein a plurality of said semiconductor devices form a system comprising at least one of the following: processor unit or memory unit.

Example 267

The device of example 245 (as well as subject matter of one or more of any one combination of examples 2-84, 86-105, 107-126, 128-139, and 246-271), wherein said heat source is at least one of the following: integrated circuit, concentrated thermal and optic radiation, chemical reactions, high temperature liquid/vapor flows, high velocity flows, or high velocity shear flows.

Example 268

The device of example 245 (as well as subject matter of one or more of any one combination of examples 2-84, 86-105, 107-126, 128-139, and 246-271), wherein said heat source is at least one of the following: High Performance Computing Systems, RF systems, photovoltaic system, concentrated photovoltaic system, hypersonic vehicle or craft, jet blast deflector, or turbine blade.

Example 269

The device of example 268 (as well as subject matter of one or more of any one combination of examples 2-84, 86-105, 107-126, 128-139, and 246-271), wherein said high performance computing system comprises at least one of the following: 3D Stacking computer chip, computer processor unit (CPU), graphics processor unit (GPU), or memory unit.

Example 270

The device of example 245 (as well as subject matter of one or more of any one combination of examples 2-84, 86-105, 107-126, 128-139, and 246-271), further comprising a heat source in communication with said device.

Example 271

The device of example 245 (as well as subject matter of one or more of any one combination of examples 2-84, 86-105, 107-126, 128-139, and 246-271), further comprising working fluid disposed in said reservoir.

Example 272

An aspect of an embodiment of present invention provides, but not limited thereto, a method of making a two phase heat transfer device (or portions thereof). The method may comprise: providing a reservoir configured for carrying a working fluid; providing a base member configured to receive thermal energy from a heat source; providing elongated members having at least one wall, said elongated members extending distally away from said base member and configured to define respective passages between adjacent elongated members, wherein said elongated members include a proximal region and a distal region; configuring said distal region of said elongated members to be able to at least partially be inserted into the working fluid; and providing a recess topography disposed on said at least one wall of said elongated members, wherein said recess topography is configured to accommodate the working fluid.

Example 273

The method of example 272, wherein said base member is configured to be in communication with and adjacent to the heat source.

Example 274

An aspect of an embodiment of present invention provides, but not limited thereto, an apparatus that may comprise: a reservoir configured for carrying a working fluid; an integrated circuit (IC) die, wherein said IC die comprises a heat source and a two phase heat transfer device. The two phase heat transfer device may comprise: a base member, said base member configured to receive thermal energy from the heat source; elongated members having at least one wall, said elongated members extending distally away from said base member and configured to define respective passages between adjacent elongated members; wherein at least some said elongated members configured to be at least partially inserted into the working fluid; a recess topography disposed on said at least one wall of said elongated members, wherein said recess topography is configured to accommodate the working fluid; and said passages are configured to accommodate vapor produced from the working fluid so as to define a vapor space.

Example 275

The apparatus of example 274 (as well as subject matter of one or more of any one combination of examples 2-84, 86-105, 107-126, 128-139, 143-150, 152-161, 163-172, 275-287, 289-303, and 305-319), wherein said IC die is in communication with a chip carrier.

Example 276

The apparatus of example 275 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 277

The apparatus of example 276 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 278

The apparatus of example 274 (as well as subject matter of one or more of any one combination of examples 2-84, 86-105, 107-126, 128-139, 143-150, 152-161, 163-172, 275-287, 289-303, and 305-319), wherein at least some of said passages comprise microchannels, respectively.

Example 279

The apparatus of example 274 (as well as subject matter of one or more of any one combination of examples 2-84, 86-105, 107-126, 128-139, 143-150, 152-161, 163-172, 275-287, 289-303, and 305-319), wherein at least some of said passages comprise nanochannels, respectively.

Example 280

The apparatus of example 274 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 281

The apparatus of example 36 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 282

The apparatus of example 36 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 283

The device of example 274 (as well as subject matter of one or more of any one combination of examples 2-84, 86-105, 107-126, 128-139, 143-150, 152-161, 163-172, 275-287, 289-303, and 305-319), wherein said recess topography comprises one or more recesses.

Example 284

The device of example 39 (as well as subject matter of one or more of any one combination of examples 2-84, 86-105, 107-126, 128-139, 143-150, 152-161, 163-172, 275-287, 289-303, and 305-319), wherein said one or more recesses comprises: a groove, slot, pipe, tube, trough, conduit, indentation, or flute, as well as any combination.

Example 285

The device of example 274 (as well as subject matter of one or more of any one combination of examples 2-84, 86-105, 107-126, 128-139, 143-150, 152-161, 163-172, 275-287, 289-303, and 305-319), wherein said recess topography comprises fractal topology.

Example 286

The device of example 41 (as well as subject matter of one or more of any one combination of examples 2-84, 86-105, 107-126, 128-139, 143-150, 152-161, 163-172, 275-287, 289-303, and 305-319), wherein said fractal topology comprises recesses, wherein the number of recesses toward said end of elongated member to be closer to the heat source is greater than the number of recesses toward said end of elongated member to be inserted in a working fluid.

Example 287

The device of example 274 (as well as subject matter of one or more of any one combination of examples 2-84, 86-105, 107-126, 128-139, 143-150, 152-161, 163-172, 275-287, 289-303, and 305-319), wherein said recess topography is configured to provide a suction of the working fluid in the direction toward the heat source.

Example 288

An aspect of an embodiment of present invention provides, but not limited thereto, an apparatus that may comprise: a first reservoir configured for carrying a working fluid; a first integrated circuit (IC) die, wherein said IC die comprises a heat source and a two phase heat transfer device; wherein said two phase heat transfer device of said first IC die comprises: a base member, said base member configured to receive thermal energy from the heat source; elongated members having at least one wall, said elongated members extending distally away from said base member and configured to define respective passages between adjacent elongated members; at least some said elongated members configured to be at least partially inserted into the working fluid; a recess topography disposed on said at least one wall of said elongated members, wherein said recess topography is configured to accommodate the working fluid; and said passages are configured to accommodate vapor produced from the working fluid so as to define a vapor space. The apparatus may further comprise: a second reservoir configured for carrying a working fluid; a second integrated circuit (IC) die, wherein said second IC die comprises a heat source and a two phase heat transfer device; wherein said two phase heat transfer device of said second IC die comprises: a base member, said base member configured to receive thermal energy from the heat source; elongated members having at least one wall, said elongated members extending distally away from said base member and configured to define respective passages between adjacent elongated members; at least some said elongated members configured to be at least partially inserted into the working fluid; a recess topography disposed on said at least one wall of said elongated members, wherein said recess topography is configured to accommodate the working fluid; and said passages are configured to accommodate vapor produced from the working fluid so as to define a vapor space; and said first IC die and said second IC operatively coupled together.

Example 289

The apparatus of example 288 (as well as subject matter of one or more of any one combination of examples 2-84, 86-105, 107-126, 128-139, 143-150, 152-161, 163-172, 275-287, 289-303, and 305-319), wherein said first IC die is in communication with a chip carrier.

Example 290

The apparatus of example 289 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 291

The apparatus of example 290 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 292

The apparatus of example 288 (as well as subject matter of one or more of any one combination of examples 2-84, 86-105, 107-126, 128-139, 143-150, 152-161, 163-172, 275-287, 289-303, and 305-319), wherein at least some of said passages comprises microchannels, respectively.

Example 293

The apparatus of example 288 (as well as subject matter of one or more of any one combination of examples 2-84, 86-105, 107-126, 128-139, 143-150, 152-161, 163-172, 275-287, 289-303, and 305-319), wherein said at least some of said passages comprises nanochannels, respectively.

Example 294

The apparatus of example 288 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 295

The apparatus of example 294 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 296

The apparatus of example 294 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 297

The apparatus of example 288 (as well as subject matter of one or more of any one combination of examples 2-84, 86-105, 107-126, 128-139, 143-150, 152-161, 163-172, 275-287, 289-303, and 305-319), wherein said first IC die and said second IC are electrically connected to one another.

Example 298

The apparatus of example 288 (as well as subject matter of one or more of any one combination of examples 2-84, 86-105, 107-126, 128-139, 143-150, 152-161, 163-172, 275-287, 289-303, and 305-319), further comprising a thermal insulator layer disposed between said first IC die and said second IC.

Example 299

The device of example 288 (as well as subject matter of one or more of any one combination of examples 2-84, 86-105, 107-126, 128-139, 143-150, 152-161, 163-172, 275-287, 289-303, and 305-319), wherein said recess topography comprises one or more recesses.

Example 300

The device of example 299 (as well as subject matter of one or more of any one combination of examples 2-84, 86-105, 107-126, 128-139, 143-150, 152-161, 163-172, 275-287, 289-303, and 305-319), wherein said one or more recesses comprises: a groove, slot, pipe, tube, trough, conduit, indentation, or flute, as well as any combination.

Example 301

The device of example 288 (as well as subject matter of one or more of any one combination of examples 2-84, 86-105, 107-126, 128-139, 143-150, 152-161, 163-172, 275-287, 289-303, and 305-319), wherein said recess topography comprises fractal topology.

Example 302

The device of example 301 (as well as subject matter of one or more of any one combination of examples 2-84, 86-105, 107-126, 128-139, 143-150, 152-161, 163-172, 275-287, 289-303, and 305-319), wherein said fractal topology comprises recesses, wherein the number of recesses toward said end of elongated member to be closer to the heat source is greater than the number of recesses toward said end of elongated member to be inserted in a working fluid.

Example 303

The device of example 288 (as well as subject matter of one or more of any one combination of examples 2-84, 86-105, 107-126, 128-139, 143-150, 152-161, 163-172, 275-287, 289-303, and 305-319), wherein said recess topography is configured to provide a suction of the working fluid in the direction toward the heat source.

Example 304

An aspect of an embodiment of present invention provides, but not limited thereto, an apparatus that may comprise: a reservoir configured for carrying a working fluid; an integrated circuit (IC) die, wherein said IC die comprises a heat source; a two phase heat transfer device thermally connected to said IC die. And the two phase heat transfer device may comprise: a base member, wherein said base member configured to receive thermal energy from the heat source; elongated members having at least one wall, said elongated members extending distally away from said base member and configured to define respective passages between adjacent elongated members; at least some said elongated members configured to be at least partially inserted into the working fluid; a recess topography disposed on said at least one wall of said elongated members, wherein said recess topography is configured to accommodate the working fluid; and said passages are configured to accommodate vapor produced from the working fluid so as to define a vapor space.

Example 305

The apparatus of example 304 (as well as subject matter of one or more of any one combination of examples 2-84, 86-105, 107-126, 128-139, 143-150, 152-161, 163-172, 275-287, 289-303, and 305-319), wherein said IC die is in communication with a chip carrier.

Example 306

The apparatus of example 305 (as well as subject matter of one or more of any one combination of examples 2-84, 86-105, 107-126, 128-139, 143-150, 152-161, 163-172, 275-287, 289-303, and 305-319), wherein said communication with said chip carrier comprises connector.

Example 307

The apparatus of example 306 (as well as subject matter of one or more of any one combination of examples 2-84, 86-105, 107-126, 128-139, 143-150, 152-161, 163-172, 275-287, 289-303, and 305-319), wherein said connector comprises solder balls.

Example 308

The apparatus of example 304 (as well as subject matter of one or more of any one combination of examples 2-84, 86-105, 107-126, 128-139, 143-150, 152-161, 163-172, 275-287, 289-303, and 305-319), wherein at least some of said passages comprise microchannels, respectively.

Example 309

The apparatus of example 304 (as well as subject matter of one or more of any one combination of examples 2-84, 86-105, 107-126, 128-139, 143-150, 152-161, 163-172, 275-287, 289-303, and 305-319), wherein at least some of said passages comprise nanochannels, respectively.

Example 310

The apparatus of example 304 (as well as subject matter of one or more of any one combination of examples 2-84, 86-105, 107-126, 128-139, 143-150, 152-161, 163-172, 275-287, 289-303, and 305-319), wherein said heat source comprises a semiconductor device.

Example 311

The apparatus of example 310 (as well as subject matter of one or more of any one combination of examples 2-84, 86-105, 107-126, 128-139, 143-150, 152-161, 163-172, 275-287, 289-303, and 305-319), wherein said semiconductor device comprises at least one of: processor, microprocessor, central processor unit (CPU), or memory unit.

Example 312

The apparatus of example 310 (as well as subject matter of one or more of any one combination of examples 2-84, 86-105, 107-126, 128-139, 143-150, 152-161, 163-172, 275-287, 289-303, and 305-319), wherein said semiconductor device comprises at least one of the following: diodes, transistors, sensors, charge-coupled device (CCD), or rectifiers.

Example 313

The apparatus of example 312 (as well as subject matter of one or more of any one combination of examples 2-84, 86-105, 107-126, 128-139, 143-150, 152-161, 163-172, 275-287, 289-303, and 305-319), wherein said integrated circuit (IC) die and a two phase heat transfer device are mechanically connected with to one another.

Example 314

The apparatus of examples 313 (as well as subject matter of one or more of any one combination of examples 2-84, 86-105, 107-126, 128-139, 143-150, 152-161, 163-172, 275-287, 289-303, and 305-319), wherein said mechanical connection includes an adhesive.

Example 315

The device of example 304 (as well as subject matter of one or more of any one combination of examples 2-84, 86-105, 107-126, 128-139, 143-150, 152-161, 163-172, 275-287, 289-303, and 305-319), wherein said recess topography comprises one or more recesses.

Example 316

The device of example 315 (as well as subject matter of one or more of any one combination of examples 2-84, 86-105, 107-126, 128-139, 143-150, 152-161, 163-172, 275-287, 289-303, and 305-319), wherein said one or more recesses comprises: a groove, slot, pipe, tube, trough, conduit, indentation, or flute, as well as any combination.

Example 317

The device of example 304 (as well as subject matter of one or more of any one combination of examples 2-84, 86-105, 107-126, 128-139, 143-150, 152-161, 163-172, 275-287, 289-303, and 305-319), wherein said recess topography comprises fractal topology.

Example 318

The device of example 317 (as well as subject matter of one or more of any one combination of examples 2-84, 86-105, 107-126, 128-139, 143-150, 152-161, 163-172, 275-287, 289-303, and 305-319), wherein said fractal topology comprises recesses, wherein the number of recesses toward said end of elongated member to be closer to the heat source is greater than the number of recesses toward said end of elongated member to be inserted in a working fluid.

Example 319

The device of example 304 (as well as subject matter of one or more of any one combination of examples 2-84, 86-105, 107-126, 128-139, 143-150, 152-161, 163-172, 275-287, 289-303, and 305-319), wherein said recess topography is configured to provide a suction of the working fluid in the direction toward the heat source.

Energy Savings/Efficiency Example No. A

Heat Transfer Device

Various embodiments of the disclosed phase change heat transfer device (i.e., evaporator) may provide significant energy savings over conventional phase change devices (i.e., evaporators) used to provide cooling for electronics, for example, in datacenters. Inventors recognized that devices depend on pool boiling or porous-media evaporation, both of which are highly random and sporadic (both spatially and temporally). Therefore, the contribution of phase change to the heat transfer process is only a fraction of what it can be, and thus today's devices are merely convective devices, improved marginally by phase change. By contrast, the disclosed solution of an embodiment(s) of the present invention heat transfer device (i.e., evaporator) eliminates boiling and provides a 2-3 order of magnitude improvement over the present devices.

By way of illustration, in 2011, the power usage by datacenters in United States was estimated to exceed 100 billion kWh, representing an annual cost of approximately $7.4 billion. The energy used by datacenters represents L7-2.2% of total electrical energy usage in the United States, and it is growing by 20% a year. Ten more power plants will have to be built over the next four years in the United States to supply additional energy demand by the datacenters. All the power used by a datacenter is eventually converted to thermal energy and rejected as low-quality waste heat into the environment, mainly through heat exchange with forced air. The power used by common cooling systems constitutes 40-45% of the total power consumption in a datacenter. Using the 2011 electrical energy prices, this translates into an annual cost of $3.3 billion for cooling purposes ($7.4 billion×45=$3.3 billion). Recent studies indicate that efficient cooling technologies could cut this cost by a factor of 16, thereby cutting current total energy needs nearly in half. Moreover, the energy saving is not restricted to the power usage by datacenters. For example, for mobile computing systems, more effective cooling can be translated into increased battery life.

Energy Savings/Efficiency Example No. B

Design Optimization

Furthermore, the disclosed method for optimizing a heat transfer device (i.e., evaporator) design makes implementation of these advantages feasible. Inventors recognized that analytical techniques for determining thin film heat transfer characteristics are limited to solutions for only discrete combinations or channel width and superheat and produce results that are inaccurate by at least a factor of two. In contrast, the disclosed heat transfer device (i.e., evaporator) design optimization method solves both of these problems and the results from such method have been experimentally verified. By providing a more complete solution to thin-film heat transfer characteristics, the disclosed heat transfer device (i.e., evaporator) design optimization method allows designers to, among other things, accurately evaluate designs that can be tailored to their fabrication capabilities.

In addition, the disclosed design(s) of the phase change heat transfer (i.e., evaporator) device may not have been possible without the use of the disclosed heat transfer device (i.e., evaporator) design optimization method due to the inaccuracies of conventional analytical techniques. For example, because inventors recognize that other techniques estimate a heat transfer rate that is half of the true heat transfer rate, then as a result any attempts at the disclosed design(s) of the heat transfer device (i.e., evaporator) would likely be subject to choking and entrainment problems, and other limitations. Choking and entrainment problems would likely arise because, but not limited thereto, conventional techniques underestimate the potential vapor volume produced due to evaporation, thus passages (i.e., channels) may be inefficiently designed. Accordingly, the present inventors have disclosed an optimization method that allows the present inventors to, among other things, design passages (i.e., channels) and other related components around these problems and avoid, among other things, undue experimentation.

Energy Sayings/Efficiency Example No. C

The various embodiments of the present invention cooling systems shall be very important for advanced computing systems. Over the past forty years, the performance of electronic chips has improved drastically. The number of transistors per chip, over the same period of time, has increased from a few thousands to billions, taking advantage of the ability to shrink transistors and wires, and thus double the number of transistors per unit area every 1.5-2 years (Moore's Law). Packaging a billion transistors in ever-smaller areas (2-6 $cm^2$) demands effective cooling systems to extract and dissipate the concentrated heat flux in order to maintain the temperature in the acceptable range for the operation of the electronic device.

Unfortunately, the industry's ability to keep the power and hence heat dissipation of these chips has so far depended on the ability to reduce operating voltage proportionally with transistor scaling. Voltages are now so low that further reductions will soon be impossible. Without decreasing voltage to compensate for the increasing transistor density, power and heat dissipation per unit area will grow exponentially. In the near future, heat fluxes of the order of 200-500 $W/cm^2$ will need to be extracted from the processor to keep it functioning properly, and the problem will only grow worse. Already chips are thermally limited and forced to run artificially slowly. This in turn leads to huge design costs to eke out every possible bit of performance under this thermal cap. The resulting hardware changes often cannot be hidden from programmers (e.g., the SIMD architecture of graphics processors, and increasing use of specialized accelerators), meaning the thermal cap ripples up to damage productivity in the huge software industry. To accommodate this level of heat flux and more without overheating the processor, cooling systems must achieve effective thermal conductivities as high as 20 $kW/(m \cdot K)$. The average heat transfer coefficient for today's phase-change systems based on pool boiling or evaporation through porous substrates does not exceed 10 $W/cm^2$. Air cooling is even worse, at about 10 $W/cm^2$. And both are much worse in mobile devices with compact form factors. A significant and growing gap exists between the heat-transfer performance needed by the electronics industry, and the heat transfer performance readily available.

An aspect of an embodiment of the present invention indicates that this novel design for a phase-change heat-transfer system can achieve, for example but not limited thereto, heat transfer coefficients potentially as high as 5 $kW/cm^2$. This solution amounts to an order of magnitude improvement over the state of the art in phase-change devices. Given the size of the U.S. electronic industry (consumer electronics and datacenters)—an estimated size of $200 billion—and the way that chip performance is now thermally limited, this breakthrough in cooling capacity associated with the various embodiments of the present invention can make possible an enormous commercial and technological significance. Removing the performance cap due to cooling constraints would completely change the current direction of computer design, allowing the industry to return its focus to making programming easier, not harder. Furthermore, for mobile computing systems, more effective cooling can be translated into increased battery life, while for datacenters, improved cooling technology could lead to savings of hundreds of millions of dollars in operational costs, since cooling these facilities is very energy intensive. The various embodiments of the present invention cooling technology are also likely to find a variety of other applications in high-heat-flux systems.

Energy Savings/Efficiency Example No. D

The various embodiments of the present invention cooling systems are very important for, among other things, advanced computing systems. The performance of electronic chips has improved enormously over the past two decades, but the increased processing speed of these chips also generates a substantial amount of heat that must be dissipated if the chips are going to continue working effectively. Until now, the IT industry has relied on reducing the operating voltage as the number of transistors in chips has expanded. However, voltages cannot be reduced indefinitely, and therefore the various embodiments of the present invention cooling method and system will be necessary to facilitate the expansion of computing power.

The various embodiments of the present invention phase-change heat-transfer system and method for electronics shall be able to improve on existing state-of-the-art technology by as much as an order of magnitude. If streamlined and brought into commercial production, various embodiments of the present invention cooling system could be of immense significance to the U.S. electronics industry, whose estimated worth is $200 billion. Moreover, given the importance of heat dissipation to a range of information technologies, various embodiments of the present invention cooling system has implications for a host of different areas, from enormous datacenters to personal laptop computers.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. A two phase heat transfer device, said device comprising:
   a reservoir configured for carrying a working fluid;
   a base member, said base member configured to receive thermal energy from a heat source;
   elongated members having at least one wall, said elongated members extending distally away from said base member and configured to define respective passages between adjacent elongated members;
   said elongated members include a proximal region and a distal region, wherein said distal region is configured to be at least partially inserted into the working fluid;
   a recess topography disposed on said at least one wall of said elongated members, wherein said recess topography is configured to accommodate the working fluid;
   said elongated members having a proximal end and a distal end substantially opposed from one another, wherein said proximal end to be closer to the heat source and said distal end to be inserted in the working fluid;
   wherein said recess topography comprises fractal topology, wherein said fractal topology comprises:
      recesses, wherein the number of recesses toward said proximal end of said elongated members is greater than the number of recesses toward said distal end of said elongated members; and
   said passages are configured to accommodate vapor produced from the working fluid so as to define a vapor space.

2. The device of claim 1, wherein said base member configured to be in communication with and adjacent to the heat source.

3. The device of claim 1, wherein at least some of said passages are channels, respectively.

4. The device of claim 3, wherein at least some of said channels are microchannels or nanochannels, or a combination of microchannels and nanochannels.

5. The device of claim 1, wherein said recesses comprise: a groove, slot, pipe, tube, trough, conduit, indentation, or flute, as well as any combination.

6. The device of claim 1, wherein said recess topography is configured to provide a suction of the working fluid in a direction from the working fluid toward the heat source.

7. The device of claim 1, wherein the device comprises the working fluid wherein vapor is produced from the working fluid to provide two phase heat transfer.

8. The device of claim 1, wherein said passages are configured to confine vapor between said reservoir and said base member.

9. The device of claim 8, wherein an evaporating thin film region is provided on at least some of said elongated members at said distal region configured to be at least partially inserted into the working fluid.

10. The device of claim 9, wherein the evaporating thin film region is between the heat source and said reservoir.

11. The device of claim 10, wherein the thermal energy travels through said elongated members and beyond the vapor space toward the evaporating thin film region.

12. The device of claim 11, wherein said proximal region of said elongated members has a saturation temperature that is greater than a saturation temperature of the evaporating film region.

13. The device of claim 9, wherein the evaporating thin film region is between the heat source and the working fluid.

14. The device of claim 13, wherein the thermal energy travels through said elongated members and beyond the vapor space toward the evaporating thin film region.

15. The device of claim 14, wherein said proximal region of said elongated members has a saturation temperature that is greater than a saturation temperature of the evaporating film region.

16. The device of claim 1, wherein said vapor space is located between the heat source and said reservoir.

17. The device of claim 1, wherein said vapor space is located between the heat source and the working fluid.

18. The device of claim 1, wherein said heat source is at least one semiconductor device or electronic device.

19. The device of claim 18, wherein a plurality of said at least one semiconductor device form a system comprising at least one of the following: processor unit or memory unit.

20. The device of claim 1, wherein said heat source is at least one of the following: integrated circuit, concentrated thermal and optic radiation, chemical reactions, high temperature liquid/vapor flows, high velocity flows, or high velocity shear flows.

21. The device of claim 1, wherein said heat source is at least one of the following: high performance computing system, RF system, photovoltaic system, concentrated photovoltaic system, hypersonic vehicle or craft, jet blast deflector, or turbine blade.

22. The device of claim 21, wherein said high performance computing system comprises at least one of the following: 3D Stacking computer chip, computer processor unit (CPU), graphics processor unit (GPU), or memory unit.

23. The device of claim 1, further comprising the heat source in communication with said device.

24. The device of claim 1, further comprising the working fluid disposed in said reservoir.

25. A method of making a two phase heat transfer device, said method comprising:
   providing a reservoir configured for carrying a working fluid;
   providing a base member configured to receive thermal energy from a heat source;

providing elongated members having at least one wall, said elongated members having a proximal end and a distal end substantially opposed from one another, wherein said proximal end to be closer to the heat source and said distal end to be inserted in the working fluid, said elongated members extending distally away from said base member and configured to define respective passages between adjacent elongated members, said elongated members include a proximal region and a distal region;

configuring said distal region of said elongated members to be able to at least partially be inserted into the working fluid;

providing a recess topography disposed on said at least one wall of said elongated members, wherein said recess topography is configured to accommodate the working fluid;

configuring said recess topography to comprise fractal topology, wherein said fractal topology comprises:
recesses, wherein the number of recesses toward said proximal end of said elongated members is greater than the number of recesses toward said distal end of said elongated members.

26. The method of claim 25, wherein said base member is configured to be in communication with and adjacent to the heat source.

27. The method of claim 25, wherein at least some of said passages are channels, respectively.

28. The method of claim 27, wherein at least some of said channels are microchannels or nanochannels, or a combination of microchannels and nanochannels.

29. The method of claim 25, wherein said recesses comprise: a groove, slot, pipe, tube, trough, conduit, indentation, or flute, as well as any combination.

30. The method of claim 25, wherein said heat source is at least one semiconductor device or electronic device.

31. The method of claim 30, wherein a plurality of said at least one semiconductor device form a system comprising at least one of the following: processor unit or memory unit.

32. The method of claim 25, wherein said heat source is at least one of the following: integrated circuit, concentrated thermal and optic radiation, chemical reactions, high temperature liquid/vapor flows, high velocity flows, or high velocity shear flows.

33. The method of claim 25, wherein said heat source is at least one of the following: high performance computing system, RF system, photovoltaic system, concentrated photovoltaic system, hypersonic vehicle or craft, jet blast deflector, or turbine blade.

34. The method of claim 33, wherein said high performance computing system comprises at least one of the following: 3D Stacking computer chip, computer processor unit (CPU), graphics processor unit (GPU), or memory unit.

35. An apparatus, said apparatus comprising:
a reservoir configured for carrying a working fluid;
an integrated circuit (IC) die, said IC die comprises a heat source and a two phase heat transfer device; wherein
said two phase heat transfer device comprises:
a base member, said base member configured to receive thermal energy from the heat source;
elongated members having at least one wall, said elongated members extending distally away from said base member and configured to define respective passages between adjacent said elongated members;
at least some said elongated members configured to be at least partially inserted into the working fluid;
a recess topography disposed on said at least one wall of said elongated members, wherein said recess topography is configured to accommodate the working fluid;
said elongated members having a proximal end and a distal end substantially opposed from one another, wherein said proximal end to be closer to the heat source and said distal end to be inserted in the working fluid;
wherein said recess topography comprises fractal topology, wherein said fractal topology comprises:
recesses, wherein the number of recesses toward said proximal end of said elongated members is greater than the number of recesses toward said distal end of said elongated members; and
said passages are configured to accommodate vapor produced from the working fluid so as to define a vapor space.

36. The apparatus of claim 35, wherein said IC die is in communication with a chip carrier.

37. The apparatus of claim 36, wherein said communication with said chip carrier comprises a connector.

38. The apparatus of claim 37, wherein said connector comprises solder balls.

39. The apparatus of claim 35, wherein at least some of said passages comprise microchannels, respectively.

40. The apparatus of claim 35, wherein at least some of said passages comprise nanochannels, respectively.

41. The apparatus of claim 35, wherein said heat source comprises a semiconductor device.

42. The apparatus of claim 41, wherein said semiconductor device comprises at least one of: processor, microprocessor, central processor unit (CPU), or memory unit.

43. The apparatus of claim 41, wherein said semiconductor device comprises at least one of the following: diodes, transistors, sensors, charge-coupled device (CCD), or rectifiers.

44. The apparatus of claim 35, wherein said recesses comprise: a groove, slot, pipe, tube, trough, conduit, indentation, or flute, as well as any combination.

45. The apparatus of claim 35, wherein said recess topography is configured to provide a suction of the working fluid in a direction from the working fluid toward the heat source.

46. An apparatus, said apparatus comprising:
a first reservoir configured for carrying a first working fluid in said first reservoir;
a first integrated circuit (IC) die, said first IC die comprises a first heat source and a first two phase heat transfer device; wherein
said first two phase heat transfer device of said first IC die comprises:
a first base member, said first base member configured to receive thermal energy from the first heat source;
first elongated members having at least one wall, said first elongated members extending distally away from said first base member and configured to define respective first passages between adjacent first elongated members;
at least some of said first elongated members configured to be at least partially inserted into the first working fluid;
a first recess topography disposed on said at least one wall of said first elongated members, wherein said first recess topography is configured to accommodate the first working fluid;

said first elongated members having a proximal end and a distal end substantially opposed from one another, wherein said proximal end to be closer to the first heat source and said distal end to be inserted in the first working fluid;

wherein said first recess topography comprises first fractal topology, wherein said first fractal topology comprises:

first recesses, wherein the number of first recesses toward said proximal end of said first elongated members is greater than the number of first recesses toward said distal end of said first elongated members; and said first passages are configured to accommodate vapor produced from the first working fluid so as to define a first vapor space;

a second reservoir configured for carrying a second working fluid in said second reservoir;

a second integrated circuit (IC) die, said second IC die comprises a second heat source and a second two phase heat transfer device; wherein said second two phase heat transfer device of said second IC die comprises:

a second base member, said second base member configured to receive thermal energy from the second heat source;

second elongated members having at least one wall, said second elongated members extending distally away from said second base member and configured to define respective second passages between adjacent said second elongated members;

at least some of said second elongated members configured to be at least partially inserted into the second working fluid;

a second recess topography disposed on said at least one wall of said second elongated members, wherein said second recess topography is configured to accommodate the second working fluid; and said second passages are configured to accommodate vapor produced from the second working fluid so as to define a second vapor space; and said first IC die and said second IC die operatively coupled together.

47. The apparatus of claim 46, wherein said first IC die is in communication with a chip carrier.

48. The apparatus of claim 47, wherein said communication with said chip carrier comprises a connector.

49. The apparatus of claim 48, wherein said connector comprises solder balls.

50. The apparatus of claim 46, wherein at least some of said first passages or second passages comprise microchannels, respectively; or at least some of said first passages and second passages comprise microchannels.

51. The apparatus of claim 46, wherein said at least some of said first passages or second passages comprise nanochannels, respectively; or at least some of said first passages and second passages comprise nanochannels.

52. The apparatus of claim 46, wherein:

said first heat source comprises a first semiconductor device, or said second heat source comprises a second semiconductor device; or said first heat source comprises the first semiconductor device and said second heat source comprises the second semiconductor device.

53. The apparatus of claim 52, wherein:

said first semiconductor device, said second semiconductor device, or both of said first semiconductor device and second semiconductor device comprise at least one of: processor, microprocessor, central processor unit (CPU), or memory unit.

54. The apparatus of claim 52, wherein:

said first semiconductor device, said second semiconductor device, or both said first semiconductor device and second semiconductor device comprise at least one of the following: diodes, transistors, sensors, charge-coupled device (CCD), or rectifiers.

55. The apparatus of claim 46, wherein said first IC die and said second IC die are electrically connected to one another.

56. The apparatus of claim 46, further comprising a thermal insulator layer disposed between said first IC die and said second IC die.

57. The apparatus of claim 46, wherein said second recess topography comprises one or more recesses.

58. The apparatus of claim 57, wherein one or more of said second recesses comprises: a groove, slot, pipe, tube, trough, conduit, indentation, or flute, as well as any combination.

59. The apparatus of claim 46, wherein said second recess topography comprises second fractal topology.

60. The apparatus of claim 59, wherein:

said second elongated members having a proximal end and a distal end substantially opposed from one another, wherein said proximal end to be closer to the second heat source and said distal end to be inserted in the second working fluid; and wherein said second fractal topology comprises:

second recesses, wherein the number of second recesses toward said proximal end of said second elongated members is greater than the number of second recesses toward said distal end of said second elongated members.

61. The apparatus of claim 59, wherein said second recess topography is configured to provide a suction of the second working fluid in the direction toward the second heat source.

62. The apparatus of claim 46, wherein said first recess topography is configured to provide a suction of the first working fluid in a direction toward the first heat source.

63. An apparatus, said apparatus comprising:

a reservoir configured for carrying a working fluid;

an integrated circuit (IC) die, said IC die comprises a heat source;

a two phase heat transfer device thermally connected to said IC die; wherein said two phase heat transfer device comprises:

a base member, said base member configured to receive thermal energy from the heat source;

elongated members having at least one wall, said elongated members extending distally away from said base member and configured to define respective passages between adjacent said elongated members;

at least some said elongated members configured to be at least partially inserted into the working fluid;

a recess topography disposed on said at least one wall of said elongated members, wherein said recess topography is configured to accommodate the working fluid;

said elongated members having a proximal end and a distal end;

wherein said recess topography comprises fractal topology, wherein said fractal topology comprises:
recesses, wherein the number of recesses toward said proximal end of said elongated members to be closer to the heat source is greater than the number of recesses toward said distal end of said elongated members to be inserted in the working fluid; and
said passages are configured to accommodate vapor produced from the working fluid so as to define a vapor space.

64. The apparatus of claim 63, wherein said IC die is in communication with a chip carrier.

65. The apparatus of claim 64, wherein said communication with said chip carrier comprises a connector.

66. The apparatus of claim 65, wherein said connector comprises solder balls.

67. The apparatus of claim 63, wherein at least some of said passages comprise microchannels, respectively.

68. The apparatus of claim 63, wherein at least some of said passages comprise nanochannels, respectively.

69. The apparatus of claim 63, wherein said heat source comprises a semiconductor device.

70. The apparatus of claim 69, wherein said semiconductor device comprises at least one of: processor, microprocessor, central processor unit (CPU), or memory unit.

71. The apparatus of claim 69, wherein said semiconductor device comprises at least one of the following: diodes, transistors, sensors, charge-coupled device (CCD), or rectifiers.

72. The apparatus of claim 71, wherein said integrated circuit (IC) die and a two phase heat transfer device are mechanically connected with one another.

73. The apparatus of claim 72, wherein said mechanical connection includes an adhesive.

74. The device of claim 63, wherein said recesses comprise: a groove, slot, pipe, tube, trough, conduit, indentation, or flute, as well as any combination.

75. The device of claim 63, wherein said recess topography is configured to provide a suction of the working fluid in a direction from the working fluid toward the heat source.

* * * * *